United States Patent
Misaki

(10) Patent No.: US 11,239,370 B2
(45) Date of Patent: Feb. 1, 2022

(54) TFT SUBSTRATE AND SCANNING ANTENNA PROVIDED WITH TFT SUBSTRATE

(71) Applicant: Sharp Kabushiki Kaisha, Osaka (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 253 days.

(21) Appl. No.: 16/617,089

(22) PCT Filed: May 22, 2018

(86) PCT No.: PCT/JP2018/019713
§ 371 (c)(1),
(2) Date: Nov. 26, 2019

(87) PCT Pub. No.: WO2018/221327
PCT Pub. Date: Dec. 6, 2018

(65) Prior Publication Data
US 2020/0259021 A1    Aug. 13, 2020

(30) Foreign Application Priority Data
May 31, 2017    (JP) .............................. JP2017-108026

(51) Int. Cl.
*H01L 29/786* (2006.01)
*G02F 1/1345* (2006.01)
(Continued)

(52) U.S. Cl.
CPC ...... *H01L 29/78651* (2013.01); *G02F 1/1345* (2013.01); *H01Q 3/36* (2013.01);
(Continued)

(58) Field of Classification Search
CPC ............. H01L 29/78651; H01L 27/124; H01L 27/1255; G02F 1/1345; G02F 1/1334;
(Continued)

(56) References Cited

U.S. PATENT DOCUMENTS 7,466,269 B2 *  12/2008  Haziza .................... H01Q 3/36
                                                         343/700 MS
7,847,894 B2    12/2010  Rho
(Continued)

FOREIGN PATENT DOCUMENTS

JP    2002-217640 A    8/2002
JP    2007-116573 A    5/2007
(Continued)

OTHER PUBLICATIONS

Stevenson et al., "Rethinking Wireless Communications: Advanced Antenna Design using LCD Technology", SID 2015 Digest, 55.2, 2015, pp. 827-830.
(Continued)

*Primary Examiner* — Sitaramarao S Yechuri
(74) *Attorney, Agent, or Firm* — Keating & Bennett, LLP

(57) ABSTRACT

A TFT substrate includes a dielectric substrate and a plurality of antenna unit regions arranged on the dielectric substrate. Each of the plurality of antenna unit regions includes a TFT, a patch electrode electrically connected to a drain electrode of the TFT, and a patch drain connection section electrically connecting the drain electrode to the patch electrode, and the patch drain connection section includes a conductive portion included in a conductive layer, the conductive layer being closer to the dielectric substrate than a conductive layer including the patch electrode and being either one of a conductive layer including a gate
(Continued)

electrode of the TFT or a conductive layer including a source electrode of TFT, the either one being closer to the dielectric substrate than the other.

19 Claims, 39 Drawing Sheets

(51) Int. Cl.
  *H01Q 3/36* (2006.01)
  *H01Q 3/44* (2006.01)
  *H01Q 13/22* (2006.01)
  *G02F 1/1334* (2006.01)
(52) U.S. Cl.
  CPC .............. *H01Q 3/44* (2013.01); *H01Q 13/22* (2013.01); *G02F 1/1334* (2013.01)
(58) Field of Classification Search
  CPC ......... G02F 1/292; G02F 1/1365; H01Q 3/36; H01Q 3/44; H01Q 13/22; H01Q 1/364
  See application file for complete search history.

(56) References Cited

U.S. PATENT DOCUMENTS

| | | | |
|---|---|---|---|
| 2010/0182207 A1* | 7/2010 | Miyata | H01Q 1/243 343/702 |
| 2012/0092577 A1* | 4/2012 | Shi | G02F 1/13338 349/43 |
| 2012/0138922 A1 | 6/2012 | Yamazaki et al. | |
| 2012/0194399 A1 | 8/2012 | Bily et al. | |
| 2013/0187826 A1* | 7/2013 | Hutcheson | H01Q 1/243 343/860 |
| 2013/0240746 A1* | 9/2013 | Murai | G01T 1/24 250/370.14 |
| 2013/0320334 A1 | 12/2013 | Yamazaki et al. | |
| 2014/0286076 A1 | 9/2014 | Aoki et al. | |
| 2015/0062853 A1* | 3/2015 | Li | H01Q 1/22 361/782 |
| 2016/0190678 A1* | 6/2016 | Hong | H01Q 1/273 343/700 MS |
| 2018/0337446 A1 | 11/2018 | Nakazawa et al. | |

FOREIGN PATENT DOCUMENTS

| | | |
|---|---|---|
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |

OTHER PUBLICATIONS

Ando et al., "A Radial Line Slot Antenna for 12 GHz Satellite TV Reception", IEEE Transactions on Antennas and Propagation, vol. AP-33, No. 12, Dec. 1985, pp. 1347-1353.
Wittek et al., "Liquid Crystals for Smart Antennas and Other Microwave Applications", SID 2015 Digest, 55.1, 2015, pp. 824-826.
Kuki, "Novel RF Functional Devices Using Liquid Crystal", Polymer, vol. 55, Aug. 2006, pp. 599-602.
Nakazawa et al., "TFT Substrate, Scanning Antenna Using Same, and Method for Manufacturing TFT Substrate", U.S. Appl. No. 15/542,488, filed Jul. 10, 2017.

* cited by examiner

TFT SUBSTRATE AND SCANNING ANTENNA PROVIDED WITH TFT SUBSTRATE

TECHNICAL FIELD

The disclosure relates to a scanning antenna, and more particularly relates to a scanning antenna in which an antenna unit (also referred to as an "element antenna") has a liquid crystal capacitance (also referred to as a "liquid crystal array antenna"), and a TFT substrate used for such a scanning antenna.

BACKGROUND ART

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (PTL 1 to PTL 5 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

The present inventors have developed a scanning antenna which can be mass-manufactured by utilizing known manufacturing techniques of LCDs. PTL 6 by the present inventors discloses a scanning antenna which can be mass-manufactured by utilizing the known manufacturing techniques of LCDs, a TFT substrate used for such a scanning antenna, and a manufacturing method and a driving method of such a scanning antenna. For reference, the entire contents disclosed in PTL 6 are incorporated herein.

CITATION LIST

Patent Literature

PTL 1: JP 2007-116573 A
PTL 2: JP 2007-295044 A
PTL 3: JP 2009-538565 A
PTL 4: JP 2013-539949 A
PTL 5: WO 2015/126550
PTL 6: WO 2017/061527

Non-Patent Literature

NPL 1: R. A. Stevenson et al., "Rethinking Wireless Communications: Advanced Antenna Design using LCD Technology", SID 2015 DIGEST, pp. 827-830.

NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

In the course of studying various structures in order to improve antenna performance of the scanning antenna described in PTL 6, new factors that reduce the antenna performance were found. Details will be described below. An object of the disclosure is to provide a scanning antenna having a novel structure capable of reducing and eliminating the new factors, and a TFT substrate used for such a scanning antenna.

Solution to Problem

A TFT substrate according to an embodiment of the disclosure includes a dielectric substrate, and a plurality of antenna unit regions arranged on the dielectric substrate, wherein each of the plurality of antenna unit regions includes a TFT, a patch electrode electrically connected to a drain electrode of the TFT, and a patch drain connection section electrically connecting the drain electrode to the patch electrode, and the patch drain connection section includes a conductive portion included in a conductive layer, the conductive layer being closer to the dielectric substrate than a conductive layer including the patch electrode and being either one of a conductive layer including a gate electrode of the TFT or a conductive layer including a source electrode of TFT, the either one being closer to the dielectric substrate than the other.

In an embodiment, the patch drain connection section further includes an additional conductive portion, the additional conductive portion being included in the conductive layer including the patch electrode and being formed physically separate from the patch electrode.

A TFT substrate according to an embodiment of the disclosure includes a dielectric substrate, and a plurality of antenna unit regions arranged on the dielectric substrate, wherein each of the plurality of antenna unit regions includes a TFT, a patch electrode electrically connected to a drain electrode of the TFT, and a patch drain connection section electrically connecting the drain electrode to the patch electrode, and the patch drain connection section includes a conductive portion included in a conductive layer closer to the dielectric substrate than a conductive layer including the patch electrode, and an additional conductive portion included in the conductive layer including the patch electrode, and formed physically separate from the patch electrode.

In an embodiment, the conductive portion is included in a conductive layer, the conductive layer being either one of a conductive layer including a gate electrode of the TFT or a conductive layer including a source electrode of TFT, the either one being closer to the dielectric substrate than the other.

In an embodiment, the conductive portion is included in a conductive layer, the conductive layer being either one of a conductive layer including a gate electrode of the TFT or a conductive layer including a source electrode of TFT, the either one being farther from the dielectric substrate than the other.

In an embodiment, the patch electrode is included in a conductive layer different from any of the conductive layer including the gate electrode of the TFT and the conductive layer including the source electrode of the TFT.

In an embodiment, the TFT substrate includes a gate metal layer supported by the dielectric substrate and including the gate electrode, a source metal layer supported by the dielectric substrate and including the source electrode, a semiconductor layer supported by the dielectric substrate, a gate insulating layer formed between the gate metal layer and the semiconductor layer, a first insulating layer formed on the gate metal layer and the source metal layer, and a patch metal layer formed on the first insulating layer and including the patch electrode.

In an embodiment, the TFT substrate includes a gate metal layer supported by the dielectric substrate and including the gate electrode, a source metal layer supported by the dielectric substrate and including the source electrode, a semiconductor layer supported by the dielectric substrate, a gate insulating layer formed between the gate metal layer and the semiconductor layer, a first insulating layer formed on the gate metal layer and the source metal layer, and a patch metal layer formed between the gate insulating layer and the first insulating layer, and including the patch electrode.

In an embodiment, the patch electrode is included in the conductive layer, the conductive layer being either one of the conductive layer including the gate electrode of the TFT or the conductive layer including the source electrode of TFT, the either one being farther from the dielectric substrate than the other.

A scanning antenna according to an embodiment of the disclosure includes the TFT substrate according to any one of those describe above, a slot substrate disposed to face the TFT substrate, a liquid crystal layer provided between the TFT substrate and the slot substrate, and a reflective conductive plate disposed to face a surface of the slot substrate on a side opposite to the liquid crystal layer with a dielectric layer interposed between the reflective conductive plate and the surface, wherein the slot substrate includes another dielectric substrate and a slot electrode formed on a surface of the another dielectric substrate on a side of the liquid crystal layer, and the slot electrode includes a plurality of slots, each of the plurality of slots being arranged corresponding to the patch electrode of each of the plurality of antenna unit regions of the TFT substrate.

In an embodiment, when viewed from a normal direction of the dielectric substrate and the another dielectric substrate, the conductive layer including the patch electrode does not include a conductive portion other than the patch electrode inside each of the plurality of slots.

In an embodiment, when viewed from the normal direction of the dielectric substrate and the another dielectric substrate, the plurality of antenna unit regions includes an antenna unit region including the patch drain connection section including a conductive portion extending in a long axis direction of a corresponding slot.

In an embodiment, when viewed from the normal direction of the dielectric substrate and the another dielectric substrate, the plurality of antenna unit regions includes an antenna unit region including the patch drain connection section including a conductive portion extending in a short axis direction of a corresponding slot.

In an embodiment, when viewed from the normal direction of the dielectric substrate and the another dielectric substrate, two regions in which the patch electrode and the slot electrode overlap each other are arranged to be axisymmetric with respect to the long axis of the corresponding slot.

In an embodiment, when viewed from the normal direction of the dielectric substrate and the another dielectric substrate, each of two regions in which the patch electrode and the slot electrode overlap each other has a planar shape that is axisymmetric with respect to the short axis of the corresponding slot.

Advantageous Effects of Disclosure

According to an embodiment of the disclosure, a scanning antenna having a novel structure capable of suppressing a decrease in antenna performance and an TFT substrate used for such a scanning antenna are provided.

DESCRIPTION OF EMBODIMENTS

Figure 1:
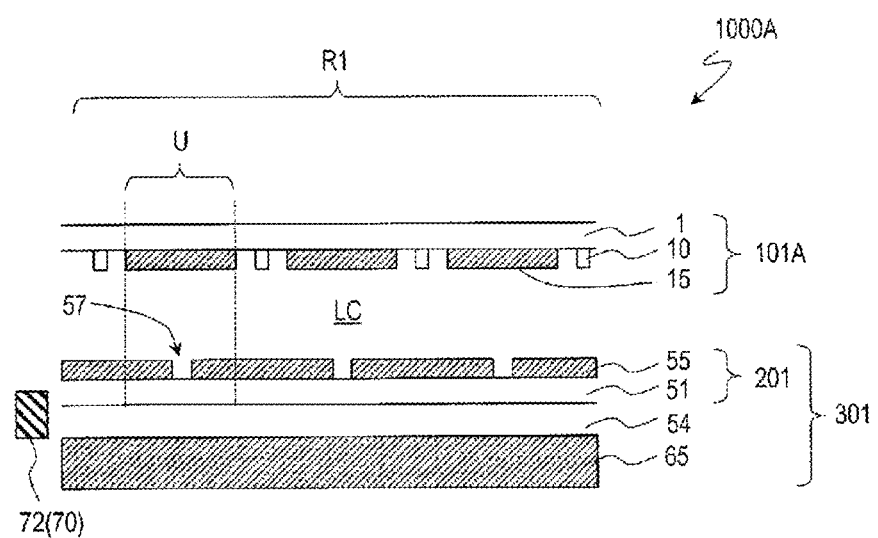
FIG. 1 is a cross-sectional view schematically illustrating a portion of a scanning antenna 1000A according to a first embodiment of the disclosure.

Hereinafter, a scanning antenna, a manufacturing method of the scanning antenna, and a TFT substrate used for the scanning antenna according to embodiments of the disclosure will be described with reference to the drawings. Note that the disclosure is not limited to the embodiments illustrated below. The embodiments of the disclosure are not limited to the drawings. For example, a thickness of a layer in a cross-sectional view, sizes of a conductive portion and an opening in the plan view, and the like are exemplary.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter." For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, the entire contents of the disclosures of PTL 1 to PTL 4 as well as NPL 1 and NPL 2 are incorporated herein.

Note that although the antenna units in the scanning antenna according to the embodiments of the disclosure are similar to the pixels of the LCD panel, a structure of the antenna units is different from the structure of the pixel of the LCD panel, and an array of the plurality of antenna units is also different from an array of the pixels in the LCD panel. A basic structure of the scanning antenna according to the embodiments of the disclosure will be described with reference to FIG. 1, which illustrates a scanning antenna 1000A of a first embodiment to be described in detail later. Although the scanning antenna 1000A is a radial in-line slot antenna in which slots are concentrically arrayed, the scanning antennas according to the embodiments of the disclosure are not limited to this. For example, the array of the slots may be any of various known arrays. In particular, with respect to the slot and/or antenna unit arrangements, the entire disclosure of PTL 5 is incorporated herein by reference.

FIG. 1 is a cross-sectional view schematically illustrating a portion of the scanning antenna 1000A of the present embodiment, and schematically illustrates a part of the cross-section along a radial direction from a power feed pin 72 (see FIG. 2(b)) provided near the center of the concentrically arrayed slots.

The scanning antenna 1000A includes a TFT substrate 101A, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000A transmits and/or receives microwaves to and/or from a TFT substrate 101A side.

The TFT substrate 101A includes a dielectric substrate 1 such as a glass substrate, and a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 therebetween function as a waveguide 301.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. Each antenna unit U includes an auxiliary capacitance electrically connected in parallel with the liquid crystal capacitance (see FIG. 3). The antenna unit U of the scanning antenna 1000A and a pixel of the LCD panel have a similar configuration. However, the scanning antenna 1000A has many differences from the LCD panel.

First, the performance required for the dielectric substrates 1 and 51 of the scanning antenna 1000A is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 μm, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. In addition, for a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 µm to 30 µm. In a case where the thin film deposition methods are used, the thickness of the metal layer is preferably less than or equal to 5 µm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass production, it is preferable to use an Al layer rather than a Cu layer, and the thickness of the Al layer is preferably greater than or equal to 0.3 µm and less than or equal to 2 µm, for example.

In addition, an arrangement pitch of the antenna units U is considerably different from that of a pixel pitch. For example, considering an antenna for microwaves of 12 GHz (Ku band), the wavelength λ is 25 mm, for example. Then, as described in PTL 4, since the pitch of the antenna unit U is less than or equal to λ/4 and/or less than or equal to λ/5, the pitch becomes less than or equal to 6.25 mm and/or less than or equal to 5 mm. This is ten times greater than the pixel pitch of the LCD panel. Accordingly, the length and width of the antenna unit U are also roughly ten times greater than the pixel length and width of the LCD panel.

Of course, the array of the antenna units U may be different from the array of the pixels in the LCD panel. Herein, although an example is illustrated in which the antenna units U are arrayed in concentric circles (for example, refer to JP 2002-217640 A), the present disclosure is not limited thereto, and the antenna units may be arrayed in a spiral shape as described in NPL 2, for example. Furthermore, the antenna units may be arrayed in a matrix as described in PTL 4.

The properties required for the liquid crystal material of the liquid crystal layer LC of the scanning antenna 1000A are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000A according to the embodiment, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) for microwaves, and tan $\delta_M$ is preferably small. For example, the $\Delta\varepsilon_M$ of greater than or equal to 4 and tan $\delta_M$ of less than or equal to 0.02 (values of 19 GHz in both cases) described in SID 2015 DIGEST pp. 824-826 written by M. Witteck et al, can be suitably used. In addition, it is possible to use a liquid crystal material having a $\Delta\varepsilon_M$ of greater than or equal to 0.4 and tan $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy Δn with respect to visible light. Accordingly, it can be said that a material having a large refractive index anisotropy Δn with respect to visible light is preferable as a liquid crystal material for an antenna unit for microwaves. The refractive index anisotropy Δn of the liquid crystal material for LCDs is evaluated by the refractive index anisotropy for light having a wavelength of 550 nm. Here again, when a Δn (birefringence index) is used as an index for light having a wavelength of 550 nm, a nematic liquid crystal having a Δn of greater than or equal to 0.3, preferably greater than or equal to 0.4, can be used for an antenna unit for microwaves. Δn has no particular upper limit. However, since liquid crystal materials having a large Δn tend to have a strong polarity, there is a possibility that reliability may decrease. From the viewpoint of reliability, Δn is preferably less than or equal to 0.4. The thickness of the liquid crystal layer is, for example, from 1 µm to 500 µm.

Hereinafter, the structure and manufacturing method of the scanning antenna according to the embodiments of the disclosure will be described in more detail.

First Embodiment

Figure 2:
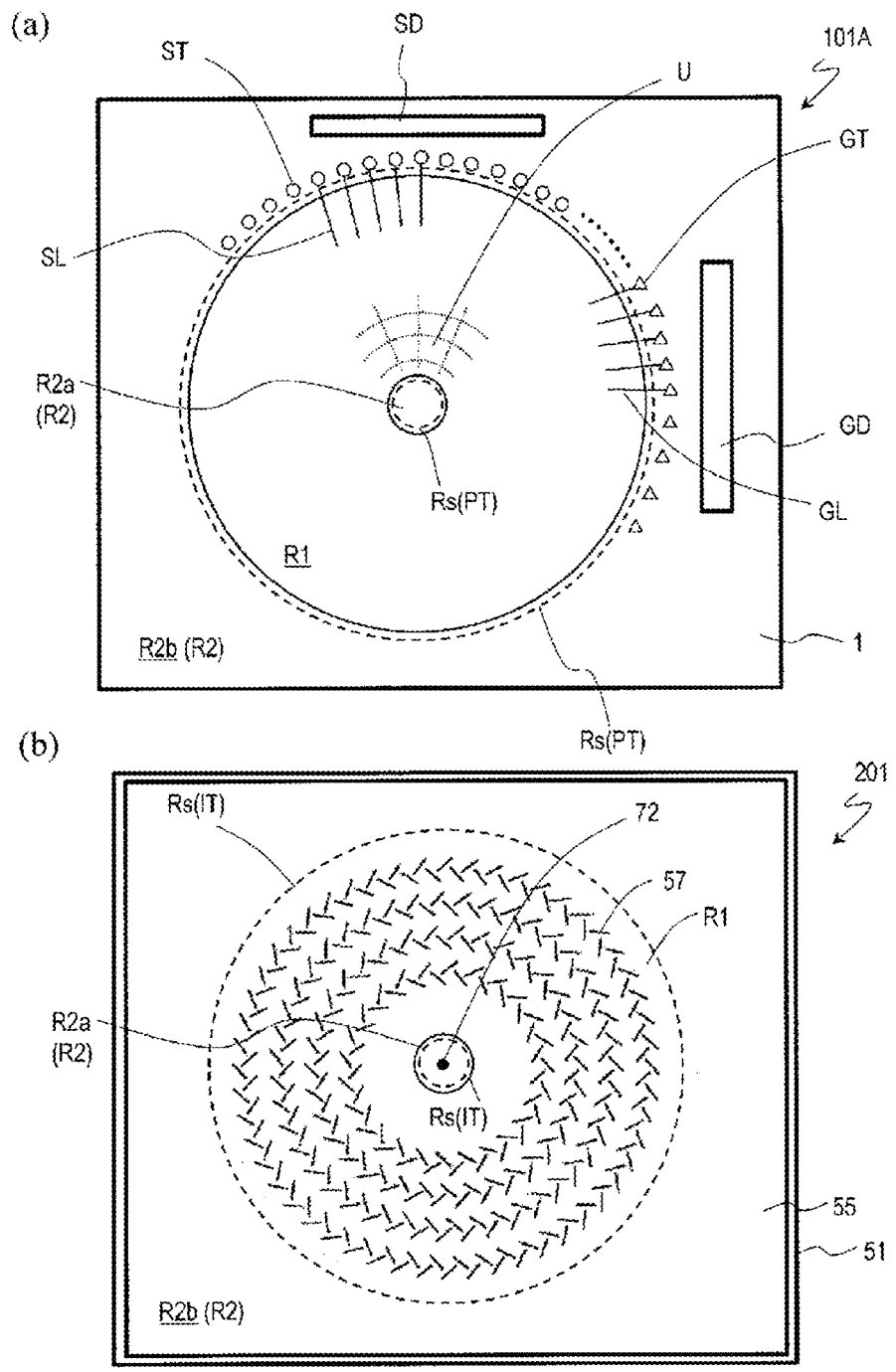
FIGS. 2(a) and 2(b) are schematic plan views illustrating a TFT substrate 101A and a slot substrate 201 included in the scanning antenna 1000A, respectively.

First, a description is given with reference to FIG. 1 and FIG. 2. FIG. 1 is a schematic partial cross-sectional view of the scanning antenna 1000A near the center thereof as described above in detail, and FIGS. 2(*a*) and 2(*b*) are schematic plan views illustrating the TFT substrate 101A and the slot substrate 201 included in the scanning antenna 1000A, respectively.

The scanning antenna 1000A includes a plurality of antenna units U arrayed two-dimensionally. In the scanning antenna 1000A exemplified here, the plurality of antenna units are arrayed concentrically. In the following description, the region of the TFT substrate 101A and the region of the slot substrate 201 corresponding to the antenna unit U will be referred to as "antenna unit region," and be denoted with the same reference numeral U as the antenna unit. In addition, as illustrated in FIGS. 2(*a*) and 2(*b*), in the TFT substrate 101A and the slot substrate 201, a region defined by the plurality of two-dimensionally arranged antenna unit regions is referred to as a "transmission and/or reception region R1," and a region other than the transmission and/or reception region R1 is referred to as a "non-transmission and/or reception region R2." A terminal section, a driving circuit, and the like are provided in the non-transmission and/or reception region R2.

FIG. 2(*a*) is a schematic plan view illustrating the TFT substrate 101A included in the scanning antenna 1000A.

In the illustrated example, the transmission and/or reception region R1 has a donut-shape when viewed from a normal direction of the TFT substrate 101A. The non-transmission and/or reception region R2 includes a first non-transmission and/or reception region R2*a* located at the center of the transmission and/or reception region R1 and a second non-transmission and/or reception region R2*b* located at the periphery of the transmission and/or reception region R1. An outer diameter of the transmission and/or reception region R1, for example, is from 200 mm to 1500 mm, and is configured according to a communication traffic volume or the like.

A plurality of gate bus lines GL and a plurality of source bus lines SL supported by the dielectric substrate 1 are provided in the transmission and/or reception region R1 of the TFT substrate 101A, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2a, R2b), a seal region Rs is disposed surrounding the transmission and/or reception region R1. A sealing member (not illustrated) is applied to the seal region Rs. The sealing member bonds the TFT substrate 101A and the slot substrate 201 to each other, and also encloses liquid crystals between these substrates 101A and 201.

A gate terminal section GT, the gate driver GD, a source terminal section ST, and the source driver SD are provided outside the seal region Rs in the non-transmission and/or reception region R2. Each of the gate bus lines GL is connected to the gate driver GD with the gate terminal section GT therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2(b)) of the slot substrate 201. In the present specification, the connection section between the transfer terminal section PT and the slot electrode 55 is referred to as a "transfer section." As illustrated in drawings, the transfer terminal section PT (transfer section) may be disposed in the seal region Rs. In this case, a resin containing conductive particles may be used as the sealing member. In this way, liquid crystals are sealed between the TFT substrate 101A and the slot substrate 201, and an electrical connection can be secured between the transfer terminal section PT and the slot electrode 55 of the slot substrate 201. In this example, although a transfer terminal section PT is disposed in both the first non-transmission and/or reception region R2a and the second non-transmission and/or reception region R2b, the transfer terminal section PT may be disposed in only one of them.

Note that the transfer terminal section PT (transfer section) need not be disposed in the seal region Rs. For example, the transfer terminal section PT may be disposed outside the seal region Rs in the non-transmission and/or reception region R2.

FIG. 2(b) is a schematic plan view illustrating the slot substrate 201 in the scanning antenna 1000A, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slots 57 are formed corresponding to the antenna unit region U on the TFT substrate 101A. For the plurality of slots 57 in the illustrated example, a pair of slots 57 extending in directions substantially orthogonal to each other are concentrically arrayed so that a radial in-line slot antenna is configured. Since the scanning antenna 1000A includes slots that are substantially orthogonal to each other, the scanning antenna 1000A can transmit and/or receive circularly polarized waves.

A plurality of terminal sections IT of the slot electrode 55 are provided in the non-transmission and/or reception region R2. The terminal section IT is electrically connected to the transfer terminal section PT (FIG. 2(a)) of the TFT substrate 101A. In this example, the terminal section IT is disposed within the seal region Rs, and is electrically connected to a corresponding transfer terminal section PT by a sealing member containing conductive particles.

In addition, the power feed pin 72 is disposed on a rear surface side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arrayed. The power feed method may be either a direct coupling power feed method or an electromagnetic coupling method, and a known power feed structure can be utilized.

In FIGS. 2(a) and 2(b), an example is illustrated in which the seal region Rs is provided so as to surround a relatively narrow region including the transmission and/or reception region R1, but the arrangement of the seal region Rs is not limited to this. In particular, the seal region Rs provided outside the transmission and/or reception region R1 may be provided nearby the side of the dielectric substrate 1 and/or the dielectric substrate 51, for example, so as to maintain a certain distance or more from the transmission and/or reception region R1. Of course, the terminal section and the driving circuit, for example, that are provided in the non-transmission and/or reception region R2 may be formed outside the seal region Rs (that is, the side where the liquid crystal layer is not present). By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

In the following, each component of the scanning antenna 1000A will be described in detail.

Structure of TFT Substrate 101A

Antenna Unit Region U

The scanning antenna 1000A and the TFT substrate 101A included in the scanning antenna 1000A of the present embodiment will be described with reference to FIG. 3.

FIG. 3(a) is a schematic plan view of an antenna unit region U in a transmission and/or reception region R1 of the scanning antenna 1000A, and FIG. 3(b) is a schematic cross-sectional view of the TFT substrate 101A along a line A-A' in FIG. 3(a).

As illustrated in FIG. 3(a) and FIG. 3(b), the TFT substrate 101A includes the dielectric substrate 1 and a plurality of antenna unit regions U arranged on the dielectric substrate 1. Each of the plurality of antenna unit regions U includes an TFT 10, a patch electrode 15 electrically connected to a drain electrode 7D of the TFT 10, and a patch drain connection section electrically connecting the drain electrode 7D to the patch electrode 15. The patch drain connection section includes a conductive portion included in a conductive layer that is closer to the dielectric substrate 1 than a conductive layer 151 including the patch electrode 15, and that is either one of a conductive layer 3 including a gate electrode 3G of the TFT 10 or a conductive layer 7 including a source electrode 7S of TFT 10 and is closer to the dielectric substrate 1 than the other. In the TFT substrate 101A, the gate metal layer 3 including the gate electrode 3G of the TFT 10 is closer to the dielectric substrate 1 than the source metal layer 7 including the source electrode 7S of the TFT 10. The patch drain connection section of the TFT substrate 101A includes a wiring line 3w1 included in the gate metal layer 3.

The "patch drain connection section" of each antenna unit region herein refers to at least one conductive portion that is electrically connected to the drain electrode and the patch electrode, and disposed between the drain electrode and the patch electrode. The drain electrode is electrically connected to the patch electrode through the patch drain connection section. For example, in the TFT substrate 101A illustrated in FIG. 3, the drain electrode 7D is electrically connected to the patch electrode 15 through connection sections 15a1, 15a2, and 3a2, and the wiring line 3w1. The patch drain connection section included in the TFT substrate 101A includes the connection sections 15a1, 15a2, and 3a2, and the wiring line 3w1.

The wiring line 3w1 extends in the slot 57 in a long axis direction of the slot 57 and overlaps the patch electrode 15 in the slot 57 when viewed from the normal direction of the TFT substrate 101A and the slot substrate 201.

In the present specification, a layer formed using a gate conductive film and including the gate electrode 3G may be referred to as a "gate metal layer," and a layer formed using a source conductive film and including the source electrode 7S may be referred to as a "source metal layer." A layer formed of a patch conductive film and including the patch electrode 15 may be referred to as a "patch metal layer." In the present embodiment, the patch electrode 15 is included in a conductive layer different from any of the conductive layer including the gate electrode 3G of the TFT 10 and the conductive layer including the source electrode 7S of the TFT 10.

Figure 4:
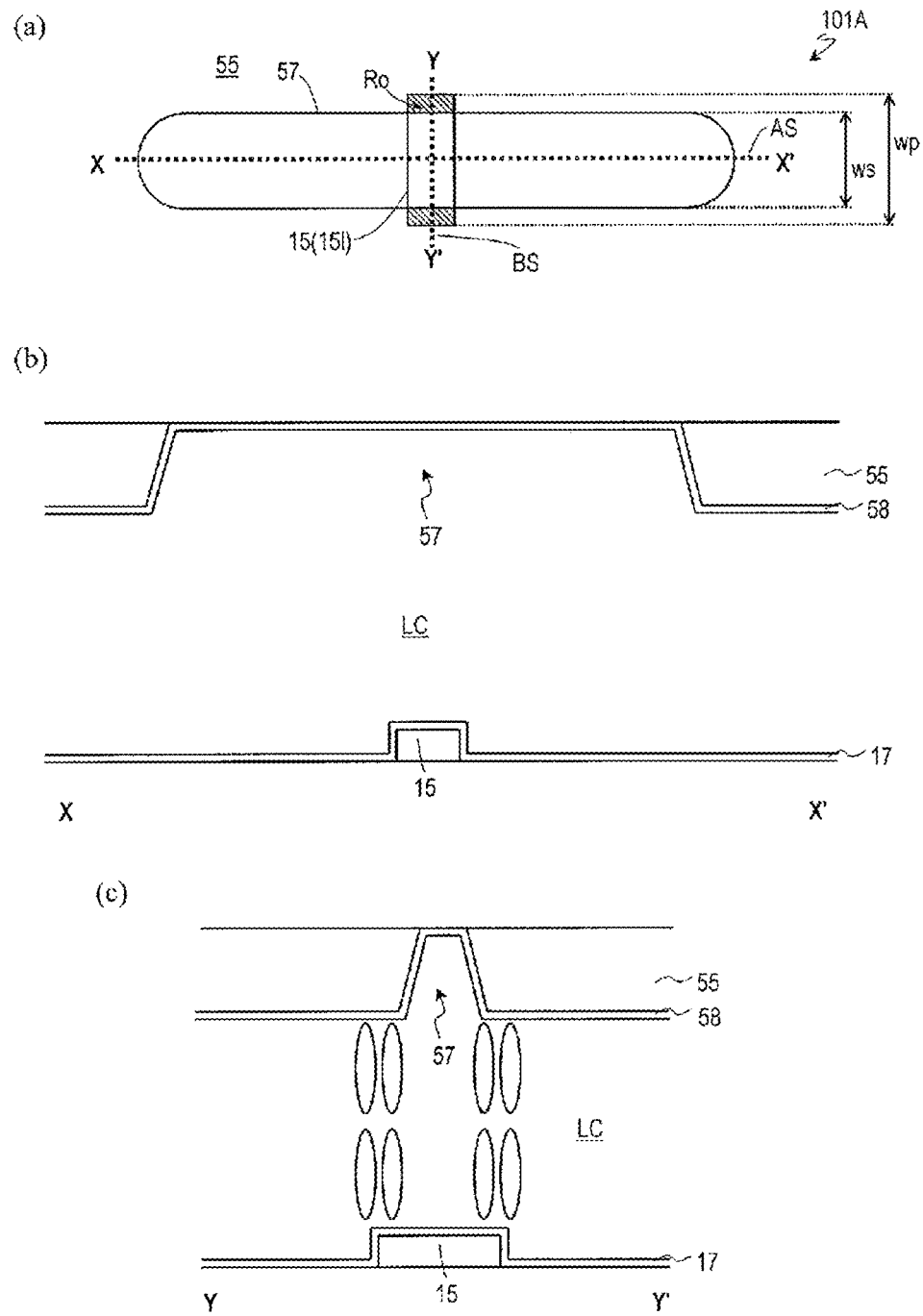
FIG. 4(a) is a schematic plan view for illustrating a positional relationship between a patch metal layer 151 and a slot 57 of the scanning antenna 1000A.
FIG. 4(b) is a schematic cross-sectional view of the scanning antenna 1000A along a line X-X' in FIG. 4(a)
FIG. 4(c) is a schematic cross-sectional view of the scanning antenna 1000A along a line Y-Y' in FIG. 4(a).
Figure 5:
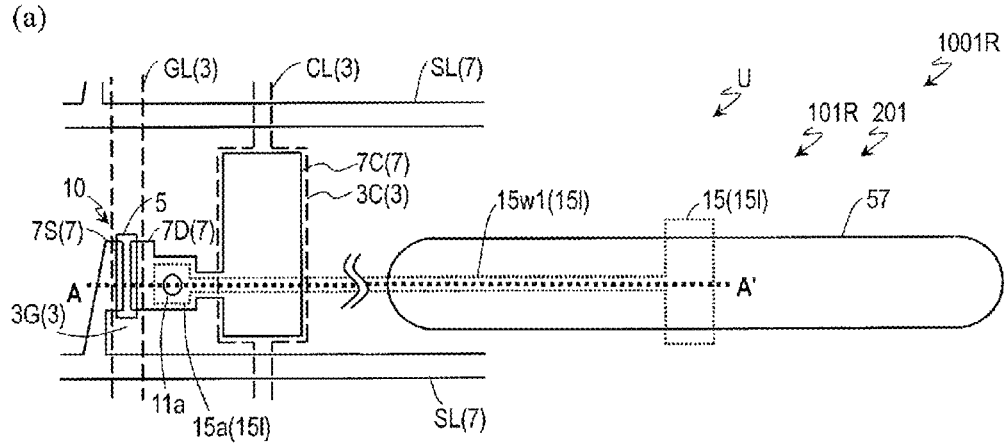
FIG. 5(a) is a schematic plan view of an antenna unit region U in a transmission and/or reception region R1 of a scanning antenna 1001R in Reference Example 1.
FIG. 5(b) is a schematic cross-sectional view of a TFT substrate 101R along a line A-A' in FIG. 5(a).
Figure 5:
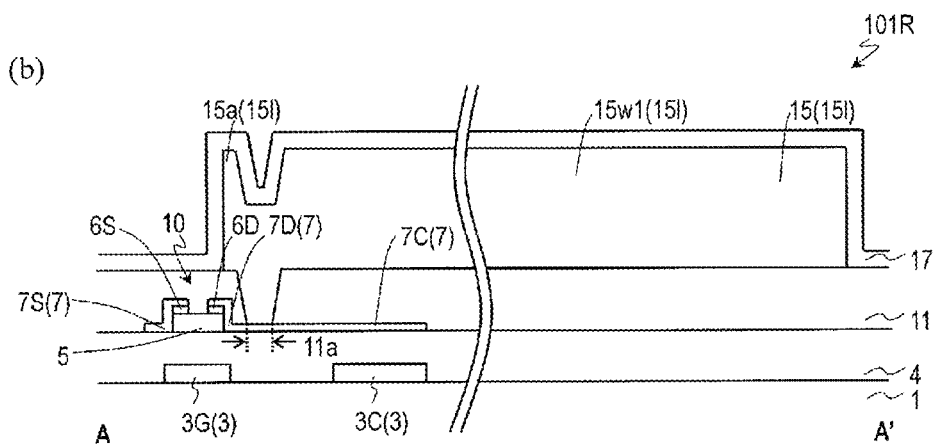
Figure 6:
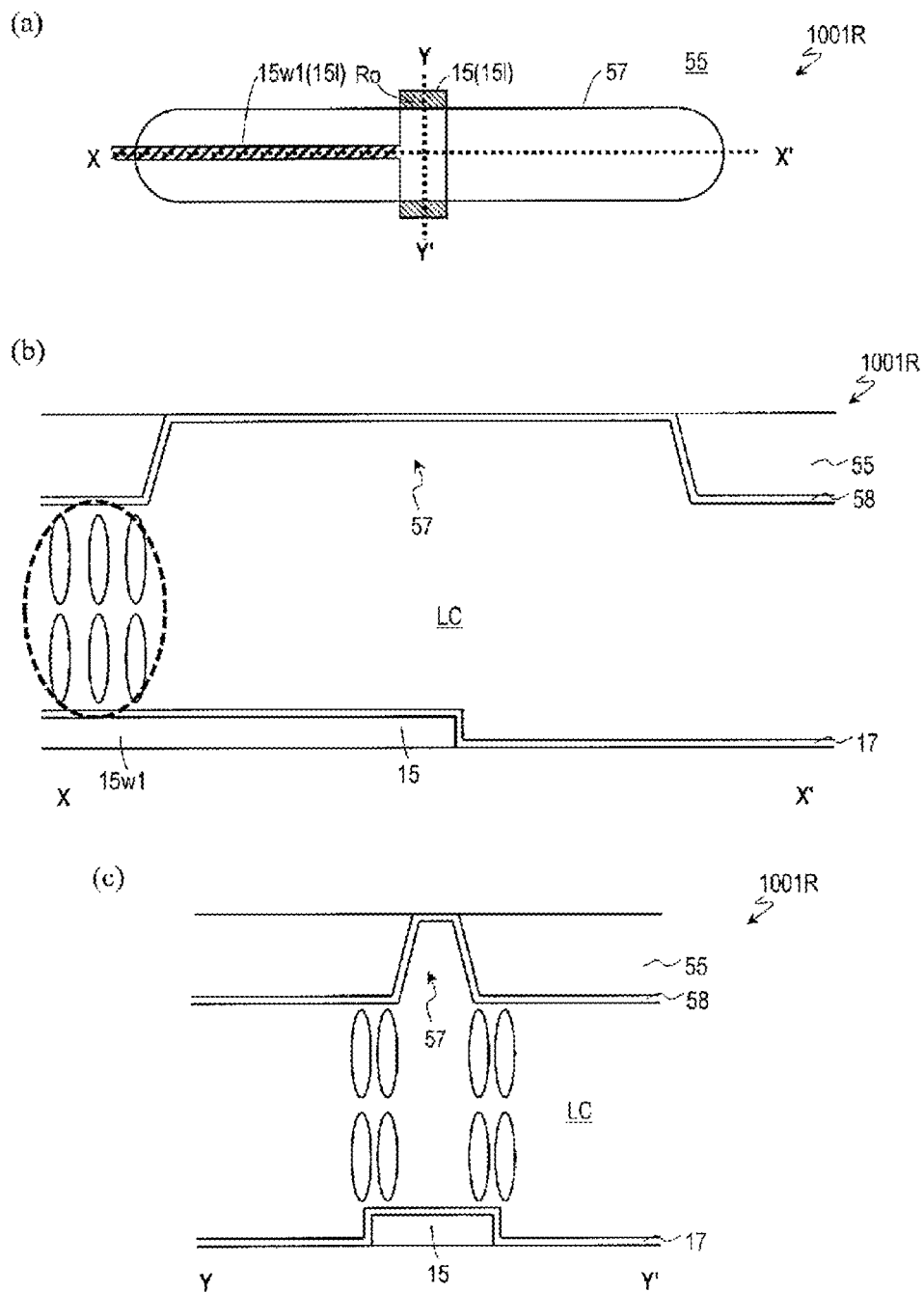
FIG. 6(a) is a schematic plan view for illustrating a positional relationship between a patch metal layer 151 and a slot 57 of the scanning antenna 1001R.
FIG. 6(b) is a schematic cross-sectional view of the scanning antenna 1001R along a line X-X' in FIG. 6(a)
FIG. 6(c) is a schematic cross-sectional view of the scanning antenna 1001R along a line Y-Y' in FIG. 6(a).

The scanning antenna 1000A including the TFT substrate 101A has superior antenna performance compared to the scanning antenna 1001R in Reference Example 1 illustrated in FIG. 5. With reference to FIG. 4 to FIG. 6, an advantage of the scanning antenna 1000A will be described.

As described above, the scanning antenna controls the voltage applied to each liquid crystal layer of each antenna unit to change the effective dielectric constant M ($\varepsilon_M$) of the liquid crystal layer for each antenna unit, and thereby, forms a two-dimensional pattern by antenna units with different electrostatic capacitances. The present inventors have discovered, by various investigations, new factors that reduce antenna performance. The present inventors have discovered that when the patch metal layer 151 including the patch electrode 15 includes a conductive portion other than the patch electrode 15 inside and near the slot 57, the antenna performance of the scanning antenna deteriorates. Hereinafter, the new factors will be described in detail.

First, with reference to FIG. 4, an orientation of the liquid crystal molecules in the vicinity of the patch electrode 15 and the slot 57 of the scanning antenna 1000A will be described. FIG. 4(a) is a schematic plan view for illustrating a positional relationship between the patch metal layer 151 and the slot 57 of the scanning antenna 1000A, and FIGS. 4(b) and 4(c) are schematic cross-sectional views of the scanning antenna 1000A along lines X-X' and Y-Y' in FIG. 4(a), respectively. The line X-X' and the line Y-Y' in FIG. 4(a) also serve as a long axis AS and a short axis BS of the slot 57.

The antenna performance is particularly affected by an overlapping region Ro (hatched portion in FIG. 4(a)) overlapped by the patch electrode 15 and the slot electrode 55 when viewed from the normal direction of the TFT substrate 101A and the slot substrate 201. As illustrated in FIG. 4(a), when viewed from the normal direction of the TFT substrate 101A and the slot substrate 201, a length ws of the slot 57 in the short axis BS direction is smaller than a length wp of the patch electrode 15 in the short axis BS direction of the slot 57. As a result, the overlapping region Ro is formed. In the present specification, when viewed from the normal direction of the TFT substrate and the slot substrate, the region where the patch electrode and the slot electrode overlap each other is referred to as an "overlapping region".

From the perspective of the antenna performance, the overlapping region Ro preferably has a planar shape that is axisymmetric with respect to the long axis AS of the slot 57. That is, the two overlapping regions Ro are preferably arranged axisymmetrically with respect to the long axis AS of the slot 57. The overlapping region Ro further preferably has a planar shape that is axisymmetric with respect to the short axis BS of the slot 57. That is, each of the two overlapping regions Ro further preferably has a planar shape that is axisymmetric with respect to the short axis BS of the slot 57.

FIGS. 4(b) and 4(c) schematically illustrate an orientation state of the liquid crystal molecules (dielectric anisotropy is positive) when a voltage is applied in the overlapping region Ro. Although the orientation state of the liquid crystal molecules other than the overlapping region Ro is omitted in the drawings, such liquid crystal molecules are continuously oriented to the liquid crystal molecules in the overlapping region Ro. The orientation of the liquid crystal molecules in other regions than the overlapping regions Ro (that is, the regions where the patch electrode 15 and the slot electrode 55 do not overlap each other when viewed from the normal direction of the TFT substrate 101A and the slot substrate 201) is also affected by the electric field formed by the patch electrode 15 and the slot electrode 55. A surface shape of the TFT substrate 101A (a surface shape on the liquid crystal layer LC side) is also affected.

As in a scanning antenna of the reference example described below with reference to FIG. 5, FIG. 6, and FIG. 7, when the patch metal layer 151 includes a conductive portion other than the patch electrode 15 inside and/or near the slot 57, the conductive portion affects the orientation of the liquid crystal molecules in the vicinity of the patch electrode 15 and the slot 57 (including the orientation of the liquid crystal molecules in the overlapping region Ro). This may deteriorate the antenna performance.

Note that the main contribution to the antenna performance is from the conductive portion other than the patch electrode 15 included in the patch metal layer 151 on the inner side and/or near the slot 57. Accordingly, as far as antenna performance is concerned, even in the case of a conductive portion other than the patch electrode 15 included in the patch metal layer 151, the conductive portion that is formed away from the slot 57 and the patch electrode 15 can be ignored. For example, in the TFT substrate 101A, as illustrated in FIG. 3(a), the patch metal layer 151 further includes the connection sections 15a1 and 15a2 in the antenna unit region U, but these are formed away from the slot 57 and the patch electrode 15, so the contribution to the antenna performance is small. In this manner, the conductive portions included in the patch metal layer 151 other than the patch electrode 15 are preferably disposed at a distance of at least a certain distance from the slot 57 and the patch electrode 15.

When viewed from the normal direction of the TFT substrate 101A and the slot substrate 201, the patch metal layer 151 does not include a conductive portion other than the patch electrode 15 inside and near the slot 57. Therefore, the scanning antenna 1000A has excellent antenna performance.

Furthermore, the overlapping region Ro of the scanning antenna 1000A has a planar shape axisymmetric with respect to the long axis AS of the slot 57, and has a planar shape that is axisymmetric with respect to the short axis BS of the slot 57.

The slot 57 has, for example, a shape in which both ends along the long axis AS of a rectangular shape are replaced with semicircles, but the slot 57 is not limited thereto. For example, the shape of the slot may be rectangular, or rectangular with corners being rounded.

Subsequently, the scanning antenna 1001R in Reference Example 1 will be described with reference to FIG. 5 and FIG. 6. FIG. 5(a) is a schematic plan view of an antenna unit region U in a transmission and/or reception region R1 of the scanning antenna 1001R in Reference Example 1, and FIG. 5(b) is a schematic cross-sectional view of the TFT substrate 101R included in the scanning antenna 1001R in Reference Example 1 along a line A-A' in FIG. 5(a). FIG. 6(a) is a schematic plan view for illustrating a positional relationship between the patch metal layer 151 and the slot 57 of the scanning antenna 1001R in Reference Example 1, and FIG. 6(b) and FIG. 6(c) are schematic cross-sectional views of the scanning antenna 1001R in Reference Example 1 along lines X-X' and Y-Y' in FIG. 6(a), respectively. In FIG. 5 and FIG. 6, components common to the previous drawings are denoted by common reference numerals, and duplicate descriptions are avoided.

As illustrated in FIG. 5(a) and FIG. 5(b), the scanning antenna 1001R in Reference Example 1 differs from the scanning antenna 1000A in the patch drain connection section. The patch drain connection section of the TFT substrate 101R included in the scanning antenna 1001R in Reference Example 1 includes a wiring line 15w1 included in the patch metal layer 151. The wiring line 15w1 extends in the slot 57 in the long axis AS direction of the slot 57 when viewed from the normal direction of the TFT substrate 101R and the slot substrate 201. The wiring line 15w1 is formed integrally with the patch electrode 15. That is, the patch metal layer 151 includes a conductive portion other than the patch electrode 15 inside and near the slot 57. In FIG. 6(a), the conductive portion other than the patch electrode 15 included in the patch metal layer 151 inside and near the slot 57 is hatched differently from the overlapping regions Ro.

Because the patch metal layer 151 includes the conductive portion other than the patch electrode 15 inside and near the slot 57, the scanning antenna 1001R in Reference Example 1 is inferior in the antenna performance to the scanning antenna 1000A.

FIG. 6(b) and FIG. 6(c) illustrate the orientation state of the liquid crystal molecules (depicted by a dotted line circle) in the region where the patch metal layer 151 (other than the patch electrode 15) and the slot electrode 55 overlap as well as the orientation state of the liquid crystal molecules in the overlapping region Ro. Due to the presence of the wiring line 15w1, the orientation of the liquid crystal molecules in this region is strongly influenced by the electric field. In the slot 57, the surface of the TFT substrate 101R has a step. Therefore, in the scanning antenna 1001R in Reference Example 1, the orientation state of the liquid crystal molecules is worse than that of the scanning antenna 1000A illustrated in FIG. 4. Note that, compared to the orientation of the liquid crystal molecules in the overlapping region, the orientation of the liquid crystal molecules in other regions than the overlapping regions Ro (that is, the regions where the patch electrode 15 and the slot electrode 55 do not overlap each other when viewed from the normal direction of the TFT substrate 101A and the slot substrate 201) is likely to be affected by the wiring line 15w1.

The problem of the inferior antenna performance because of the patch metal layer 151 including the conductive portion other than the patch electrode 15 inside and/or near the slot 57 may be significant when the patch metal layer 151 is relatively thick. Therefore, in a scanning antenna having a relatively thick patch metal layer, the effect of suppressing the deterioration in the antenna performance is great by that the patch metal layer 151 does not include a conductive portion other than the patch electrode 15 inside and near the slot 57.

The problem of the inferior antenna performance does not occur only in the scanning antenna 1001R in Reference Example 1. For example, also in a scanning antenna 1002R in Reference Example 2 illustrated in FIG. 7(a), the problem of the inferior antenna performance occurs.

Figure 7:
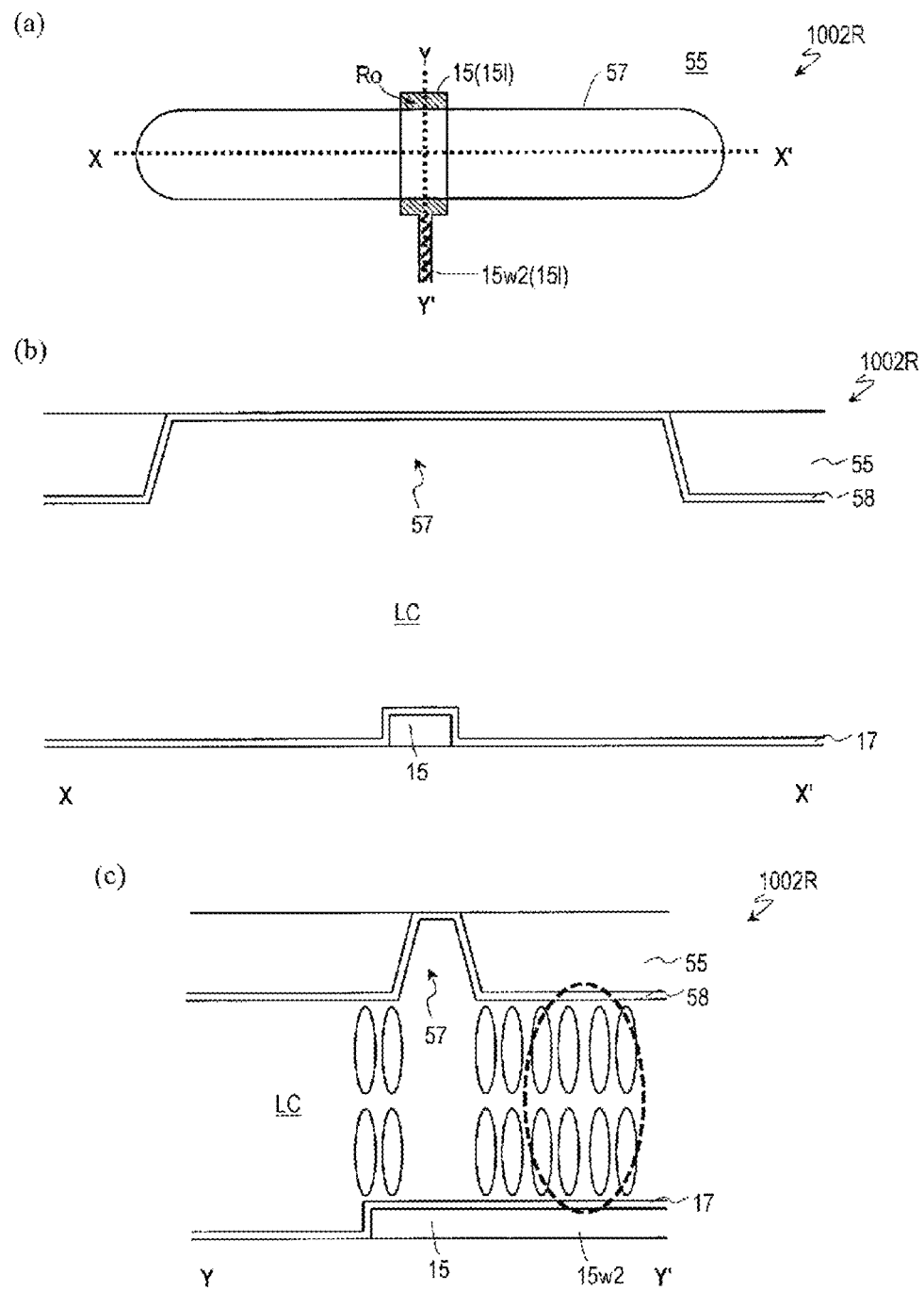
FIG. 7(a) is a schematic plan view for illustrating a positional relationship between a patch metal layer 151 and a slot 57 of a scanning antenna 1002R in Reference Example 2.
FIG. 7(b) is a schematic cross-sectional view of the scanning antenna 1002R along a line X-X' in FIG. 7(a)
FIG. 7(c) is a schematic cross-sectional view of the scanning antenna 1002R along a line Y-Y' in FIG. 7(a).

FIG. 7(a) is a schematic plan view for illustrating a positional relationship between the patch metal layer 151 and the slot 57 of the scanning antenna 1002R in Reference Example 2, and FIGS. 7(b) and 7(c) are schematic cross-sectional views of the scanning antenna 1002R in Reference Example 2 along lines X-X' and Y-Y' in FIG. 7(a), respectively. In FIG. 7, components common to the previous drawings are denoted by common reference numerals.

As illustrated in FIG. 7(a), the patch drain connection section of the TFT substrate included in the scanning antenna 1002R in Reference Example 2 includes a wiring line 15w2 included in the patch metal layer 151. The wiring line 15w2 extends in the short axis BS direction of the slot 57 and is formed integrally with the patch electrode 15. The wiring line 15w2 differs from the wiring line 15w1 included in the scanning antenna 1001R in Reference Example 1 in that the wiring line 15w2 extends in the short axis BS direction of the slot 57. In the scanning antenna 1002R in Reference Example 2, the patch metal layer 151 includes a conductive portion other than the patch electrode 15 near the slot 57. Therefore, the antenna performance is inferior compared to the scanning antenna 1000A.

Note that the scanning antenna 1002R in Reference Example 2 may be inferior in the antenna performance compared to the scanning antenna 1001R in Reference Example 1 also. As illustrated in FIG. 7(a) and FIG. 7(c), the wiring line 15w2 of the scanning antenna 1002R in Reference Example 2 is disposed adjacent to the overlapping region Ro. Therefore, this is because the orientation state of the liquid crystal molecules in the overlapping region Ro is likely to be affected by the electric field caused by the wiring line 15w2.

The structure of the TFT substrate 101A in the antenna unit region U will be described in detail. Reference is again made to FIG. 3(a) and FIG. 3(b).

Figure 3:
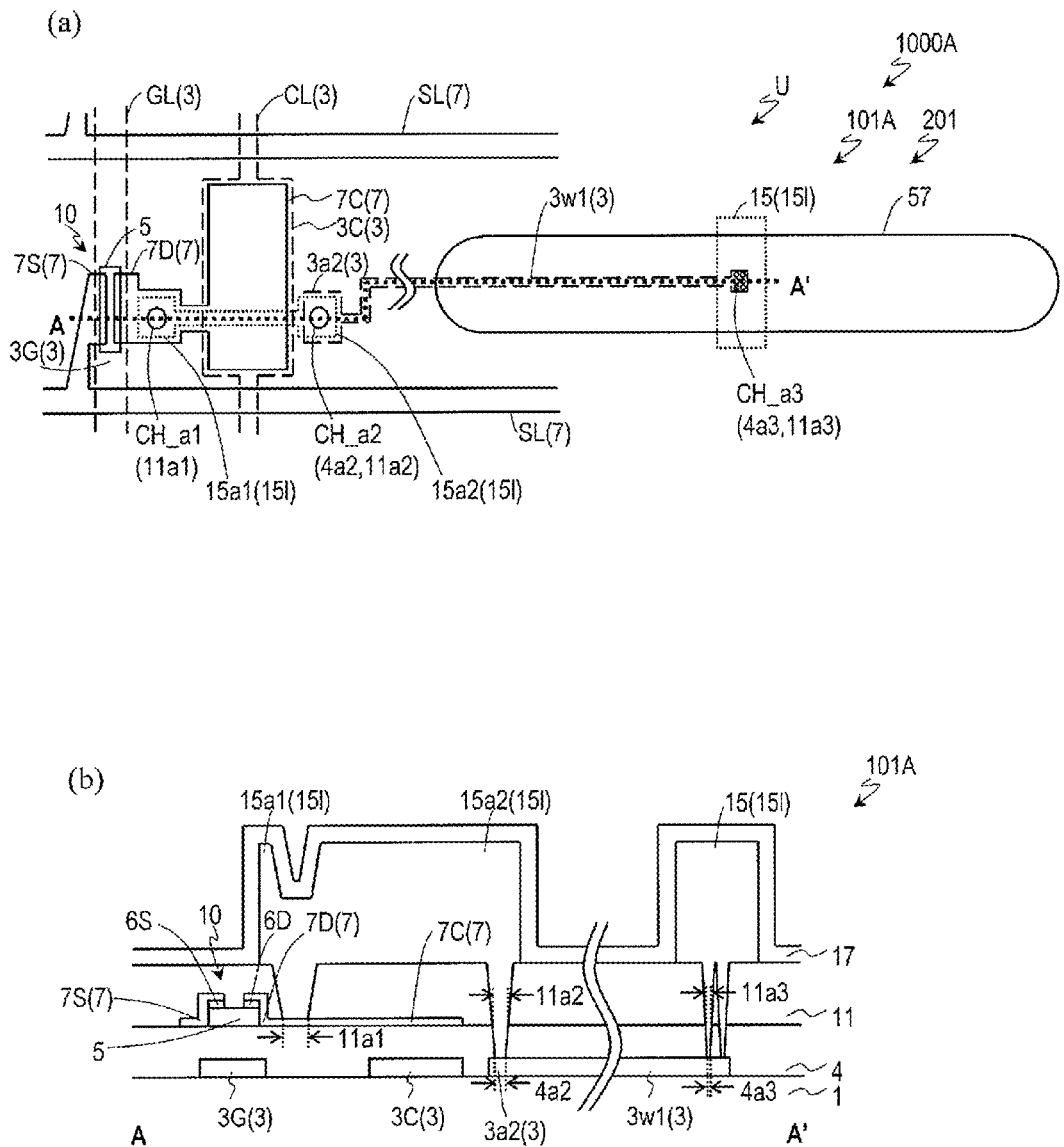
FIG. 3(a) is a schematic plan view of an antenna unit region U in a transmission and/or reception region R1 of the scanning antenna 1000A.
FIG. 3(b) is a schematic cross-sectional view of the TFT substrate 101A along a line A-A' in FIG. 3(a).

The TFT substrate 101A includes the gate metal layer 3 supported by the dielectric substrate 1, a gate insulating layer 4 formed on the gate metal layer 3, the source metal layer 7 formed on the gate insulating layer 4, a first insulating layer 11 formed on the source metal layer 7, the patch metal layer 151 formed on the first insulating layer 11, and a second insulating layer 17 formed on the patch metal layer 151, as illustrated in FIG. 3. The TFT substrate 101A further includes a lower conductive layer 13 formed between the first insulating layer 11 and the patch metal layer 151, as described later with reference to FIG. 8 to FIG. 10. The TFT substrate 101A further includes an upper conductive layer 19 formed on the second insulating layer 17.

The TFT 10 included in each antenna unit region U includes the gate electrode 3G, an island-shaped semiconductor layer 5, a contact layers 6S and 6D, the gate insulating layer 4 disposed between the gate electrode 3G and the semiconductor layer 5, and the source electrode 7S and the drain electrode 7D. In this example, the TFT 10 is a channel etch-type TFT having a bottom gate structure.

The gate electrode 3G is electrically connected to the gate bus line GL, and supplied with a scanning signal voltage via the gate bus line GL. The source electrode 7S is electrically connected to the source bus line SL, and is supplied with a data signal voltage via the source bus line SL. In this example, the gate electrode 3G and the gate bus line GL are formed of the same conductive film (gate conductive film). Here, the source electrode 7S, the drain electrode 7D, and the source bus line SL are formed of the same conductive film (source conductive film). The gate conductive film and the source conductive film are, for example, metal films.

The semiconductor layer 5 is disposed overlapping the gate electrode 3G with the gate insulating layer 4 interposed therebetween. In the illustrated example, the source contact layer 6S and the drain contact layer 6D are formed on the semiconductor layer 5. The source contact layer 6S and the drain contact layer 6D are disposed on both sides of a region where a channel is formed in the semiconductor layer 5 (channel region). The semiconductor layer 5 may be an intrinsic amorphous silicon (i-a-Si) layer, and the source contact layer 6S and the drain contact layer 6D may be $n^+$ type amorphous silicon ($n^+$-a-Si) layers.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

Here, each antenna unit region U includes an auxiliary capacitance electrically connected in parallel with the liquid crystal capacitance. In this example, the auxiliary capacitance is constituted by an upper auxiliary capacitance electrode (also referred to as an "auxiliary capacitance electrode" in some cases) 7C electrically connected to the drain electrode 7D, the gate insulating layer 4, and an lower auxiliary capacitance electrode (also referred to as an "auxiliary capacitance counter electrode" in some cases) 3C opposite to the upper auxiliary capacitance electrode 7C with the gate insulating layer 4 interposed therebetween. The lower auxiliary capacitance electrode 3C is included in the gate metal layer 3 and the upper auxiliary capacitance electrode 7C is included in the source metal layer 7. The gate metal layer 3 further includes a CS bus line (auxiliary capacitance line) CL connected to the lower auxiliary capacitance electrode 3C. The CS bus line CL extends substantially in parallel with the gate bus line GL, for example. In this example, the lower auxiliary capacitance electrode 3C is formed integrally with the CS bus line CL. A width of the lower auxiliary capacitance electrode 3C may be larger than a width of the CS bus line CL. In this example, the upper auxiliary capacitance electrode 7C extends from the drain electrode 7D. A width of the upper auxiliary capacitance electrode 7C may be larger than a width of a portion extending from the drain electrode 7D except for the upper auxiliary capacitance electrode 7C. Note that an arrangement relationship between the auxiliary capacity and the patch electrode 15 is not limited to the example illustrated in the drawing.

The gate metal layer 3 includes the gate electrode 3G of the TFT 10, the gate bus line GL, the lower auxiliary capacitance electrode 3C, and the CS bus line CL. The gate metal layer 3 further includes a connection section 3a2 electrically separated from the gate electrode 3G, and a wiring line 3w1 formed integrally with the connection section 3a2.

The gate insulating layer 4 includes an opening 4a2 that at least reaches the connection section 3a2, and an opening 4a3 that at least reaches the wiring line 3w1. The opening 4a3 overlaps the patch electrode 15 when viewed from the normal direction of the dielectric substrate 1.

The source metal layer 7 includes the source electrode 7S and drain electrode 7D of the TFT 10, the source bus line SL, and the upper auxiliary capacitance electrode 7C.

The first insulating layer 11 is formed to cover the TFT 10. The first insulating layer 11 includes an opening 11a1 that at least reaches the drain electrode 7D or a portion extending from the drain electrode 7D, an opening 11a2 overlapping the opening 4a2 when viewed from the normal direction of the dielectric substrate 1, and an opening 11a3 overlapping the opening 4a3 when viewed from the normal direction of the dielectric substrate 1. The opening 11a1 may be referred to as a contact hole CH_a1. The opening 4a2 formed in the gate insulating layer 4 and the opening 11a2 formed in the first insulating layer 11 constitute a contact hole CH_a2. The opening 4a3 formed in the gate insulating layer 4 and the opening 11a3 formed in the first insulating layer 11 constitute a contact hole CH_a3.

The patch metal layer 151 includes the patch electrode 15 and the connection sections 15a1 and 15a2.

The connection section 15a1 is formed on the first insulating layer 11 and within the opening 11a1, and is connected to the drain electrode 7D or a portion extending from the drain electrode 7D within the opening 11a1. For example, the connection section 15a1 is in contact with the portion extending from the drain electrode 7D within the opening 11a1.

The connection section 15a2 is integrally connected to the connection section 15a1. The connection section 15a2 is formed on the first insulating layer 11 and within the contact hole CH_a2, and is connected to the connection section 3a2 within the contact hole CH_a2. For example, here, the connection section 15a2 is in contact with the connection section 3a2 within the opening 4a2 formed in the gate insulating layer 4.

The patch electrode 15 is formed on the first insulating layer 11 and within the contact hole CH_a3, and is connected to the wiring line 3w1 within the contact hole CH_a3. For example, here, the patch electrode 15 is in contact with the wiring line 3w1 within the opening 4a3 formed in the gate insulating layer 4.

The patch metal layer 151 includes a metal layer. The patch metal layer 151 may be formed only from a metal layer. The patch metal layer 151 has a layered structure including a low resistance metal layer and a high melting-point metal containing layer under the low resistance metal layer, for example. The layered structure may further include a high melting-point metal containing layer over the low resistance metal layer. The "high melting-point metal containing layer" is a layer containing at least one element selected from the group consisting of titanium (Ti), tungsten (W), molybdenum (Mo), tantalum (Ta), and niobium (Nb). The "high melting-point metal containing layer" may have a layered structure. For example, the high melting-point metal containing layer refers to a layer formed of any of Ti, W, Mo, Ta, Nb, an alloy containing these, and a nitride of these, and a solid solution of the above metal(s) or alloy and the nitride. The "low resistance metal layer" is a layer containing at least one element selected from the group consisting of copper (Cu), aluminum (Al), silver (Ag), and gold (Au). The "low resistance metal layer" may have a layered structure. The low resistance metal layer of the patch metal layer 151 may be referred to as a "main layer", and the high melting-point metal containing layers under and over the low resistance metal layer may be referred to as a "lower layer" and an "upper layer", respectively.

The patch metal layer 151 includes a Cu layer or an Al layer as a main layer, for example. Specifically, the patch electrode 15 includes a Cu layer or an Al layer as a main layer, for example. A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer. A thickness of the metal layer included in the patch metal layer 151 (that is, a thickness of the metal layer included in the patch electrode 15) is set to be greater than thicknesses of the source electrode 7S and the drain electrode 7D, for example. The thickness of the metal layer in the patch electrode 15 is set to, for example, greater than or equal to 0.3 μm when it is formed of an Al layer.

The second insulating layer 17 is formed to cover the patch electrode 15, and the connection sections 15a1 and 15a2.

In the illustrated example, the TFT substrate 101A has a plurality of contact holes CH_a3. The patch electrode 15 is connected to the wiring line 3w1 via a plurality of contact holes CH_a3. However, the number of contact holes or the shapes thereof are not limited to the illustrated example, and one or more contact holes CH_a3 may be provided. According to the study by the present inventors, by including a plurality of contact holes CH_a3 in the TFT substrate 101A, the following advantages are obtained. When the total area where the patch metal layer 151 is in contact with the gate metal layer 3 within the contact hole CH_a3 is increased, adhesion between the patch metal layer 151 and the gate metal layer 3 can be improved. Additionally, when the contact area is the same, the larger a sum of lengths of edges of the plurality of contact holes CH_a3, the further a contact resistance between the patch metal layer 151 and the gate metal layer 3 can be reduced. For example, in a case where the gate metal layer 3 has the layered structure including the low resistance metal layer and the high melting-point metal containing layer (upper layer) over the low resistance metal layer, a portion of the upper layer of the gate metal layer 3 is simultaneously etched in the step of etching the first insulating film 11 and the gate insulating film 4 to form the contact hole CH_a3. The upper layer of the gate metal layer 3 remains in a ring shape along the edge of the contact hole CH_a3, and the contact between the upper layer of the ring-shaped gate metal layer 3 and the patch metal layer 151 contributes to the electrical contact. Therefore, when the sum of the lengths of the edges of the plurality of contact holes CH_a3 is large, the contact resistance between the gate metal layer 3 and the patch metal layer 151 is reduced.

A plurality of other contact holes (for example, contact holes CH_a2) may be similarly provided without limitation to the illustrated example. Including a plurality of contact holes can provide the benefits described above.

From the perspective of the antenna performance, the contact hole CH_a3 preferably has a planar shape that is axisymmetric with respect to the long axis of the slot 57. The contact hole CH_a3 further preferably has a planar shape that is axisymmetric with respect to the short axis of the slot 57. For example, the plurality of contact holes CH_a3 are preferably arranged to be axisymmetric with respect to the long axis of the slot 57, and is more preferably arranged to be axisymmetric with respect to the short axis of the slot 57.

The patch drain connection section of the TFT substrate 101A can also be referred to as follows. The patch drain connection section of the TFT substrate 101A includes a conductive portion that is included in the conductive layer closer to the dielectric substrate 1 than the conductive layer 151 including the patch electrode 15, and additional conductive portions 15a1 and 15a2 that are included in the conductive layer 151 including the patch electrode 15 and are formed physically separate from the patch electrode 15. The patch drain connection section of the TFT substrate 101A includes the wiring line 3w1 that is included in the gate metal layer 3 closer to the dielectric substrate 1 than the patch metal layer 151 including the patch electrode 15, and the connection sections 15a1 and 15a2 that are included in the patch metal layer 151 including the patch electrode 15 and are formed physically separate from the patch electrode 15. The wiring line 3w1 is included in a conductive layer that is either one of the conductive layer 3 including the gate electrode 3G of the TFT 10 or the conductive layer 7 including the source electrode 7S of TFT 10 and is closer to the dielectric substrate 1 than the other. In the TFT substrate 101A, the gate metal layer 3 including the gate electrode 3G of the TFT 10 is closer to the dielectric substrate 1 than the source metal layer 7 including the source electrode 7S of the TFT 10.

The TFT substrate 101A can obtain advantages described below, by including the additional conductive portions 15a1 and 15a2 that are included in the conductive layer 151 including the patch electrode 15 and are formed physically separate from the patch electrode 15. Since an amount of etching in an etching process of a patch conductive film 15' is reduced, a lifespan of an etchant of the patch conductive film 15' can be extended. A volume of the liquid crystal layer of the scanning antenna 1000A including the TFT substrate 101A (i.e., a volume of liquid crystal materials) can be reduced to reduce the cost of the scanning antenna 1000A.

Note that the present embodiment is not limited to the illustrated example. For example, the structure of the TFT is not limited to the illustrated example, and the arrangement relationship between the gate metal layer 3 and the source metal layer 7 may be reversed. The TFT may also have a top gate structure. The conductive layer including the source electrode of the TFT may be closer to the dielectric substrate than the conductive layer including the gate electrode of the TFT. The patch drain connection section may include the conductive portion that is closer to the dielectric substrate than the conductive layer including the patch electrode, and includes the conductive portion included in the conductive layer that is either one of the conductive layer including the gate electrode of the TFT or the conductive layer including the source electrode of TFT and is closer to the dielectric substrate than the other.

Figure 8:
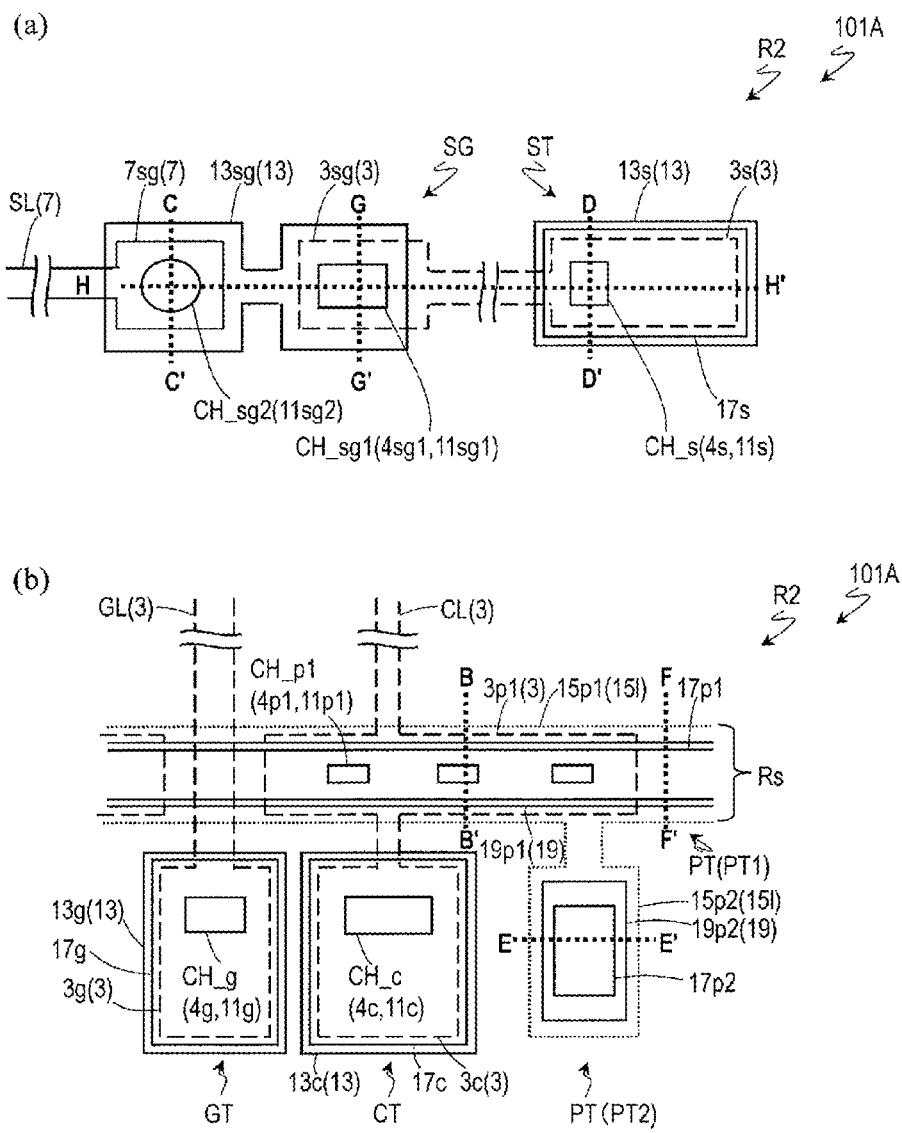
FIGS. 8(a) and 8(b) are schematic plan views of a non-transmission and/or reception region R2 of the TFT substrate 101A.
Figure 9:
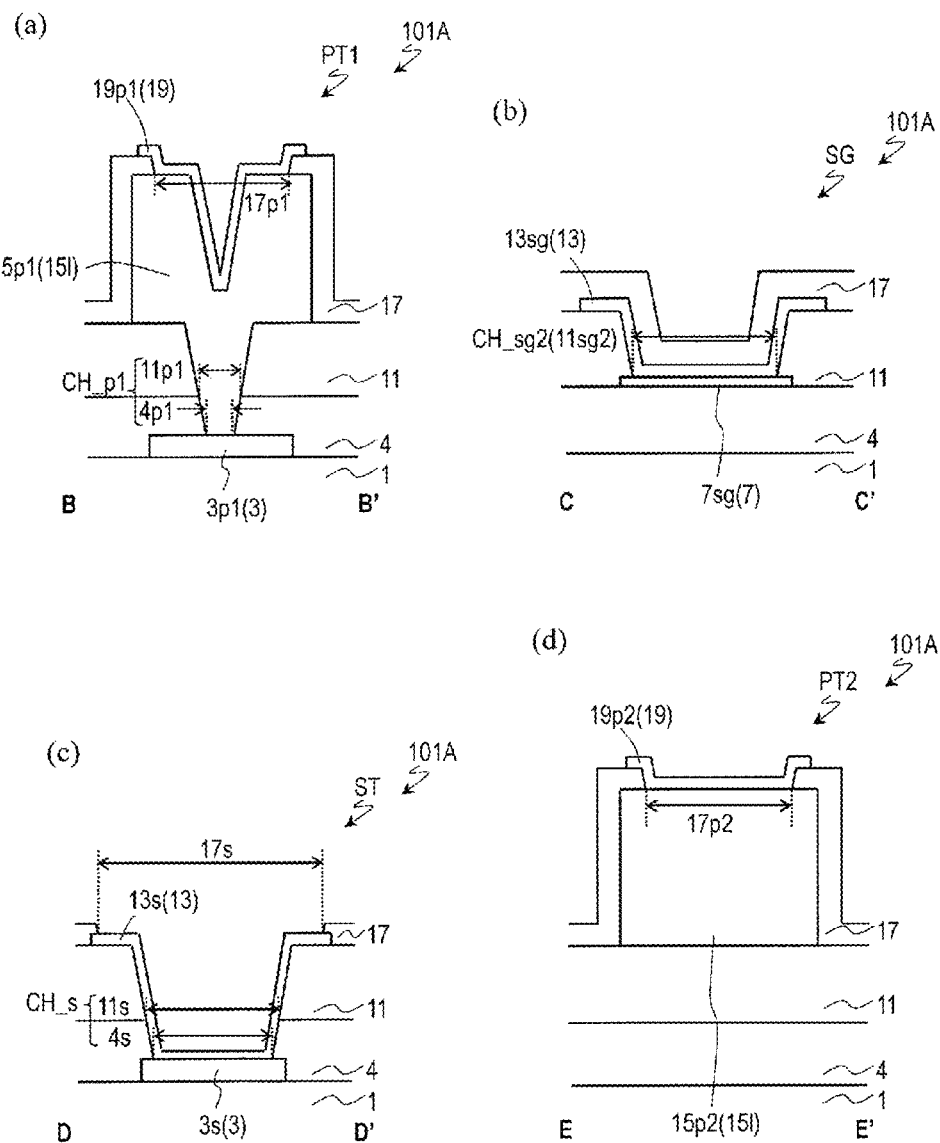
FIGS. 9(a) to 9(d) are schematic cross-sectional views of the non-transmission and/or reception region R2 of the TFT substrate 101A.
Figure 10:
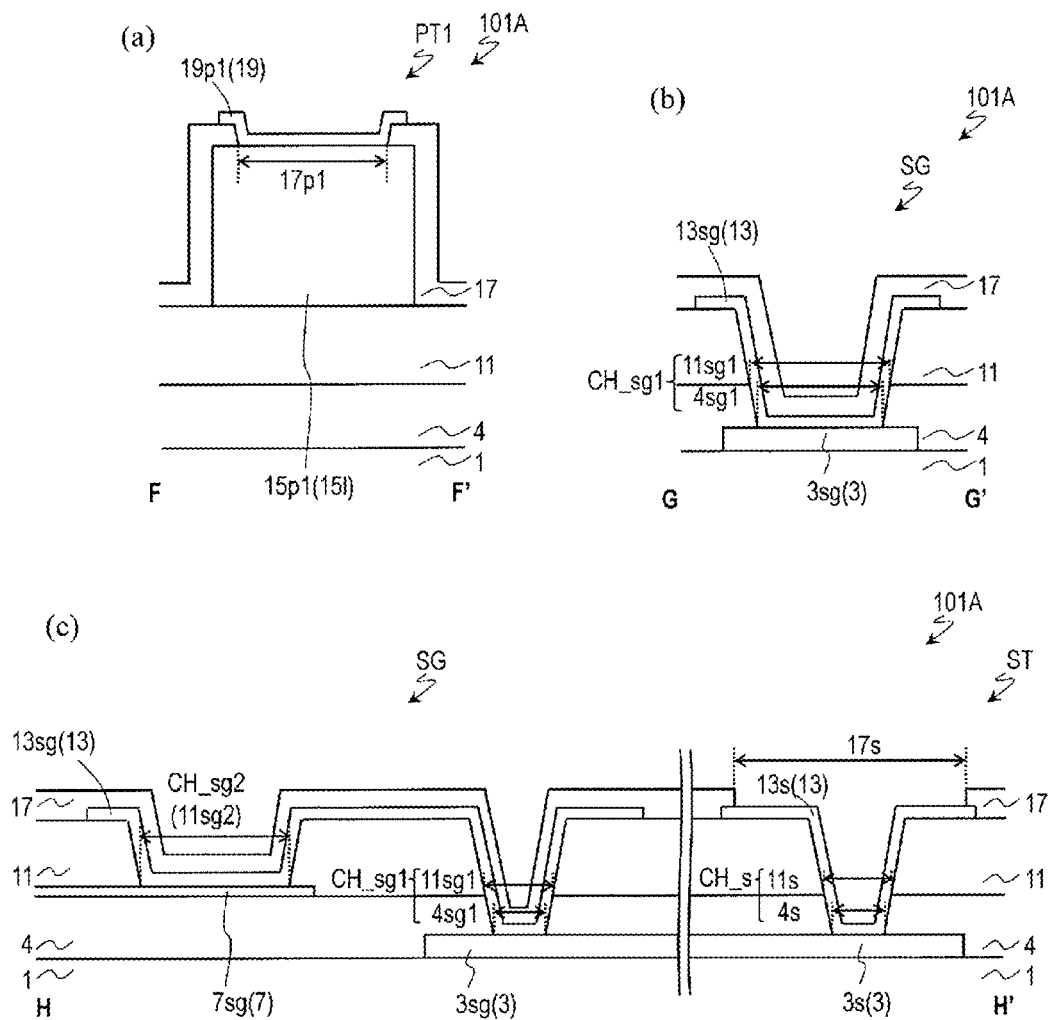
FIGS. 10(a) to 10(c) are schematic cross-sectional views of the non-transmission and/or reception region R2 of the TFT substrate 101A.
Figure 11:
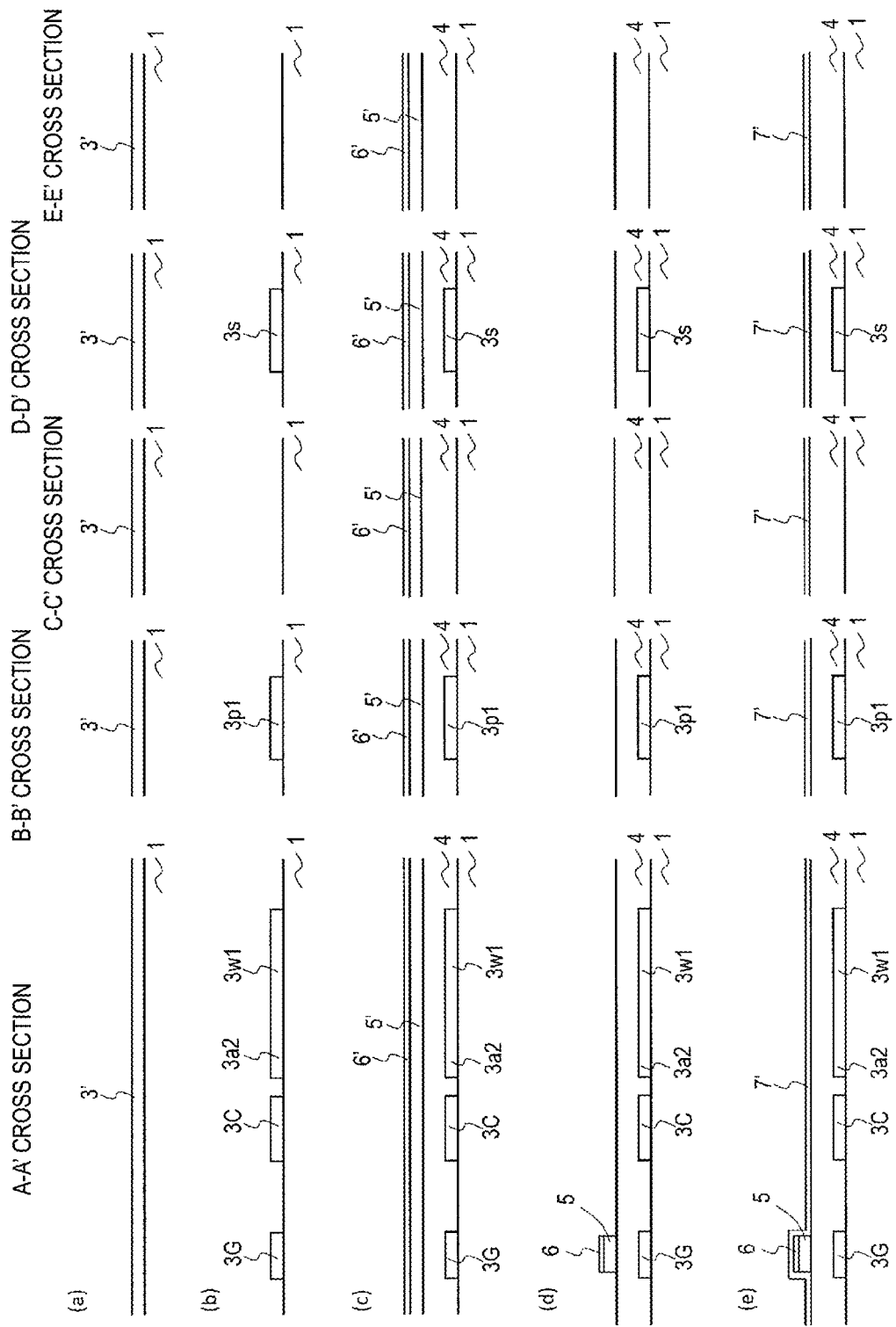
FIGS. 11(a) to 11(e) are process cross-sectional views illustrating an example of a manufacturing method of the TFT substrate 101A.
Figure 12:
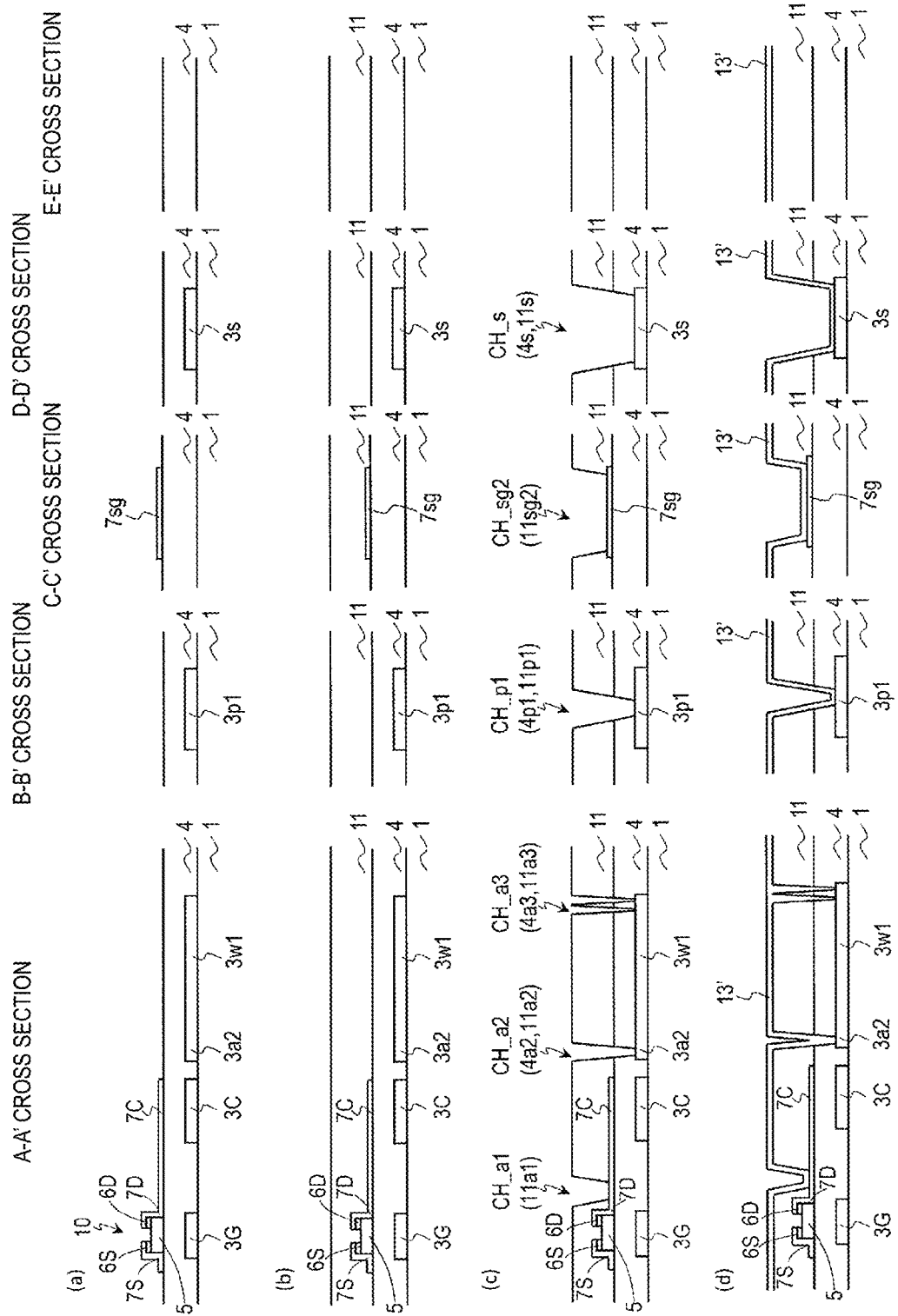
FIGS. 12(a) to 12(d) are process cross-sectional views illustrating an example of the manufacturing method of the TFT substrate 101A.
Figure 13:
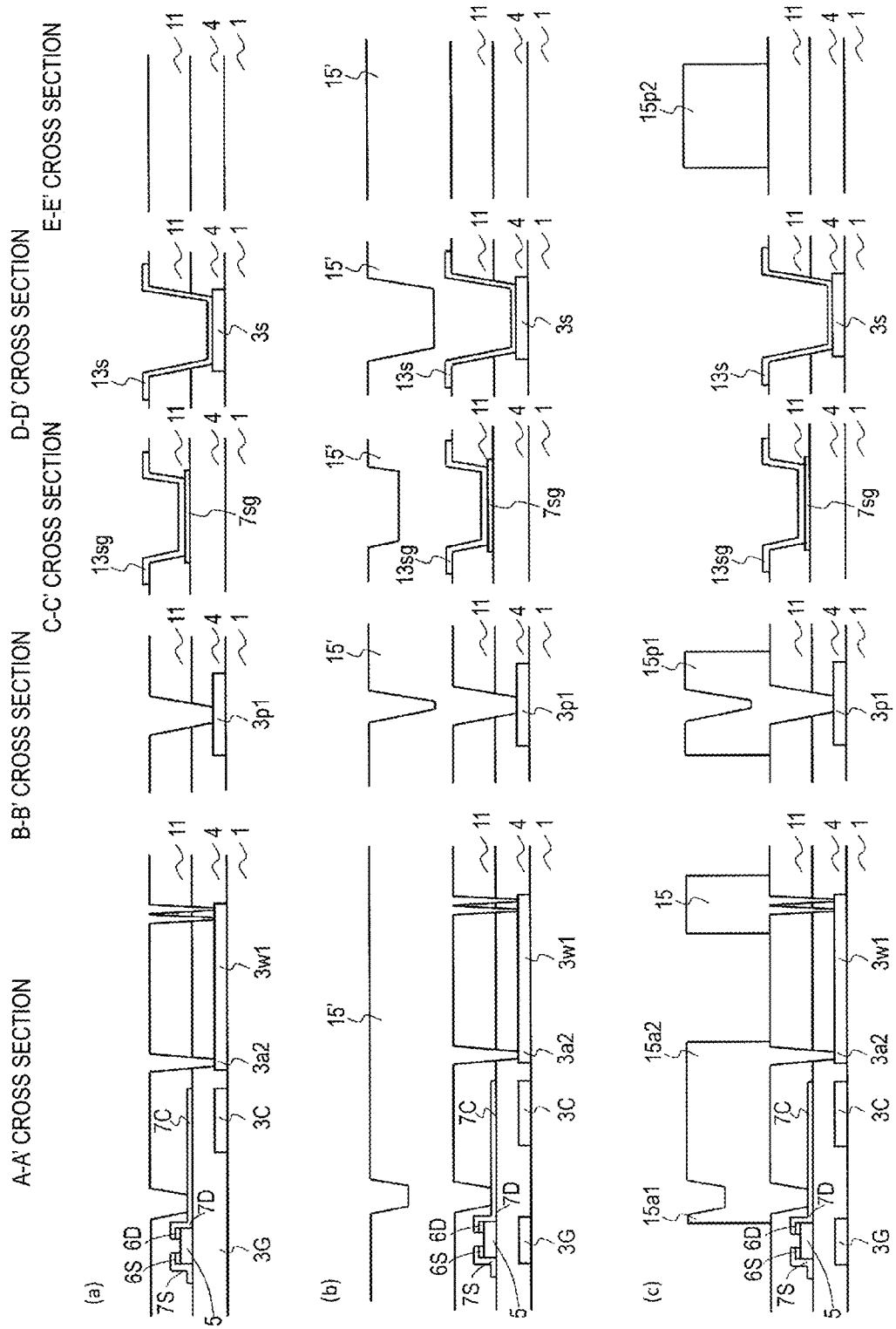
FIGS. 13(a) to 13(c) are process cross-sectional views illustrating an example of the manufacturing method of the TFT substrate 101A.
Figure 14:
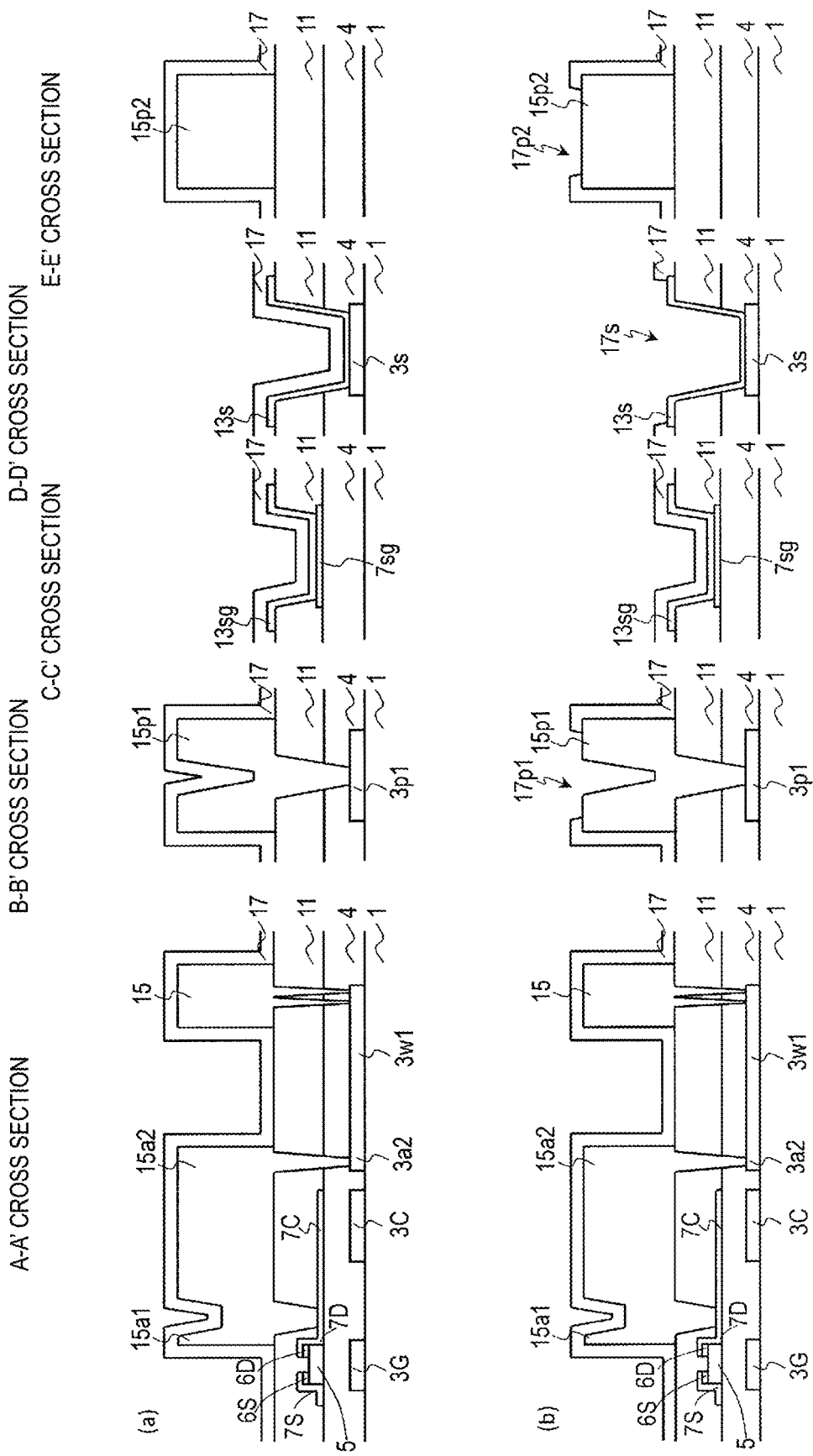
FIGS. 14(a) and 14(b) are process cross-sectional views illustrating an example of the manufacturing method of the TFT substrate 101A.
Figure 15:
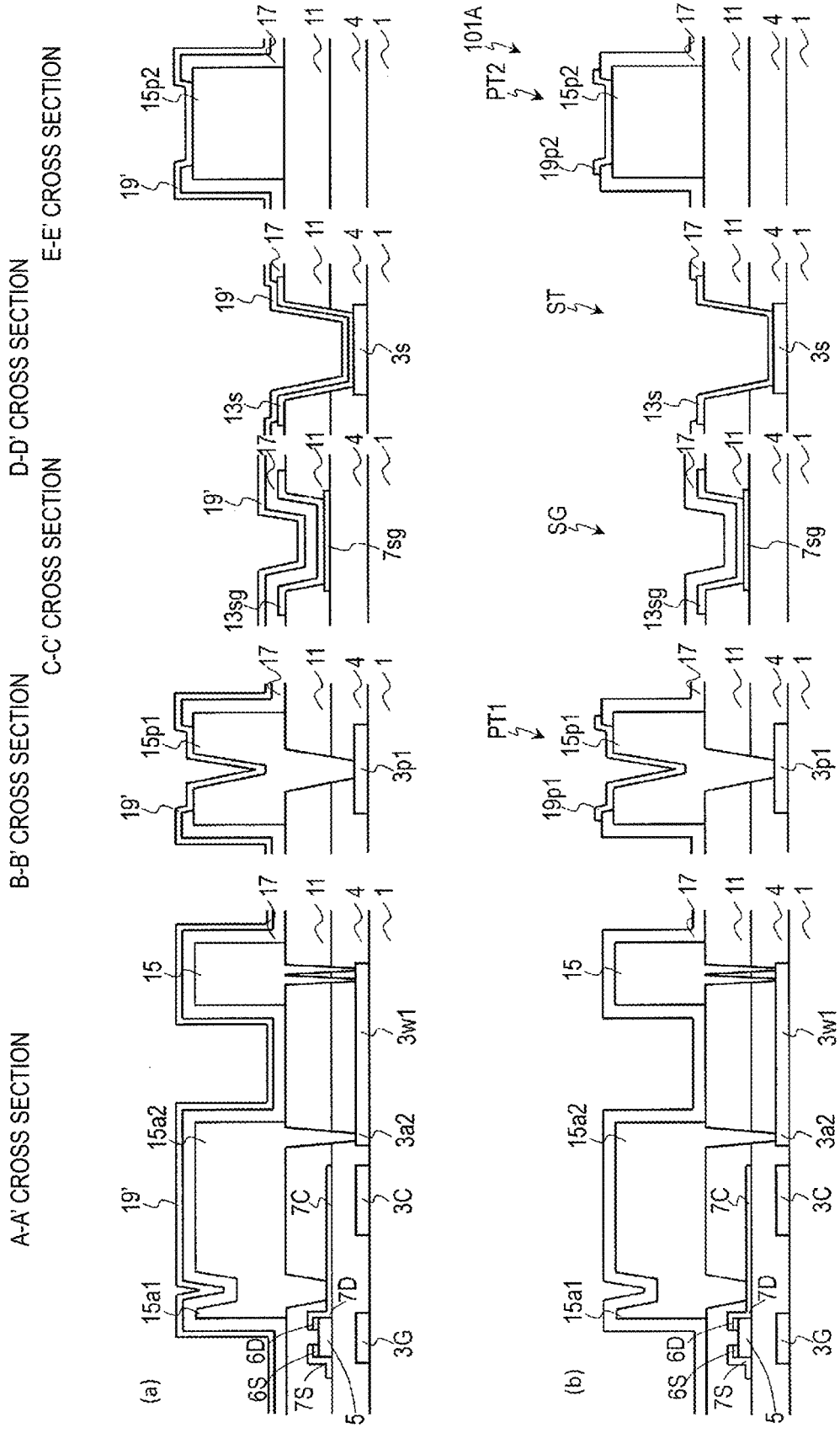
FIGS. 15(a) and 15(b) are process cross-sectional views illustrating an example of the manufacturing method of the TFT substrate 101A.

The structure of a non-transmission and/or reception region R2 of the TFT substrate 101A will be described with reference to FIG. 8 to FIG. 10. However, the structure of the non-transmission and/or reception region R2 of the TFT substrate 101A is not limited to the illustrated example. The scanning antenna 1000A basically can have excellent antenna performance as described above, regardless of the structure of the non-transmission and/or reception region R2.

FIGS. 8(a) and 8(b) are schematic plan views of the non-transmission and/or reception region R2 of the TFT substrate 101A, and FIGS. 9(a) to 9(d) and FIGS. 10(a) to 10(c) are schematic cross-sectional views of the non-transmission and/or reception region R2 of the TFT substrate 101A. FIG. 8(a) illustrates a source-gate connection section SG and a source terminal section ST provided in the non-transmission and/or reception region R2, and FIG. 8(b) illustrates a transfer terminal section PT, the gate terminal section GT, and a CS terminal section CT provided in the non-transmission and/or reception region R2.

The transfer terminal section PT includes a first transfer terminal section PT1 located in the seal region Rs and a second transfer terminal section PT2 provided outside the seal region Rs (on a side where the liquid crystal layer is not present). In the illustrated example, the first transfer terminal section PT1 extends along the seal region Rs to surround the transmission and/or reception region R1.

FIG. 9(a) illustrates a cross-section of the first transfer terminal section PT1 along a line B-B' in FIG. 8(b), FIG. 9(b) illustrates a cross-section of the source-gate connection section SG along a line C-C' in FIG. 8(a), FIG. 9(c) illustrates a cross-section of the source terminal section ST along a line D-D' in FIG. 8(a), FIG. 9(d) illustrates a cross-section of the second transfer terminal section PT2 along a line E-E' in FIG. 8(b), FIG. 10(a) illustrates a cross-section of the first transfer terminal section PT1 along a line F-F' in FIG. 8(b), FIG. 10(b) illustrates a cross-section of the source-gate connection section SG along a line G-G' in FIG. 8(a), and FIG. 10(c) illustrates cross-sections of the source-gate connection section SG and the source terminal section ST along a line H-H' in FIG. 8(a).

In general, the gate terminal section GT and the source terminal section ST are provided for each gate bus line and for each source bus line, respectively. The source-gate connection section SG is provided corresponding to each source bus line, in general. FIG. 8(b) illustrates the CS terminal section CT and the second transfer terminal section PT2 aligned with the gate terminal section GT, but the numbers and arrangements of CS terminal sections CT and second transfer terminal sections PT2 are configured independently from the gate terminal section GT. Typically, the numbers of CS terminal sections CT and second transfer terminal sections PT2 are less than the number of gate terminal sections GT and are adequately configured in consideration of uniformity of voltages of the CS electrode and the slot electrode. The second transfer terminal section PT2 can be omitted in a case where the first transfer terminal section PT1 is formed.

Each CS terminal section CT is provided corresponding to each CS bus line, for example. Each CS terminal section CT may be provided corresponding to a plurality of CS bus lines. For example, in a case where each CS bus line is supplied with the same voltage as the slot voltage, the TFT substrate 101A may include at least one CS terminal section CT. However, in order to decrease a wiring line resistance, the TFT substrate 101A preferably includes a plurality of CS terminal sections CT. Note that the slot voltage is a ground potential, for example. In the case that the CS bus line is supplied with the same voltage as the slot voltage, either the CS terminal section CT or the second transfer terminal section PT2 can be omitted.

Source-Gate Connection Section SG

The TFT substrate 101A includes the source-gate connection section SG in the non-transmission and/or reception region R2 as illustrated in FIG. 8(a). The source-gate connection section SG is provided for each source bus line SL, in general. The source-gate connection section SG electrically connects each source bus line SL to a connection wiring line (also referred to as a "source lower connection wiring line" in some cases) formed in the gate metal layer 3.

As illustrated in FIG. 8(a), FIG. 9(b), FIG. 10(b), and FIG. 10(c), the source-gate connection section SG includes a source lower connection wiring line 3sg, an opening 4sg1 formed in the gate insulating layer 4, a source bus line connection section 7sg, an opening 11sg1 and opening 11sg2 formed in the first insulating layer 11, and a source bus line upper connection section 13sg.

The source lower connection wiring line 3sg is included in the gate metal layer 3. The source lower connection wiring line 3sg is electrically separate from the gate bus line GL.

The opening 4sg1 formed in the gate insulating layer 4 at least reaches the source lower connection wiring line 3sg.

The source bus line connection section 7sg is included in the source metal layer 7 and electrically connected to the source bus line SL. In this example, the source bus line connection section 7sg extends from the source bus line SL and is formed integrally with the source bus line SL. A width of the source bus line connection section 7sg may be larger than a width of the source bus line SL.

The opening 11sg1 formed in the first insulating layer 11 overlaps the opening 4sg1 formed in the gate insulating layer 4 when viewed from the normal direction of the dielectric substrate 1. The opening 4sg1 formed in the gate insulating layer 4 and the opening 11sg1 formed in the first insulating layer 11 constitute a contact hole CH_sg1.

The opening 11sg2 formed in the first insulating layer 11 at least reaches the source bus line connection section 7sg. The opening 11sg2 may be referred to as a contact hole CH_sg2.

The source bus line upper connection section 13sg (also simply referred to as an "upper connection section 13sg") is included in the lower conductive layer 13. The upper connection section 13sg is formed on the first insulating layer 11, within the contact hole CH_sg1, and within the contact hole CH_sg2, is connected to the source lower connection wiring line 3sg within the contact hole CH_sg1, and is connected to the source bus line connection section 7sg within the contact hole CH_sg2. For example, here, the upper connection section 13sg is in contact with the source lower connection wiring line 3sg within the opening 4sg1 formed in the gate insulating layer 4, and in contact with the source bus line connection section 7sg within the opening 11sg2 formed in the first insulating layer 11.

A portion of the source lower connection wiring line 3sg exposed by the opening 4sg1 is preferably covered by the upper connection section 13sg. A portion of the source bus line connection section 7sg exposed by the opening 11sg2 is preferably covered by the upper connection section 13sg.

The lower conductive layer 13 includes, for example, a transparent conductive layer (for example, ITO layer).

In this example, the source-gate connection section SG does not include the conductive portion included in the patch metal layer 151 and the conductive portion included in the upper conductive layer 19.

The TFT substrate 101A has an excellent actional stability because of including the upper connection section 13sg in the source-gate connection section SG. Because the source-gate connection section SG includes the upper connection section 13sg, damages to the gate metal layer 3 and/or source metal layer 7 in a process of etching a patch conductive film for forming the patch metal layer 151 are reduced. A description is given of these effects.

As describe above, in the TFT substrate 101A, the source-gate connection section SG does not include the conductive portion included in the patch metal layer 151. Specifically, the patch conductive film in a source-gate connection section formation region is removed in a process of patterning the patch conductive film. In a case where the source-gate connection section SG does not include the upper connection section 13sg, the gate metal layer 3 (the source lower connection wiring line 3sg) is exposed within the contact hole CH_sg1, so that the patch conductive film to be removed is deposited within the contact hole CH_sg1 and formed in contact with the source lower connection wiring line 3sg. Similarly, in the case where the source-gate connection section SG does not include the upper connection section 13sg, the source metal layer 7 (the source bus line connection section 7sg) is exposed within the contact hole CH_sg2, so that the patch conductive film to be removed is deposited within the contact hole CH_sg2 and formed in contact with the source bus line connection section 7sg. In such a case, the gate metal layer 3 and/or the source metal layer 7 may suffer an etching damage. In the process of patterning the patch conductive film, for example, an etching solution containing phosphoric acid, nitric acid, and acetic acid is used. If the source lower connection wiring line 3sg and/or the source bus line connection section 7sg suffer the etching damage, a contact failure may occur in the source-gate connection section SG.

The source-gate connection section SG of the TFT substrate 101A includes the upper connection section 13sg formed within the contact hole CH_sg1 and the contact hole CH_sg2. Therefore, the damage to the source lower connection wiring line 3sg and/or the source bus line connection section 7sg caused by the etching in the process of patterning the patch conductive film is reduced. Accordingly, the TFT substrate 101A is excellent in actional stability.

From the viewpoint of effectively reducing the etching damage to the gate metal layer 3 and/or the source metal layer 7, it is preferable that a portion of the source lower connection wiring line 3sg exposed by the contact hole CH_sg1 is covered by the upper connection section 13sg, and a portion of the source bus line connection section 7sg exposed by the opening 11sg2 is covered by the upper connection section 13sg.

In the TFT substrate used for the scanning antenna, a relatively thick conductive film (the patch conductive film) may be used to form the patch electrode. In this case, the etching time and the overetching time of the patch conductive film can be longer than the etching process of the other layers. At this time, when the gate metal layer 3 (the source lower connection wiring line 3sg) and the source metal layer 7 (the source bus line connection section 7sg) are exposed within the contact hole CH_sg1 and the contact hole CH_sg2, the etching damage to which these metal layers are subjected increases. In this manner, in the TFT substrate having a relatively thick patch metal layer, the effect of reducing the etch damage to the gate metal layer 3 and/or the source metal layer 7 is particularly great due to the source-gate connection section SG having the upper connection section 13sg.

In the illustrated example, the contact hole CH_sg2 is formed at a position away from the contact hole CH_sg1. The present embodiment is not limited to the illustrated example, and the contact hole CH_sg1 and the contact hole CH_sg2 may be contiguous to each other (that is, may be formed as a single contact hole). The contact hole CH_sg1 and the contact hole CH_sg2 may be formed as a single contact hole in the same process. Specifically, a single contact hole that at least reaches the source lower connection wiring line 3sg and source bus line connection section 7sg may be formed in the gate insulating layer 4 and first insulating layer 11 to form the upper connection section 13sg within this contact hole and on the first insulating layer 11. At this time, the upper connection section 13sg is preferably formed to cover a portion of the source lower connection wiring line 3sg and source bus line connection section 7sg exposed by the contact hole.

The lower connection section of the source terminal section ST can be formed of the gate metal layer 3 by providing the source-gate connection section SG as described later. The source terminal section ST including the lower connection section formed of the gate metal layer 3 is excellent in reliability.

Source Terminal Section ST

The TFT substrate 101A includes the source terminal section ST in the non-transmission and/or reception region R2 as illustrated in FIG. 8(a). The source terminal section ST is provided corresponding to each source bus line SL, in general. Here, the source terminal section ST and the source-gate connection section SG are provided corresponding to each source bus line SL.

The source terminal section ST includes a source terminal lower connection section 3s (also simply referred to as a "lower connection section 3s") connected to the source lower connection wiring line 3sg formed in the source-gate connection section SG, an opening 4s formed in the gate insulating layer 4, an opening 11s formed in the first insulating layer 11, a source terminal upper connection section 13s (also simply referred to as an "upper connection section 13s"), and an opening 17s formed in the second insulating layer 17 as illustrated in FIG. 8(a), FIG. 9(c), and FIG. 10(c).

The lower connection section 3s is included in the gate metal layer 3. The lower connection section 3s is electrically connected to the source lower connection wiring line 3sg formed in the source-gate connection section SG. In this example, the lower connection section 3s extends from the source lower connection wiring line 3sg and is formed integrally with the source lower connection wiring line 3sg.

The opening 4s formed in the gate insulating layer 4 at least reaches the lower connection section 3s.

The opening 11s formed in the first insulating layer 11 overlaps the opening 4s formed in the gate insulating layer 4 when viewed from the normal direction of the dielectric substrate 1. The opening 4s formed in the gate insulating layer 4 and the opening 11s formed in the first insulating layer 11 constitute a contact hole CH_s.

The upper connection section 13s is included in the lower conductive layer 13. The upper connection section 13s is formed on the first insulating layer 11 and within the contact hole CH_s, and is connected to the lower connection section 3s within the contact hole CH_s. Here, the upper connection section 13s is in contact with the lower connection section 3s within the opening 4s formed in the gate insulating layer 4.

The opening 17s formed in the second insulating layer 17 at least reaches the upper connection section 13s.

An entire of the upper connection section 13s may overlap the lower connection section 3s when viewed from the normal direction of the dielectric substrate 1.

In this example, the source terminal section ST does not include the conductive portion included in the source metal layer 7, the conductive portion included in the patch metal layer 151, and the conductive portion included in the upper conductive layer 19.

The source terminal section ST, which includes the lower connection section 3s included in the gate metal layer 3, has excellent reliability.

In the terminal section, particularly, the terminal section provided outside the seal region Rs (opposite to the liquid crystal layer), corrosion may occur due to atmospheric moisture (which may contain impurities). The atmospheric moisture intrudes from the contact hole at least reaching the lower connection section and at least reaches the lower connection section so that corrosion may occur in the lower connection section. From the viewpoint of suppressing the corrosion occurring, the contact hole that at least reaches the lower connection section is preferably deep. In other words, the thickness of the insulating layer where the opening constituting the contact hole is formed is preferably large.

In a process of fabricating a TFT substrate including a glass substrate as a dielectric substrate, broken pieces or chips (cullets) of the glass substrate may cause scratches or disconnection in the lower connection section of the terminal section. For example, a plurality of TFT substrates are fabricated from one mother substrate. The cullet is generated in cutting the mother substrate or in forming scribe lines in the mother substrate, for example. From the viewpoint of preventing the scratches and disconnection in the lower connection section of the terminal section, the contact hole that at least reaches the lower connection section is preferably deep. In other words, the thickness of the insulating layer where the opening constituting the contact hole is formed is preferably large.

In the source terminal section ST of the TFT substrate 101A, since the lower connection section 3s is included in the gate metal layer 3, the contact hole CH_s that at least reaches the lower connection section 3s includes the opening 4s formed in the gate insulating layer 4 and the opening 11s formed in the first insulating layer 11. A depth of the contact hole CH_s is a sum of a thickness of the gate insulating layer 4 and a thickness of the first insulating layer 11. In contrast, in a case where the lower connection section is included in the source metal layer 7, for example, the contact hole that at least reaches the lower connection section includes only an opening formed in the first insulating layer 11, and a depth of the opening is the thickness of the first insulating layer 11 and is smaller than the depth of the contact hole CH_s. Here, the depth of the contact hole and the thickness of the insulating layer are respectively a depth and a thickness in the normal direction of the dielectric substrate 1. The same holds for other contact holes and insulating layers unless otherwise specifically described. In this way, the source terminal section ST of the TFT substrate 101A includes the lower connection section 3s included in the gate metal layer 3, and therefore, has excellent reliability as compared with the case that the lower connection section is included in the source metal layer 7, for example.

The opening 4s formed in the gate insulating layer 4 is formed to expose only a portion of the lower connection section 3s. The opening 4s formed in the gate insulating layer 4 is inside the lower connection section 3s when viewed from the normal direction of the dielectric substrate 1. Therefore, the entire region within the opening 4s has a layered structure including the lower connection section 3s and the upper connection section 13s on the dielectric substrate 1. In the source terminal section ST, a portion outside the lower connection section 3s has a layered structure including the gate insulating layer 4 and the first insulating layer 11. With this configuration, the source terminal section ST of the TFT substrate 101A has excellent reliability. From the viewpoint of obtaining the excellent reliability, the sum of the thicknesses of the gate insulating layer 4 and the thickness of the first insulating layer 11 is preferably large.

A portion of the lower connection section 3s exposed by the opening 4s is covered by the upper connection section 13s.

Gate Terminal Section GT

The TFT substrate 101A includes the gate terminal section GT in the non-transmission and/or reception region R2 as illustrated in FIG. 8(b). The gate terminal section GT may have the same configuration as the source terminal section ST as illustrated in FIG. 8(b), for example. The gate terminal section GT is provided for each gate bus line GL, in general.

As illustrated in FIG. 8(b), in this example, the gate terminal section GT includes a gate terminal lower connection section 3g (also simply referred to as a "lower connection section 3g"), an opening 4g formed in the gate insulating layer 4, an opening 11g formed in the first insulating layer 11, a gate terminal upper connection section 13g (also simply referred to as an "upper connection section 13g"), and an opening 17g formed in the second insulating layer 17.

The lower connection section 3g is included in the gate metal layer 3 and electrically connected to the gate bus line GL. In this example, the lower connection section 3g extends from the gate bus line GL and is formed integrally with the gate bus line GL.

The opening 4g formed in the gate insulating layer 4 at least reaches the lower connection section 3g.

The opening 11g formed in the first insulating layer 11 overlaps the opening 4g formed in the gate insulating layer 4 when viewed from the normal direction of the dielectric substrate 1. The opening 4g formed in the gate insulating layer 4 and the opening 11g formed in the first insulating layer 11 constitute a contact hole CH_g.

The upper connection section 13g is included in the lower conductive layer 13. The upper connection section 13g is formed on the first insulating layer 11 and within the contact hole CH_g, and is connected to the lower connection section 3g within the contact hole CH_g. Here, the upper connection section 13g is in contact with the lower connection section 3g within the opening 4g formed in the gate insulating layer 4.

The opening 17g formed in the second insulating layer 17 at least reaches the upper connection section 13g.

An entire of the upper connection section 13g may overlap the lower connection section 3g when viewed from the normal direction of the dielectric substrate 1.

In this example, the gate terminal section GT does not include the conductive portion included in the source metal layer 7, the conductive portion included in the patch metal layer 151, and the conductive portion included in the upper conductive layer 19.

The gate terminal section GT, which includes the lower connection section 3g included in the gate metal layer 3, has excellent reliability similar to the source terminal section ST.

CS Terminal Section CT

The TFT substrate 101A includes the CS terminal section CT in the non-transmission and/or reception region R2 as illustrated in FIG. 8(b). The CS terminal section CT here has the same configuration as the source terminal section ST and gate terminal section GT as illustrated in FIG. 8(b). The CS terminal section CT may be provided corresponding to each CS bus line CL, for example.

As illustrated in FIG. 8(b), the CS terminal section CT includes a CS terminal lower connection section 3c (also simply referred to as a "lower connection section 3c"), an opening 4c formed in the gate insulating layer 4, an opening 11c formed in the first insulating layer 11, a CS terminal upper connection section 13c (also simply referred to as an "upper connection section 13c"), and an opening 17c formed in the second insulating layer 17.

The lower connection section 3c is included in the gate metal layer 3. The lower connection section 3c is electrically connected to the CS bus line CL. In this example, the lower connection section 3c extends from the CS bus line CL and is formed integrally with the CS bus line CL.

The opening 4c formed in the gate insulating layer 4 at least reaches the lower connection section 3c.

The opening 11c formed in the first insulating layer 11 overlaps the opening 4c formed in the gate insulating layer 4 when viewed from the normal direction of the dielectric substrate 1. The opening 4c formed in the gate insulating layer 4 and the opening 11c formed in the first insulating layer 11 constitute a contact hole CH_c.

The upper connection section 13c is included in the lower conductive layer 13. The upper connection section 13c is formed on the first insulating layer 11 and within the contact hole CH_c, and is connected to the lower connection section 3c within the contact hole CH_c. Here, the upper connection section 13c is in contact with the lower connection section 3c within the opening 4c formed in the gate insulating layer 4.

The opening 17c formed in the second insulating layer 17 at least reaches the upper connection section 13c.

An entire of the upper connection section 13c may overlap the lower connection section 3c when viewed from the normal direction of the dielectric substrate 1.

In this example, the CS terminal section CT does not include the conductive portion included in the source metal layer 7, the conductive portion included in the patch metal layer 151, and the conductive portion included in the upper conductive layer 19.

The CS terminal section CT, which includes the lower connection section 3c included in the gate metal layer 3, has excellent reliability similar to the source terminal section ST.

Transfer Terminal Section PT

The TFT substrate 101A includes the first transfer terminal section PT1 in the non-transmission and/or reception region R2 as illustrated in FIG. 8(b). The first transfer terminal section PT1 is provided in the seal region Rs, here (that is, the first transfer terminal section PT1 is provided in the sealing portion surrounding the liquid crystal layer).

The first transfer terminal section PT1 includes a first transfer terminal lower connection section 3p1 (also simply referred to as a "lower connection section 3p1"), an opening 4p1 formed in the gate insulating layer 4, an opening 11p1 formed in the first insulating layer 11, a first transfer terminal conductive portion 15p1 (also simply referred to as a "conductive portion 15p1"), an opening 17p1 formed in the second insulating layer 17, and a first transfer terminal upper connection section 19p1 (also simply referred to as the "upper connection section 19p1"), as illustrated in FIG. 8(b) and FIG. 9(a).

The lower connection section 3p1 is included in the gate metal layer 3. That is, the lower connection section 3p1 is formed of the same conductive film as that of the gate bus line GL. The lower connection section 3p1 is electrically separate from the gate bus line GL. For example, in a case where the CS bus line CL is supplied with the same voltage as the slot voltage, the lower connection section 3p1 is electrically connected to, for example, the CS bus line CL. As is illustrated, the lower connection section 3p1 may extend from the CS bus line. However, the lower connection section 3p1 is not limited to the illustrated example and may be electrically separate from the CS bus line.

The opening 4p1 formed in the gate insulating layer 4 at least reaches the lower connection section 3p1.

The opening 11p1 formed in the first insulating layer 11 overlaps the opening 4p1 formed in the gate insulating layer 4 when viewed from the normal direction of the dielectric substrate 1. The opening 4p1 formed in the gate insulating layer 4 and the opening 11p1 formed in the first insulating layer 11 constitute a contact hole CH_p1.

The conductive portion 15p1 is included in the patch metal layer 151. The conductive portion 15p1 is formed on the first insulating layer 11 and within the contact hole CH_p1, and is connected to the lower connection section 3p1 within the contact hole CH_p1. Here, the conductive portion 15p1 is in contact with the lower connection section 3p1 within the opening 4p1.

The opening (contact hole) 17p1 formed in the second insulating layer 17 at least reaches the conductive portion 15p1.

The upper connection section 19p1 is included in the upper conductive layer 19. The upper connection section 19p1 is formed on the second insulating layer 17 and within the opening 17p1, and is connected to the conductive portion 15p1 within the opening 17p1. Here, the upper connection section 19p1 is in contact with the conductive portion 15p1 within the opening 17p1. The upper connection section 19p1 is connected to a transfer terminal upper connection section on the slot substrate side by a sealing member containing conductive particles, for example (see FIG. 16(b)).

In this example, the first transfer terminal section PT1 does not include the conductive portion included in the source metal layer 7 and the conductive portion included in the lower conductive layer 13.

The upper conductive layer 19 includes, for example, a transparent conductive layer (for example, ITO layer). The upper conductive layer 19 may be formed of only a transparent conductive layer, for example. Alternatively, the upper conductive layer 19 may include a first upper conductive layer including a transparent conductive layer and a second upper conductive layer formed under the first upper conductive layer. The second upper conductive layer is formed of one layer or two or more layers selected from the group consisting of a Ti layer, a MoNbNi layer, a MoNb layer, a MoW layer, a W layer and a Ta layer, for example.

The first transfer terminal section PT1 includes the conductive portion 15p1 between the lower connection section 3p1 and the upper connection section 19p1. This allows the first transfer terminal section PT1 to have an advantage that an electric resistance between the lower connection section 3p1 and the upper connection section 19p1 is low.

An entire of the upper connection section 19p1 may overlap the conductive portion 15p1 when viewed from the normal direction of the dielectric substrate 1.

In this example, the lower connection section 3p1 is disposed between two gate bus lines GL adjacent to each other. Two lower connection sections 3p1 disposed with the gate bus line GL being interposed therebetween may be electrically connected to each other via a conductive connection section (not illustrated). The conductive connection section electrically connecting two lower connection sections 3p1 may be included, for example, in the source metal layer 7.

Here, a plurality of contact holes CH_p1 are provided so that the lower connection section 3p1 is connected to the upper connection section 19p1 with the conductive portion 15p1 interposed therebetween, but one or more contact holes CH_p1 may be provided to one lower connection section 3p1. One contact hole may be provided to one lower connection section 3p1. The number of contact holes or the shapes thereof are not limited to the illustrated example.

Here, the upper connection section 19p1 is connected to the conductive portion 15p1 through one opening 17p1, but one or more openings 17p1 may be provided to one upper connection section 19p1. A plurality of openings may be provided to one upper connection section 19p1. The number of openings or the shapes thereof are not limited to the illustrated example.

The second transfer terminal section PT2 is provided outside the seal region Rs (opposite to the transmission and/or reception region R1). The second transfer terminal section PT2 includes a second transfer terminal lower connection section 15p2 (also simply referred to as a "lower connection section 15p2"), an opening 17p2 formed in the second insulating layer 17, and a second transfer terminal upper connection section 19p2 (also simply referred to as an "upper connection section 19p2") as illustrated in FIG. 8(b) and FIG. 9(d).

The second transfer terminal section PT2 has a cross-sectional structure the same as a portion of the first transfer terminal section PT1 not including the lower connection section 3p1 and the contact hole CH_p1 (see FIG. 10(a)).

The lower connection section 15p2 is included in the patch metal layer 151. Here, the lower connection section 15p2 extends from the first transfer terminal conductive portion 15p1 and is formed integrally with the first transfer terminal conductive portion 15p1.

The opening (contact hole) 17p2 formed in the second insulating layer 17 at least reaches the lower connection section 15p2.

The upper connection section 19p2 is included in the upper conductive layer 19. The upper connection section 19p2 is formed on the second insulating layer 17 and within the opening 17p2, and is connected to the lower connection section 15p2 within the opening 17p2. Here, the upper connection section 19p2 is in contact with the lower connection section 15p2 within the opening 17p2.

In this example, the second transfer terminal section PT2 does not include the conductive portion included in the gate metal layer 3, the conductive portion included in the source metal layer 7, and the conductive portion included in the lower conductive layer 13.

In the second transfer terminal section PT2 also, the upper connection section 19p2 may be connected to a transfer terminal connection section on the slot substrate side by a sealing member containing conductive particles, for example.

Manufacturing Method of TFT Substrate 101A

A description is given of a manufacturing method of the TFT substrate 101A with reference to FIG. 11 to FIG. 15.

FIGS. 11(a) to 11(e), FIGS. 12(a) to 12(d), FIGS. 13(a) to 13(c), FIGS. 14(a) and 14(b), and FIGS. 15(a) and 15(b) are process cross-sectional views illustrating an example of the manufacturing method of the TFT substrate 101A. Each of these drawings illustrates a cross section corresponding to FIG. 3(b) and FIGS. 9(a) to 9(d) (the cross sections along lines A-A' to E-E' of the TFT substrate 101A). Note that the cross-section corresponding to FIG. 10(a) (cross section along a line F-F' of the TFT substrate 101A) is formed by the same method of the cross-section corresponding to FIG. 9(d) (cross section along a line E-E' of the TFT substrate 101A), although the illustration thereof is omitted.

First, as illustrated in FIG. 11(a), a gate conductive film 3' is formed on the dielectric substrate 1 by sputtering or the like. Materials of the gate conductive film 3' are not specifically limited, and, for example, a film containing a metal such as aluminum (Al), tungsten (W), molybdenum (Mo), tantalum (Ta), chromium (Cr), titanium (Ti), and copper (Cu), or an alloy thereof or a metal nitride thereof can be appropriately used. Here, as the gate conductive film 3', a layered film (MoN/Al) is formed by layering an Al film (having a thickness of 150 nm, for example) and a MoN layer (having a thickness of 100 nm, for example) in this order.

Next, the gate conductive film 3' is patterned to obtain the gate metal layer 3 as illustrated in FIG. 11(b). Specifically, the gate electrode 3G, the gate bus line GL, the lower auxiliary capacitance electrode 3C, the CS bus line CL, the connection section 3a2, and the wiring line 3w1 are formed in an antenna unit formation region, the source lower connection wiring line 3sg is formed in the source-gate connection section formation region, and the lower connection sections 3s, 3g, 3c, and 3p1 are formed in the respective terminal section formation regions. Here, patterning of the gate conductive film 3' is performed by wet etching.

After that, as illustrated in FIG. 11(c), a gate insulating film 4, an intrinsic amorphous silicon film 5', and an n$^+$ type amorphous silicon film 6' are formed in this order to cover the gate metal layer 3. For the purpose of simplification, the gate insulating layer 4 and the gate insulating film 4 are denoted by the same reference sign. The gate insulating film 4 can be formed by CVD or the like. As the gate insulating film 4, a silicon oxide ($SiO_2$) film, a silicon nitride (SiNy) film, a silicon oxynitride (SiOxNy; x>y) film, a silicon nitride oxide (SiNxOy; x>y) film, or the like may be used as appropriate. Here, as the gate insulating film 4, a silicon nitride (SixNy) film having a thickness of 350 nm, for example, is formed. The intrinsic amorphous silicon film 5' having a thickness of 120 nm, for example, and the n$^+$ type amorphous silicon film 6' having a thickness of 30 nm, for example, are formed.

Next, the intrinsic amorphous silicon film 5' and the n$^+$ type amorphous silicon film 6' are patterned to obtain the island-shaped semiconductor layer 5 and the contact layer 6 as illustrated in FIG. 11(d). Note that the semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5, and the source electrode and drain electrode.

Next, a source conductive film 7' is formed on the gate insulating film 4 and on the contact layer 6 as illustrated in FIG. 11(e) by sputtering or the like. Materials of the source conductive film 7' are not specifically limited, and, for example, a film containing a metal such as aluminum (Al), tungsten (W), molybdenum (Mo), tantalum (Ta), chromium (Cr), titanium (Ti), and copper (Cu), or an alloy thereof or a metal nitride thereof can be appropriately used. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example) in this order.

Next, the source conductive film 7' is patterned to form the source metal layer 7 as illustrated in FIG. 12(a). Specifically, the source electrode 7S, the drain electrode 7D, the source bus line SL, and the upper auxiliary capacitance electrode 7C are formed in the antenna unit formation region, and the source bus line connection section 7sg is formed in the source-gate connection section formation region. At this time, the contact layer 6 is also etched, and the source contact layer 6S and the drain contact layer 6D separated from each other are formed. Here, patterning of the source conductive film 7' is performed by wet etching. For example, an aqueous solution containing phosphoric acid, nitric acid, and acetic acid is used to simultaneously pattern the MoN film and the Al film by wet etching. After that, a portion of the contact layer located on the region that will serve as the channel region of the semiconductor layer 5 is removed by dry etching, for example, to form a gap portion, and the source contact layer 6S and the drain contact layer 6D are separated. At this time, in the gap portion, the area around the surface of the semiconductor layer 5 is also etched (overetching). In this manner, the TFT 10 is obtained.

Note that, when a layered film in which a Ti film and an Al film layered in this order is used as a source conductive film, for example, after patterning the Al film by wet etching using, for example, an aqueous solution of phosphoric acid, acetic acid, and nitric acid, the Ti film and the contact layer ($n^+$ type amorphous silicon layer) 6 may be simultaneously patterned by dry etching. Alternatively, it is also possible to collectively etch the source conductive film and the contact layer. However, in the case of simultaneously etching the source conductive film or the lower layer thereof and the contact layer 6, it may be difficult to control the distribution of the etching amount of the semiconductor layer 5 (the amount of excavation of the gap portion) of the entire substrate. In contrast, as described above, in a case where etching is performed in an etching step separate from the source/drain separation and the gap portion formation, the etching amount of the gap portion can be more easily controlled.

Here, in the antenna unit formation region, the source metal layer 7 is formed not to overlap at least a portion of the connection section 3a2 and at least a portion of the wiring line 3w1. In the source-gate connection section formation region, the source metal layer 7 is formed such that at least a portion of the source lower connection wiring line 3sg does not overlap the source bus line connection section 7sg. Each terminal section formation region does not include the conductive portion included in the source metal layer 7.

Next, as illustrated in FIG. 12(b), the first insulating film 11 is formed to cover the TFT 10 and the source metal layer 7. For the purpose of simplification, the first insulating layer 11 and the first insulating film 11 are denoted by the same reference sign. The first insulating film 11 is formed by CVD or the like, for example. As the first insulating film 11, a silicon oxide ($SiO_2$) film, a silicon nitride (SiNy) film, a silicon oxynitride (SiOxNy; x>y) film, a silicon nitride oxide (SiNxOy; x>y) film, or the like may be used as appropriate.

In this example, the first insulating film 11 is formed to be in contact with the channel region of the semiconductor layer 5. Here, as the first insulating film 11, a silicon nitride (SixNy) film having a thickness of 330 nm, for example, is formed.

Subsequently, the first insulating film 11 and the gate insulating film 4 are etched through a known photolithography process to form the first insulating layer 11 and the gate insulating layer 4, as illustrated in FIG. 12(c). Specifically, in the antenna unit formation region, the opening 11a1 (contact hole CH_a1) that at least reaches a portion extending from the drain electrode 7D is formed in the first insulating film 11, the contact hole CH_a2 that at least reaches the connection section 3a2 is formed in the gate insulating film 4 and the first insulating film 11, and the contact hole CH_a3 that at least reaches the wiring line 3w1 is formed in the gate insulating film 4 and the first insulating film 11. In a first transfer terminal section formation region, the contact hole CH_p1 that at least reaches the lower connection section 3p1 is formed in the gate insulating film 4 and the first insulating film 11. In the source-gate connection section formation region, the contact hole CH_sg1 at least reaching the source lower connection wiring line 3sg is formed in the gate insulating film 4 and the first insulating film 11, and the opening 11sg2 (contact hole CH_sg2) at least reaching the source bus line connection section 7sg is formed in the first insulating film 11. In a source terminal section formation region, the contact hole CH_s that at least reaches the lower connection section 3s is formed in the gate insulating film 4 and the first insulating film 11. In a gate terminal section formation region, the contact hole CH_g that at least reaches the lower connection section 3g is formed in the gate insulating film 4 and the first insulating film 11. In a CS terminal section formation region, the contact hole CH_c that at least reaches the lower connection section 3c is formed in the gate insulating film 4 and the first insulating film 11.

In this etching process, the source metal layer 7 is used as an etch stop to etch the first insulating film 11 and the gate insulating film 4.

For example, in the antenna unit formation region, the first insulating film 11 and the gate insulating film 4 are collectively etched in a region overlapping the connection section 3a2 and the wiring line 3w1, and the portion extending from the drain electrode 7D functions as the etch stop to etch only the first insulating film 11 in a region overlapping the portion extending from the drain electrode 7D. This allows the contact holes CH_a1, CH_a2, and CH_a3 to be obtained.

The contact hole CH_a2 includes the opening 4a2 formed in the gate insulating film 4 and the opening 11a2 formed in the first insulating film 11. A side surface of the opening 4a2 and a side surface of the opening 11a2 may be aligned on a side surface of the contact hole CH_a2. The contact hole CH_a3 includes the opening 4a3 formed in the gate insulating film 4 and the opening 11a3 formed in the first insulating film 11. A side surface of the opening 4a3 and a side surface of the opening 11a3 may be aligned on a side surface of the contact hole CH_a3. In the present embodiment, the expression that "the side surfaces" of different two or more layers "are aligned" within the contact hole refers to not only a case that the side surfaces exposed in the contact hole in these layers are flush in the vertical direction, but also a case that those side surfaces continuously form an inclined surface such as a tapered shape. Such a structure can be obtained, for example, by etching these layers using the same mask, or alternatively by using one of these layers as a mask to etch the other layer.

The first insulating film 11 and the gate insulating film 4 are collectively etched using the same etchant, for example. Here, the first insulating film 11 and the gate insulating film 4 are etched by dry etching using a fluorine gas. The first insulating film 11 and the gate insulating film 4 may be etched using different etchants.

In the source-gate connection section formation region, the first insulating film 11 and the gate insulating film 4 are collectively etched in a region overlapping the source lower connection wiring line 3sg, and the source bus line connection section 7sg functions as the etch stop to etch the first insulating film 11 in a region overlapping the source bus line connection section 7sg. This allows the contact holes CH_sg1 and CH_sg2 to be obtained.

The contact hole CH_sg1 includes the opening 4sg1 formed in the gate insulating layer 4 and the opening 11sg1 formed in the first insulating layer 11. Here, since at least a portion of the source lower connection wiring line 3sg is formed not to overlap the source bus line connection section 7sg, the contact hole CH_sg1 is formed in the gate insulating film 4 and the first insulating film 11. A side surface of the opening 4sg1 and a side surface of the opening 11sg1 may be aligned on a side surface of the contact hole CH_sg1.

In the first transfer terminal section formation region, the first insulating film 11 and the gate insulating film 4 are collectively etched to form the contact hole CH_p1. The contact hole CH_p1 includes the opening 4p1 formed in the gate insulating film 4 and the opening 11p1 formed in the first insulating film 11. A side surface of the opening 4p1 and a side surface of the opening 11p1 may be aligned on a side surface of the contact hole CH_p1.

In the source terminal section formation region, the first insulating film 11 and the gate insulating film 4 are collectively etched to form the contact hole CH_s. The contact hole CH_s includes the opening 4s formed in the gate insulating film 4 and the opening 11s formed in the first insulating film 11. A side surface of the opening 4s and a side surface of the opening 11s may be aligned on a side surface of the contact hole CH_s.

In the gate terminal section formation region, the first insulating film 11 and the gate insulating film 4 are collectively etched to form the contact hole CH_g. The contact hole CH_g includes the opening 4g formed in the gate insulating film 4 and the opening 11g formed in the first insulating film 11. A side surface of the opening 4g and a side surface of the opening 11g may be aligned on a side surface of the contact hole CH_g.

In the CS terminal section formation region, the first insulating film 11 and the gate insulating film 4 are collectively etched to form the contact hole CH_c. The contact hole CH_c includes the opening 4c formed in the gate insulating film 4 and the opening 11c formed in the first insulating film 11. A side surface of the opening 4c and a side surface of the opening 11c may be aligned on a side surface of the contact hole CH_c.

In this step, in a second transfer terminal section formation region, the opening is not formed in the gate insulating film 4 and the first insulating film 11.

Next, as illustrated in FIG. 12(d), a lower conductive film 13' is formed on the first insulating layer 11, within the contact hole CH_a1, within the contact hole CH_a2, within the contact hole CH_a3, within the contact hole CH_sg1, within the contact hole CH_sg2, within the contact hole CH_p1, within the contact hole CH_s, within the contact hole CH_g, and within the contact hole CH_c, by sputtering, for example. The lower conductive film 13' includes a transparent conductive film, for example. An indium tin oxide (ITO) film, an IZO film, a zinc oxide (ZnO) film or the like can be used as the transparent conductive film. Here, an ITO film having a thickness of 70 nm, for example, is formed as the lower conductive film 13'.

Next, the lower conductive film 13' is patterned to form the lower conductive layer 13 as illustrated in FIG. 13(a). Specifically, the source bus line upper connection section 13sg in contact with the source lower connection wiring line 3sg within the contact hole CH_sg1 and in contact with the source bus line connection section 7sg within the contact hole CH_sg2 is formed in the source-gate connection section formation region, the upper connection section 13s in contact with the lower connection section 3s within the contact hole CH_s is formed in the source terminal section formation region, the upper connection section 13g in contact with the lower connection section 3g within the contact hole CH_g is formed in the gate terminal section formation region, and the upper connection section 13c in contact with the lower connection section 3c within the contact hole CH_c is formed in the CS terminal section formation region.

Next, as illustrated in FIG. 13(b), a patch conductive film 15' is formed on the lower conductive layer 13 and on the first insulating layer 11. The same material as that of the gate conductive film 3' or the source conductive film 7' can be used as the material of the patch conductive film 15'. Here, as the patch conductive film 15', a layered film (Cu/Ti) is formed which includes a Ti film (having a thickness of 20 nm, for example) and a Cu film (having a thickness of 500 nm, for example) in this order. Alternatively, as the patch conductive film 15', a layered film (MoN/Al/MoN) may be formed which includes a MoN film (having a thickness of 50 nm, for example), an Al film (having a thickness of 1000 nm, for example), and a MoN film (having a thickness of 50 nm, for example) in this order.

The patch conductive film is preferably set to be thicker than the gate conductive film and the source conductive film. Accordingly, by reducing the sheet resistance of the patch electrode, the loss resulting from the oscillation of free electrons in the patch electrode changing to heat can be reduced. A suitable thickness of the patch conductive film is, for example, greater than or equal to 0.3 μm. In a case where the thickness of the patch conductive film becomes thinner than this, the sheet resistance becomes greater or equal to 0.10 Ω/sq, and there is a possibility that the loss increases. The thickness of the patch conductive film is, for example, less than or equal to 3 μm, and more preferably less than or equal to 2 μm. In a case where the thickness is thicker than this, warping of the substrate may be caused by a thermal stress in the process. In a case where the warping is large, problems such as conveyance troubles, chipping of the substrate, or cracking of the substrate may occur in the mass production process.

Next, the patch conductive film 15' is patterned to form the patch metal layer 151 as illustrated in FIG. 13(c). Specifically, the patch electrode 15 and the connection sections 15a1 and 15a2 are formed in the antenna unit formation region, the conductive portion 15p1 is formed in the first transfer terminal section formation region, and the lower connection section 15p2 is formed in the second transfer terminal section formation region.

In the antenna unit formation region, the connection section 15a1 is formed to be connected to a portion extending from the drain electrode 7D within the contact hole CH_a1, and the connection section 15a2 is formed to be connected to the connection section 3a2 within the contact hole CH_a2. The patch electrode 15 is formed to be connected to the wiring line 3w1 within the contact hole CH_a3. In the first transfer terminal section formation region, the conductive portion 15p1 is formed to be connected to the lower connection section 3p1 within the contact hole CH_p1.

In the case that the layered film (MoN/Al/MoN) is formed as the patch conductive film 15' by layering MoN, Al, and MoN in this order, patterning of the patch conductive film 15' is performed by wet etching using, as an etching solution, an aqueous solution containing phosphoric acid, nitric acid, and acetic acid, for example, to simultaneously pattern the MoN film and the Al film. In the case that the layered film (Cu/Ti) is formed as the patch conductive film 15' by layering Ti and Cu in this order, the patch conductive film 15' can be patterned by wet etching using, as an etching solution, an acid mixed aqueous solution, for example.

The patch conductive film 15' in the source-gate connection section formation region is removed in the process of patterning the patch conductive film 15'. Since the source bus line upper connection section 13sg is formed within the contact hole CH_sg1 and within the contact hole CH_sg2, damage by etching to the source lower connection wiring line 3sg and/or source bus line connection section 7sg is reduced in the process of patterning the patch conductive film 15'.

Here, a portion of the source lower connection wiring line 3sg exposed by the contact hole CH_sg1 is covered by the source bus line upper connection section 13sg, and a portion of the source bus line connection section 7sg exposed by the contact hole CH_sg2 is covered by the source bus line upper connection section 13sg. This effectively reduces the etching damage to the source bus line connection section 7sg and/or source lower connection wiring line 3sg.

Next, as illustrated in FIG. 14(a), the second insulating film 17 is formed on the patch metal layer 151, on the lower conductive layer 13, and on the first insulating layer 11. For the purpose of simplification, the second insulating layer 17 and the second insulating film 17 are denoted by the same reference sign. The second insulating film 17 is formed by CVD, for example. As the second insulating film 17, a silicon oxide ($SiO_2$) film, a silicon nitride (SixNy) film, a silicon oxynitride (SiOxNy; x>y) film, a silicon nitride oxide (SiNxOy; x>y) film, or the like may be used as appropriate. Here, as the second insulating film 17, a silicon nitride (SixNy) film having a thickness of 100 nm, for example, is formed. The second insulating film 17 is formed to cover the patch metal layer 151.

Next, the second insulating film 17 is etched through a known photolithography process to from the second insulating layer 17 as illustrated in FIG. 14(b). Specifically, in the source terminal section formation region, the opening 17s that at least reaches the lower connection section 3s is formed. In the gate terminal section formation region, the opening 17g that at least reaches the lower connection section 3g is formed. In the CS terminal section formation region, the opening 17c that at least reaches the lower connection section 3c is formed. In the first transfer terminal section formation region, the opening 17p1 that at least reaches the conductive portion 15p1 is formed. In the second transfer terminal section formation region, the opening 17p2 that at least reaches the lower connection section 15p2 is formed.

Next, as illustrated in FIG. 15(a), an upper conductive film 19' is formed on the second insulating layer 17, within the opening 17s, within the opening 17g, within the opening 17c, within the opening 17p1, and within the opening 17p2, by sputtering, for example. The upper conductive film 19' includes a transparent conductive film, for example. An indium tin oxide (ITO) film, an IZO film, a zinc oxide (ZnO) film or the like can be used as the transparent conductive film. Here, an ITO film having a thickness of 70 nm, for example, is used as the upper conductive film 19'.

Next, the upper conductive film 19' is patterned to form the upper conductive layer 19 as illustrated in FIG. 15(b). Specifically, the upper connection section 19p1 connected to the conductive portion 15p1 within the opening 17p1 is formed in the first transfer terminal section formation region, and the upper connection section 19p2 connected to the lower connection section 15p2 within the opening 17p2 is formed in the second transfer terminal section formation region. This provides the antenna unit region U, the source-gate connection section SG, the source terminal section ST, the gate terminal section GT, the CS terminal section CT, the first transfer terminal section PT1, and the second transfer terminal section PT2.

In this manner, the TFT substrate 101A is manufactured.

Structure of Slot Substrate 201

Next, the structure of the slot substrate 201 will be described concretely with reference to FIG. 16(a) and FIG. 16(b).

Figure 16:
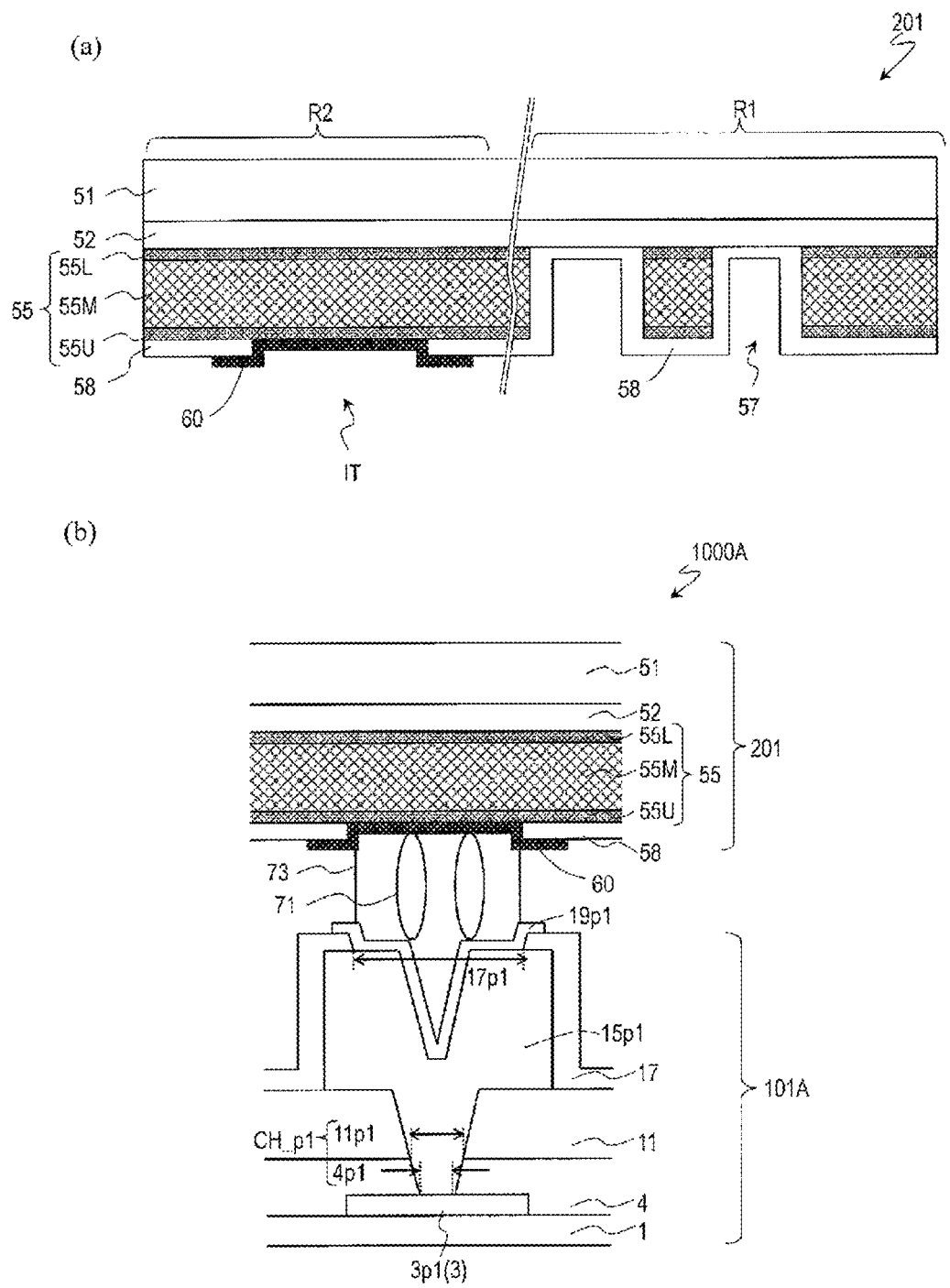
FIG. 16(a) is a cross-sectional view schematically illustrating the slot substrate 201.
FIG. 16(b) is a schematic cross-sectional view for illustrating a transfer section in the TFT substrate 101A and the slot substrate 201.

FIG. 16(a) is a cross-sectional view schematically illustrating the antenna unit region U and the terminal section IT in the slot substrate 201.

The slot substrate 201 includes the dielectric substrate 51 having a front surface and a rear surface, a third insulating layer 52 formed on the front surface of the dielectric substrate 51, the slot electrode 55 formed on the third insulating layer 52, and a fourth insulating layer 58 covering the slot electrode 55. The reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, such that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is formed by bonding an aluminum foil as the Al layer on the dielectric substrate 51 with an adhesive and patterning it, the problem of voids can be avoided.

The slot electrode 55 includes a main layer 55M such as a Cu layer or an Al layer. The slot electrode 55 may have a layered structure that includes the main layer 55M, as well as an upper layer 55U and a lower layer 55L disposed sandwiching the main layer 55M therebetween. A thickness of the main layer 55M may be set in consideration of the skin effect depending on the material, and may be, for example, greater than or equal to 2 μm and less than or equal to 30 μm.

The thickness of the main layer 55M is typically greater than the thickness of the upper layer 55U and the lower layer 55L.

In the illustrated example, the main layer 55M is a Cu layer, and the upper layer 55U and the lower layer 55L are Ti layers. By disposing the lower layer 55L between the main layer 55M and the third insulating layer 52, the adhesion between the slot electrode 55 and the third insulating layer 52 can be improved. In addition, by providing the upper layer 55U, corrosion of the main layer 55M (e.g., the Cu layer) can be suppressed.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by a cutting out process can be used as the reflective conductive plate 65.

The terminal section IT is provided in the non-transmission and/or reception region R2. The terminal section IT includes the slot electrode 55, the fourth insulating layer 58 covering the slot electrode 55, and an upper connection section 60. The fourth insulating layer 58 includes an opening that at least reaches the slot electrode 55. The upper connection section 60 is in contact with the slot electrode 55 within the opening. In the present embodiment, the terminal section IT is disposed in the seal region Rs, and is connected to the transfer terminal section on the TFT substrate (transfer section) by a seal resin containing conductive particles.

Transfer Section

FIG. 16(b) is a schematic cross-sectional view for illustrating the transfer section connecting the first transfer terminal section PT1 of the TFT substrate 101A and the terminal section IT of the slot substrate 201. In FIG. 16(b), the components similar to those in the foregoing figures are denoted by the same reference numerals.

In the transfer section, the upper connection section 60 of the terminal section IT is electrically connected to the first transfer terminal upper connection section 19p1 of the first transfer terminal section PT in the TFT substrate 101A. In the present embodiment, the upper connection section 60 is connected to the upper connection section 19p1 with a resin (sealing resin) 73 (also referred to as a sealing portion 73) including conductive beads 71 interposed therebetween.

Each of the upper connection sections 60 and 19p1 is a transparent conductive layer such as an ITO film or an IZO film, and there is a possibility that an oxide film is formed on the surface thereof. When an oxide film is formed, the electrical connection between the transparent conductive layers cannot be ensured, and the contact resistance may increase. In contrast, in the present embodiment, since these transparent conductive layers are bonded with a resin including conductive beads (for example, Au beads) 71 therebetween, even in a case where a surface oxide film is formed, the conductive beads pierce (penetrate) the surface oxide film, allowing an increase in contact resistance to be suppressed. The conductive beads 71 may penetrate not only the surface oxide film but also the upper connection sections 60 and 19p1 which are the transparent conductive layers, and directly contact the conductive portion 15p1 and the slot electrode 55.

The transfer section may be disposed at both a center portion and a peripheral portion of the scanning antenna 1000A (that is, inside and outside of the donut-shaped transmission and/or reception region R1 when viewed from the normal direction of the scanning antenna 1000A), or alternatively may be disposed at only one of them. The transfer section may be disposed in the seal region Rs in which the liquid crystals are sealed, or may be disposed outside the seal region Rs (opposite to the liquid crystal layer).

Manufacturing Method of Slot Substrate 201

The slot substrate 201 can be manufactured by the following method, for example.

First, the third insulating layer (having a thickness of 200 nm, for example) 52 is formed on the dielectric substrate. A substrate such as a glass substrate or a resin substrate having a high transmittance to electromagnetic waves (the dielectric constant $\varepsilon_M$ and the dielectric loss tan $\delta_M$ are small) can be used as the dielectric substrate. The dielectric substrate is preferably thin in order to suppress the attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 μm or less, for example.

When a resin substrate is used as the dielectric substrate, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separated from the glass substrate. Generally, the dielectric constant $\varepsilon_M$ and the dielectric loss tan $\delta_M$ of resin are smaller than those of glass. The thickness of the resin substrate is, for example, from 3 μm to 300 μm. Besides polyimide, for example, a liquid crystal polymer can also be used as the resin material.

The third insulating layer 52 is not particularly limited to a specific film, and, for example, a silicon oxide ($SiO_2$) film, a silicon nitride (SiNx) film, a silicon oxynitride (SiOxNy; x>y) film, a silicon nitride oxide (SiNxOy; x>y) film, or the like can be used as appropriate.

Next, a metal film is formed on the third insulating layer 52, and this is patterned to obtain the slot electrode 55 including the plurality of slots 57. As the metal film, a Cu film (or Al film) having a thickness of from 2 μm to 5 μm may be used. Here, as the metal film, a layered film formed by layering a Ti (having a thickness of 20 nm, for example) and a Cu (having a thickness of 3000 nm, for example) in this order is used. Note that a layered film may be formed by layering a Ti film, a Cu film, and a Ti film in this order.

After that, the fourth insulating layer (having a thickness of 100 nm or 200 nm, for example) 58 is formed on the slot electrode 55 and within the slot 57. The material of the fourth insulating layer 58 may be the same as the material of the third insulating layer. Subsequently, in the non-transmission and/or reception region R2, an opening that at least reaches the slot electrode 55 is formed in the fourth insulating layer 58.

Next, a transparent conductive film is formed on the fourth insulating layer 58 and within the opening of the fourth insulating layer 58, and is patterned to form the upper connection section 60 in contact with the slot electrode 55 within the opening. In this way, the terminal section IT is obtained.

Material and Structure of TFT 10

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer has a dual-layer structure including an upper layer and a lower layer, an energy gap of the oxide semiconductor included in the upper layer is preferably greater than an energy gap of the oxide semiconductor included in the lower layer. However, when a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O based semiconductor.

The In—Ga—Zn—O based semiconductor may be an amorphous semiconductor, or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a driving circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIG. 3, the TFT 10 is a channel etch type TFT having a bottom gate structure. The "channel etch type TFT" does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

Modification Example 1

Figure 17:
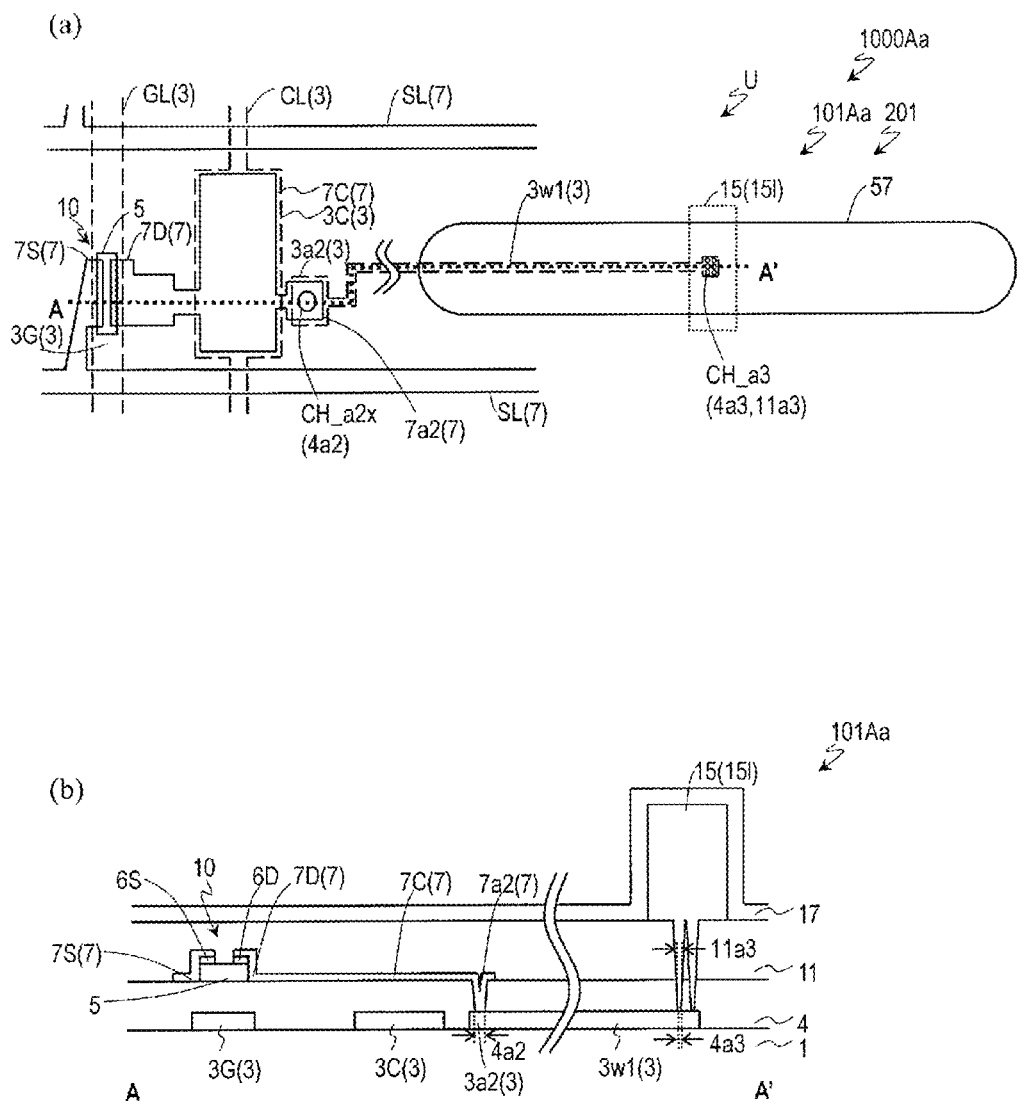
FIG. 17(a) is a schematic plan view of an antenna unit region U in a transmission and/or reception region R1 of a scanning antenna 1000Aa according to Modification Example 1 of the first embodiment.
FIG. 17(b) is a schematic cross-sectional view of a TFT substrate 101Aa along a line A-A' in FIG. 17(a).

A scanning antenna 1000Aa and a TFT substrate 101Aa included in the scanning antenna 1000Aa in Modification Example 1 of the present embodiment will be described with reference to FIG. 17. The constitutions common to the scanning antenna 1000A and the TFT substrate 101A are denoted by the same reference signs and the descriptions thereof are omitted.

Structure of TFT Substrate 101Aa

FIG. 17(a) is a schematic plan view of an antenna unit region U in a transmission and/or reception region R1 of the scanning antenna 1000Aa, and FIG. 17(b) is a schematic cross-sectional view of the TFT substrate 101Aa along a line A-A' in FIG. 17(a).

As illustrated in FIG. 17(a) and FIG. 17(b), the TFT substrate 101Aa included in the scanning antenna 1000Aa differs from the TFT substrate 101A included in the scanning antenna 1000A in that the TFT substrate 101Aa does not have the connection sections 15a1 and 15a2.

The source metal layer 7 of the TFT substrate 101Aa further includes a connection section 7a2 that is electrically connected to the drain electrode 7D and overlaps with the connection section 3a2 when viewed from the normal direction of the dielectric substrate 1. The connection section 7a2 is formed on the gate insulating layer 4 and within the opening 4a2 formed in the gate insulating layer 4, and is connected to the connection section 3a2 within the opening 4a2. For example, here, the connection section 7a2 is in contact with the connection section 3a2 within the opening 4a2. The opening 4a2 formed in the gate insulating layer 4 may be referred to as a contact hole CH_a2x. In this example, the connection section 7a2 extends from the upper auxiliary capacitance electrode 7C formed integrally with the drain electrode 7D.

In the TFT substrate 101Aa, the drain electrode 7D is electrically connected to the patch electrode 15 through the upper auxiliary capacitance electrode 7C, the connection sections 7a2 and 3a2, and the wiring line 3w1. The patch drain connection section included in the TFT substrate 101Aa includes the upper auxiliary capacitance electrode 7C, the connection sections 7a2 and 3a2, and the wiring line 3w1.

In the scanning antenna 1000Aa having such a structure also, the same effect as in the scanning antenna 1000A can be obtained.

The structure of the non-transmission and/or reception region R2 of the scanning antenna 1000Aa is not illustrated, but is the same as the scanning antenna 1000A, for example.

Manufacturing Method of TFT Substrate 101Aa

Figure 18:
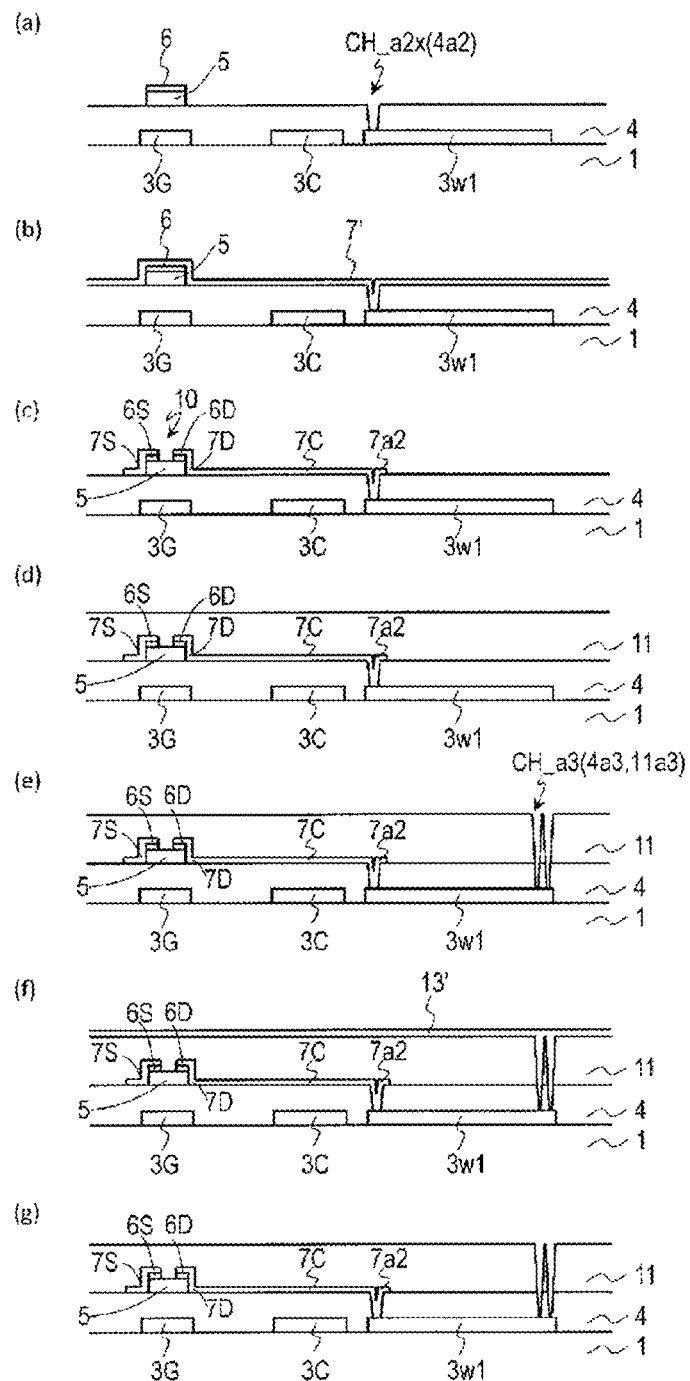
FIGS. 18(a) to 18(g) are process cross-sectional views illustrating an example of a manufacturing method of the TFT substrate 101Aa.
Figure 19:
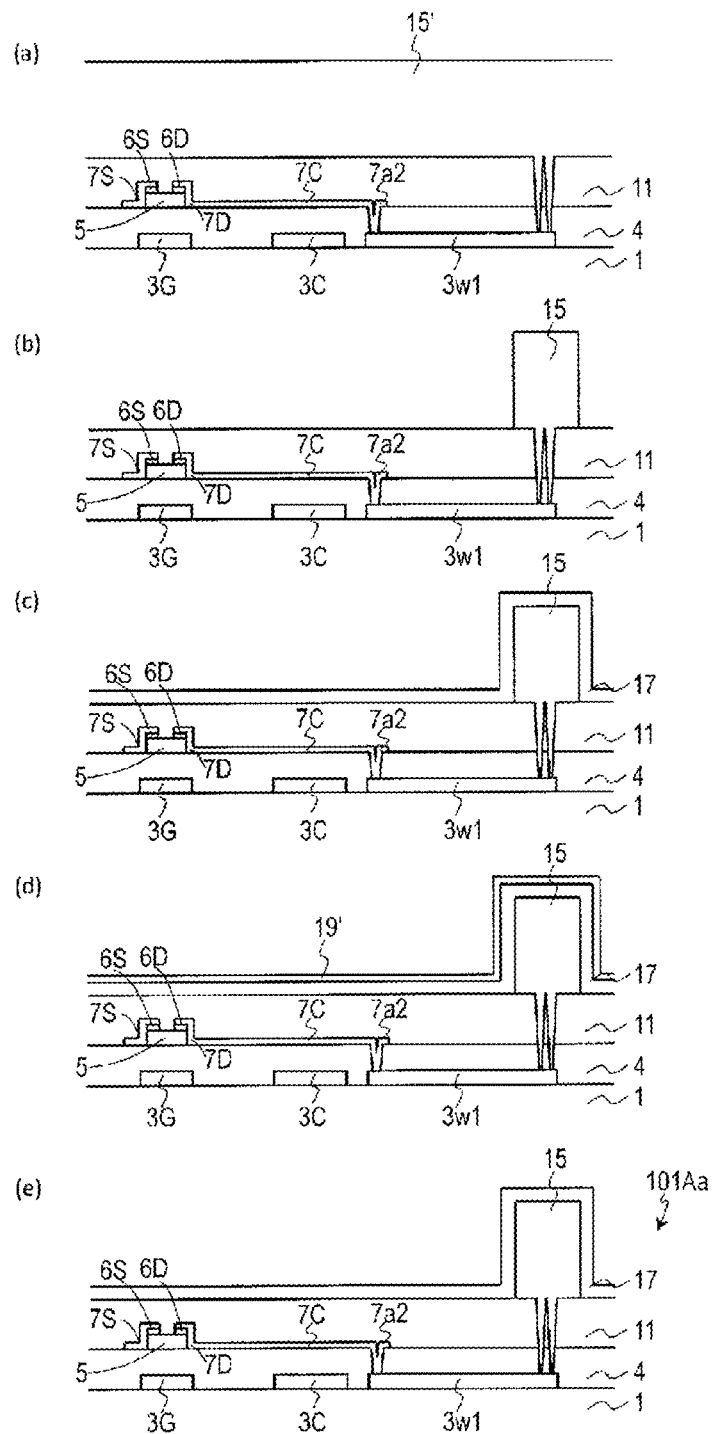
FIGS. 19(a) to 19(e) are process cross-sectional views illustrating an example of the manufacturing method of the TFT substrate 101Aa.

A description is given of a manufacturing method of the TFT substrate 101Aa with reference to FIG. 18 and FIG. 19.

FIGS. 18(A) to 18(g) and FIGS. 19(a) to 19(e) are process cross-sectional views illustrating an example of the manufacturing method of the TFT substrate 101Aa. These drawings illustrate cross sections corresponding to FIG. 17(b) (the cross section along a line A-A' of the TFT substrate 101Aa). Illustration and description of the cross section of the non-transmission and/or reception region R2 of the TFT substrate 101Aa are omitted. The following description mainly describes differences from the manufacturing method of the TFT substrate 101A described referring to FIG. 11 to FIG. 15.

First, as illustrated in FIGS. 11(a) to 11(d), the gate metal layer 3, the gate insulating film 4, the island-shaped semiconductor layer 5, and the contact layer 6 are formed on the dielectric substrate 1.

Subsequently, as illustrated in FIG. 18(a), the gate insulating film 4 is etched through a known photolithography process, which differs from the manufacturing method of the TFT substrate 101A. This allows the opening 4a2 that at least reaches the connection section 3a2 to be formed.

Next, as illustrated in FIG. 18(b), a source conductive film 7' is formed on the gate insulating film 4, within the opening 4a2, and on the contact layer 6.

Next, the source conductive film 7' is patterned to form the source metal layer 7 as illustrated in FIG. 18(c). Here, a difference from the manufacturing method of the TFT substrate 101A is in that the connection section 7a2 connected to the connection section 3a2 within the opening 4a2 is further formed.

Next, as illustrated in FIG. 18(d), the first insulating film 11 is formed to cover the TFT 10 and the source metal layer 7.

Next, as illustrated in FIG. 18(e), the first insulating film 11 and the gate insulating film 4 are etched through a known photolithography process to form the first insulating layer 11 and gate insulating layer 4. Here, in the antenna unit formation region, the contact hole CH_a3 that at least reaches the wiring line 3w1 is formed in the gate insulating film 4 and the first insulating film 11.

Next, as illustrated in FIG. 18(f), a lower conductive film 13' is formed on the first insulating film 11 and within the contact hole CH_a3.

Next, the lower conductive film 13' is patterned to form the lower conductive layer 13. As illustrated in FIG. 18(g), the conductive portion included in the lower conductive layer 13 is not formed in the antenna unit formation region.

Next, as illustrated in FIG. 19(a), a patch conductive film 15' is formed on the lower conductive layer 13 and on the first insulating layer 11.

Next, the patch conductive film 15' is patterned to form the patch metal layer 151 as illustrated in FIG. 19(b). This allows the patch electrode 15 to be formed in the antenna unit formation region.

Next, as illustrated in FIG. 19(c), the second insulating film 17 is formed on the patch metal layer 151, on the lower conductive layer 13, and on the first insulating layer 11, and then, the second insulating film 17 is etched through a known photolithography process to form the second insulating layer 17. As illustrated in FIG. 19(c), in the antenna unit formation region, the opening is not formed in the second insulating film 17.

Next, as illustrated in FIG. 19(d), an upper conductive film 19' is formed on the second insulating layer 17.

Next, the upper conductive film 19' is patterned to form the upper conductive layer 19. As illustrated in FIG. 19(e), the conductive portion included in the upper conductive layer 19 is not formed in the antenna unit formation region.

In this manner, the TFT substrate 101Aa is manufactured.

Modification Example 2

Figure 20:
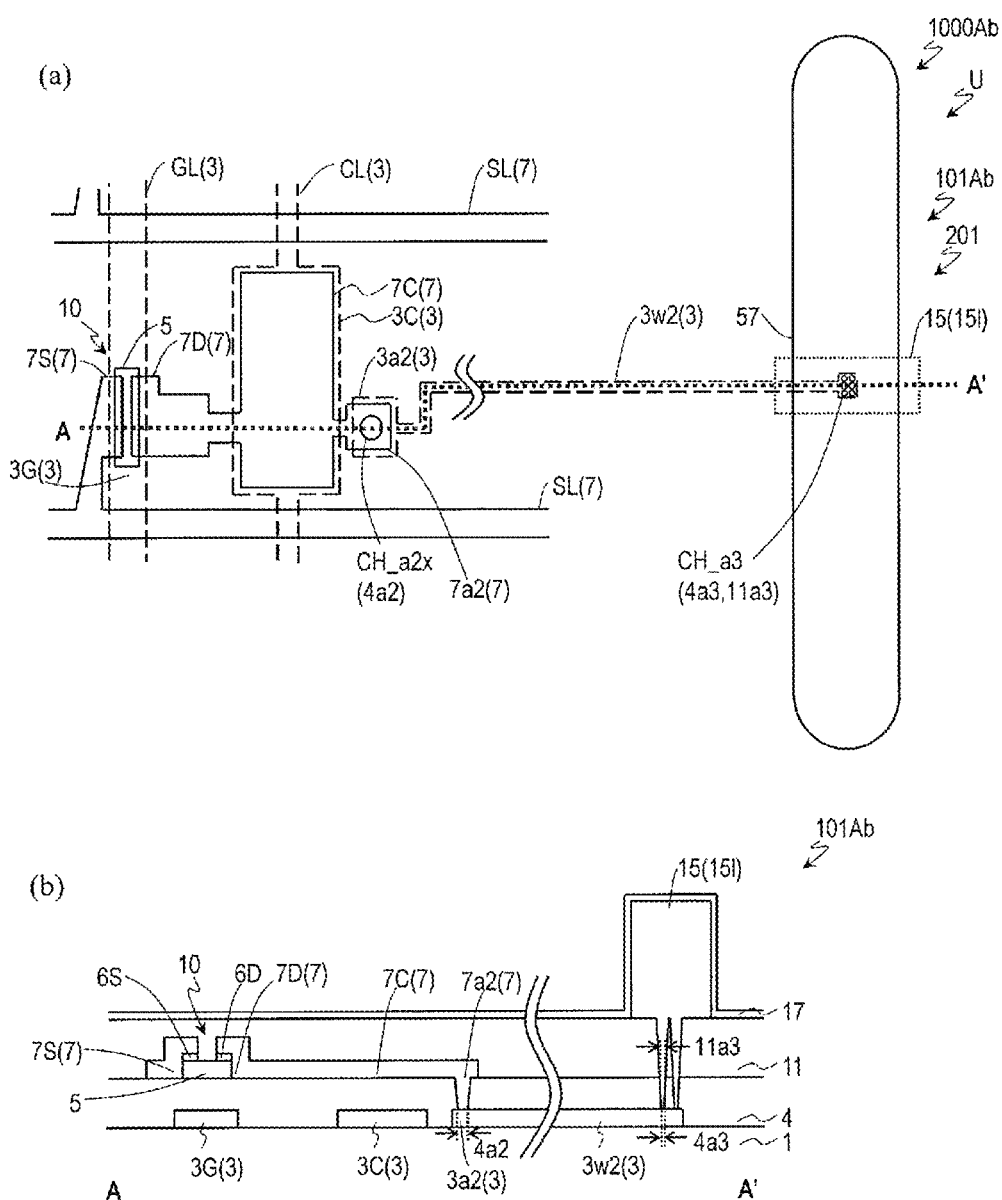
FIG. 20(a) is a schematic plan view of an antenna unit region U in a transmission and/or reception region R1 of a scanning antenna 1000Ab according to Modification Example 2 of the first embodiment.
FIG. 20(b) is a schematic cross-sectional view of a TFT substrate 101Ab along a line A-A' in FIG. 20(a).

A scanning antenna 1000Ab and a TFT substrate 101Ab included in the scanning antenna 1000Ab in Modification Example 2 of the present embodiment will be described with reference to FIG. 20 to FIG. 22. The constitutions common to the scanning antenna 1000Aa and the TFT substrate 101Aa are denoted by the same reference signs and the descriptions thereof are omitted.

Structure of TFT Substrate 101Ab

FIG. 20(a) is a schematic plan view of an antenna unit region U in a transmission and/or reception region R1 of the scanning antenna 1000Ab, and FIG. 20(b) is a schematic cross-sectional view of the TFT substrate 101Ab along a line A-A' in FIG. 20(a).

As illustrated in FIG. 20(a) and FIG. 20(b), a wiring line 3w2 included in the TFT substrate 101Ab differs from the wiring line 3w1 included in the TFT substrate 101Aa in that the wiring line 3w2 extends in the short axis direction of the slot 57 when viewed from the normal direction of the TFT substrate 101Ab and the slot substrate 201.

In the TFT substrate 101Ab, the drain electrode 7D is electrically connected to the patch electrode 15 through the upper auxiliary capacitance electrode 7C, the connection sections 7a2 and 3a2, and the wiring line 3w2. The patch drain connection section included in the TFT substrate 101Ab includes the upper auxiliary capacitance electrode 7C, the connection sections 7a2 and 3a2, and the wiring line 3w2.

In the scanning antenna 1000Ab having such a structure also, the same effect as in the scanning antenna 1000A can be obtained.

As described above with reference to FIG. 6 and FIG. 7, the scanning antenna 1002R in Reference Example 2 including the wiring line 15w2 that is included in the patch metal layer 151 and extends in the short axis direction of the slot 57 is inferior in the antenna performance compared to the scanning antenna 1001R in Reference Example 1 including the wiring line 15w1 that is included in the patch metal layer 151 and extends in the long axis direction of the slot 57. In contrast, the scanning antenna according to the embodiment of the disclosure may include the wiring line 3w1 extending in the long axis direction of the slot 57 as in the scanning antenna 1000A illustrated in FIG. 3, or may include the wiring line 3w2 extending in the short axis direction of the slot 57 as in the scanning antenna 1000Ab illustrated in FIG. 20. Both scanning antennas are on a par with each other in having the excellent antenna performance.

Figure 21:
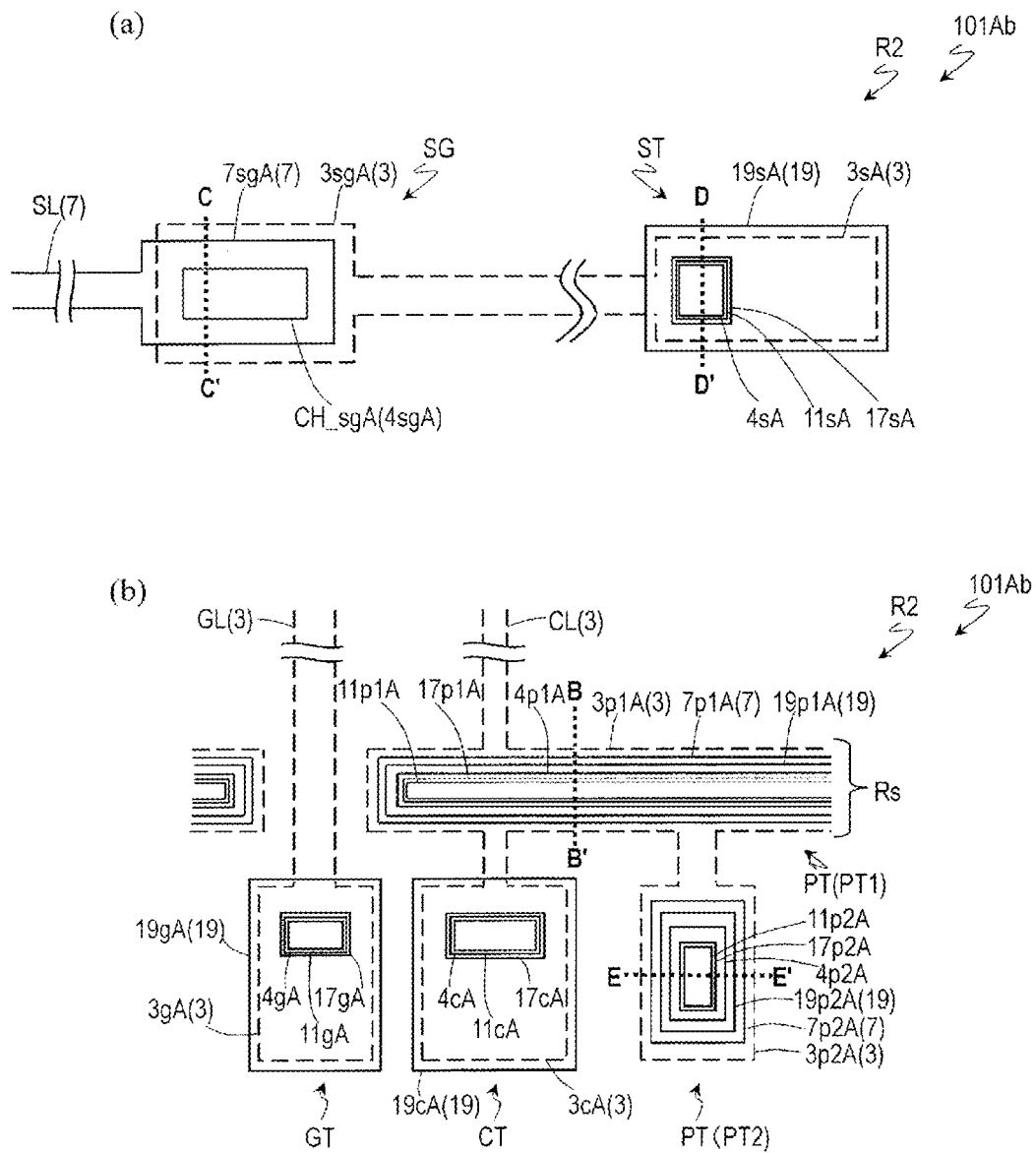
FIGS. 21(a) and 21(b) are schematic plan views of a non-transmission and/or reception region R2 of the TFT substrate 101Ab.
Figure 22:
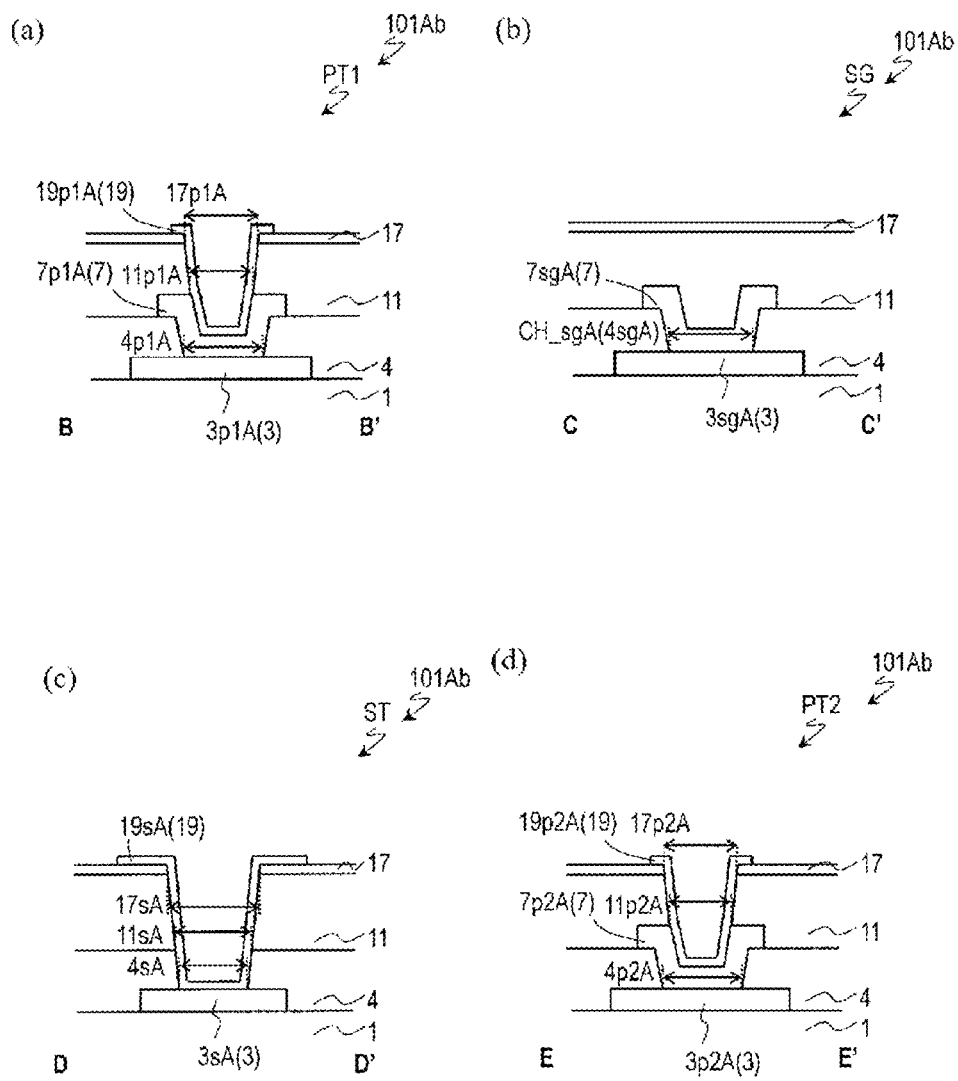
FIGS. 22(a) to 22(d) are schematic cross-sectional views of the non-transmission and/or reception region R2 of the TFT substrate 101Ab.
Figure 23:
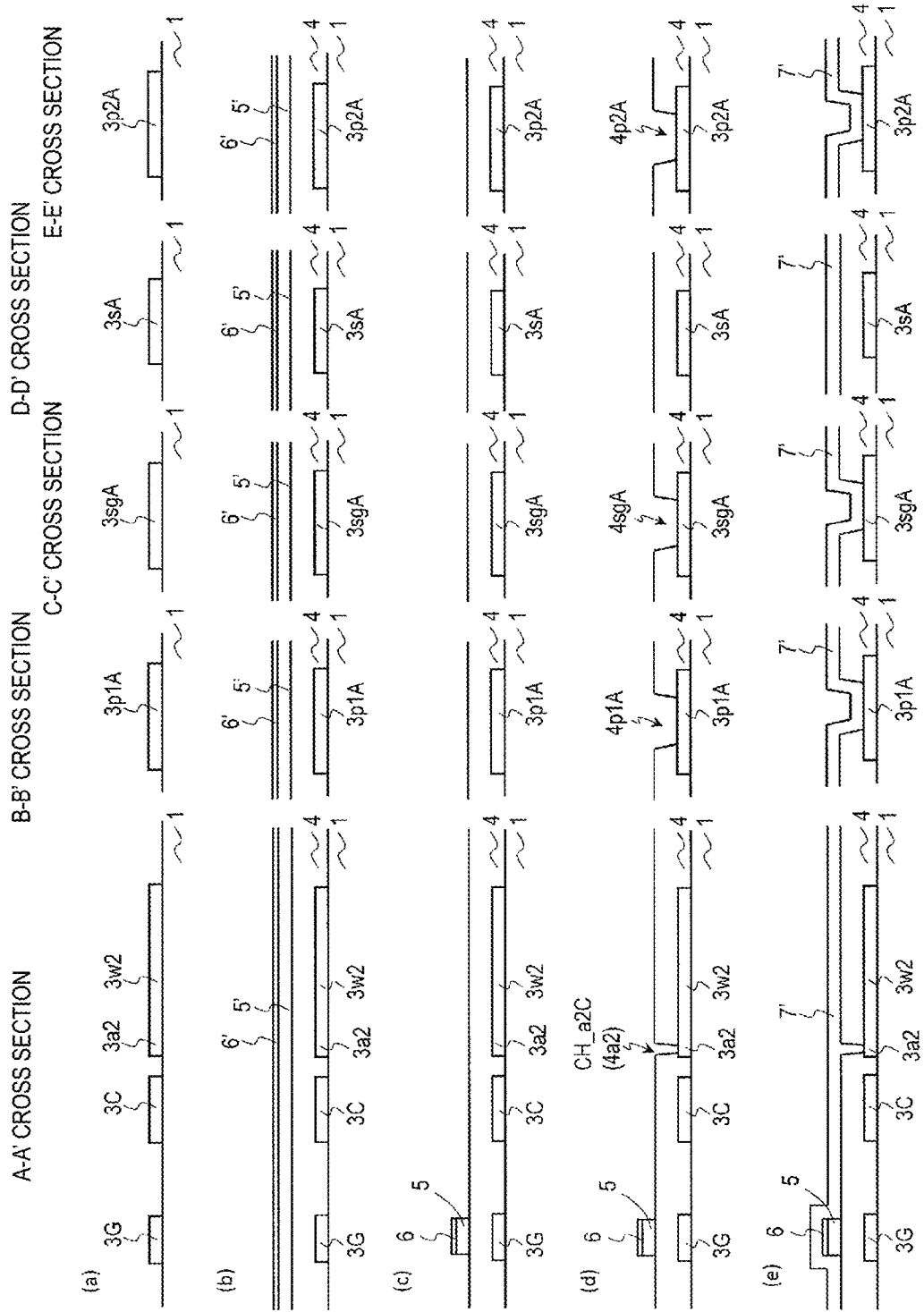
FIGS. 23(a) to 23(e) are process cross-sectional views illustrating an example of a manufacturing method of the TFT substrate 101Ab.
Figure 24:
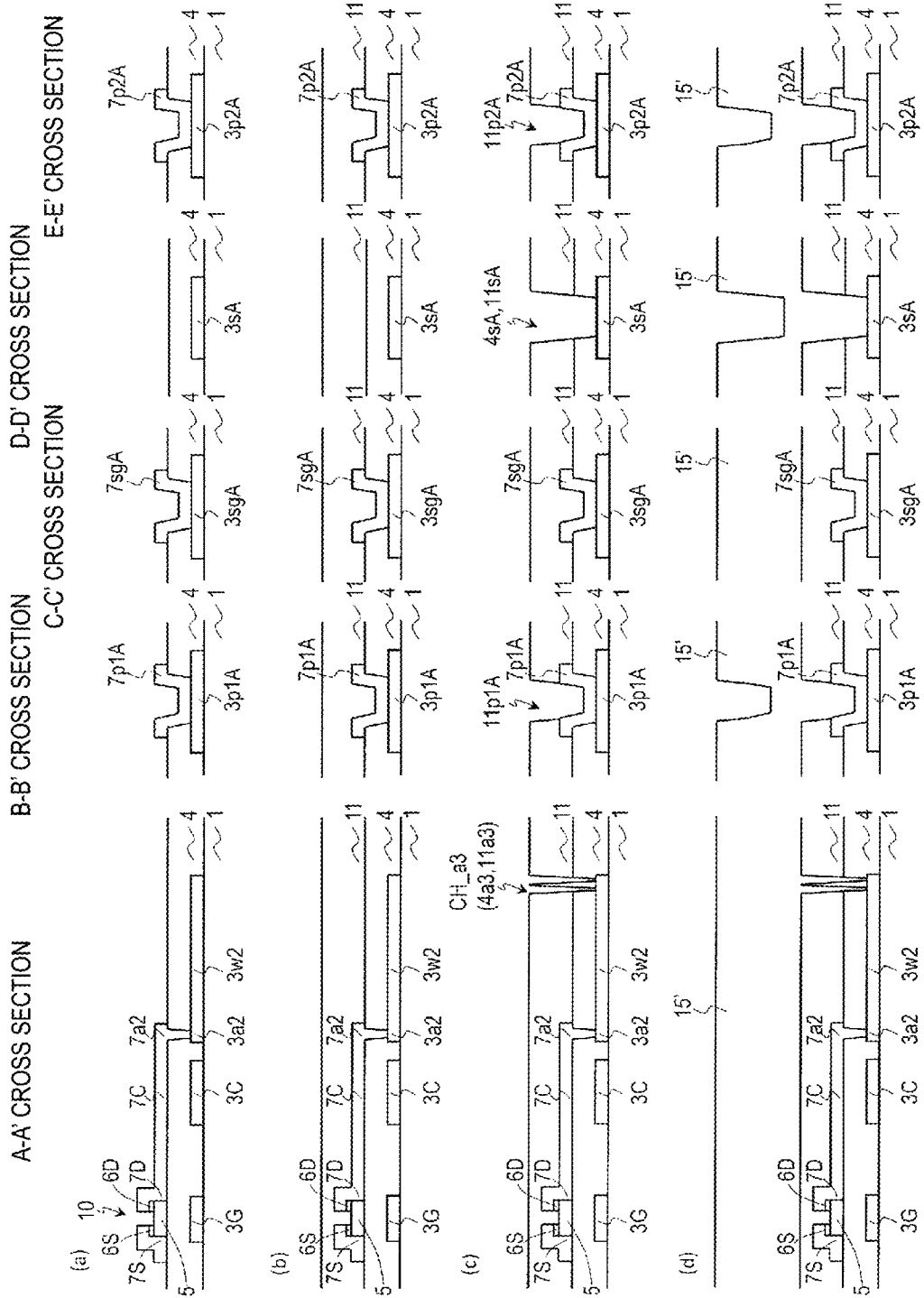
FIGS. 24(a) to 24(d) are process cross-sectional views illustrating an example of the manufacturing method of the TFT substrate 101Ab.
Figure 25:
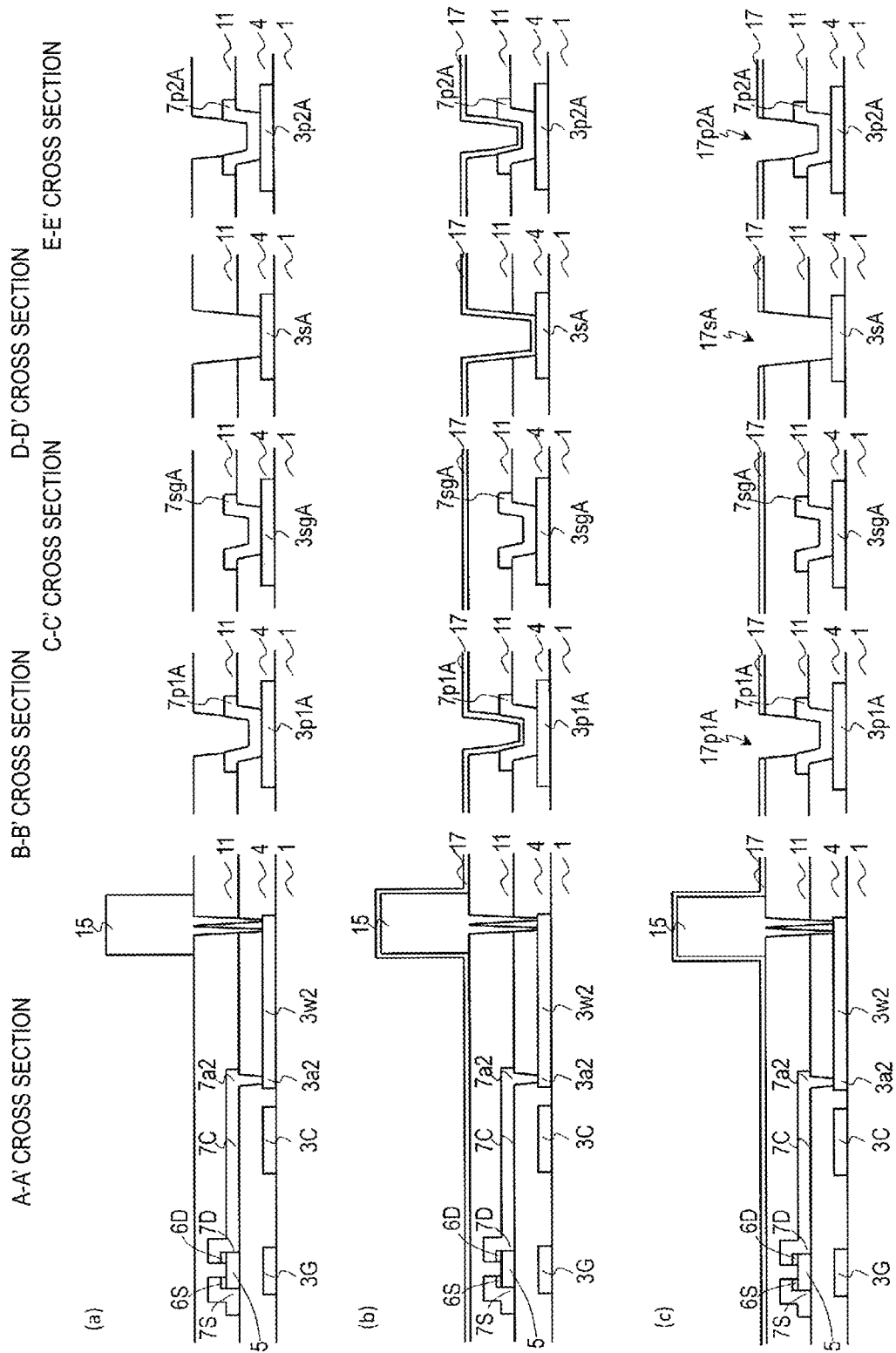
FIGS. 25(a) to 25(c) are process cross-sectional views illustrating an example of the manufacturing method of the TFT substrate 101Ab.
Figure 26:
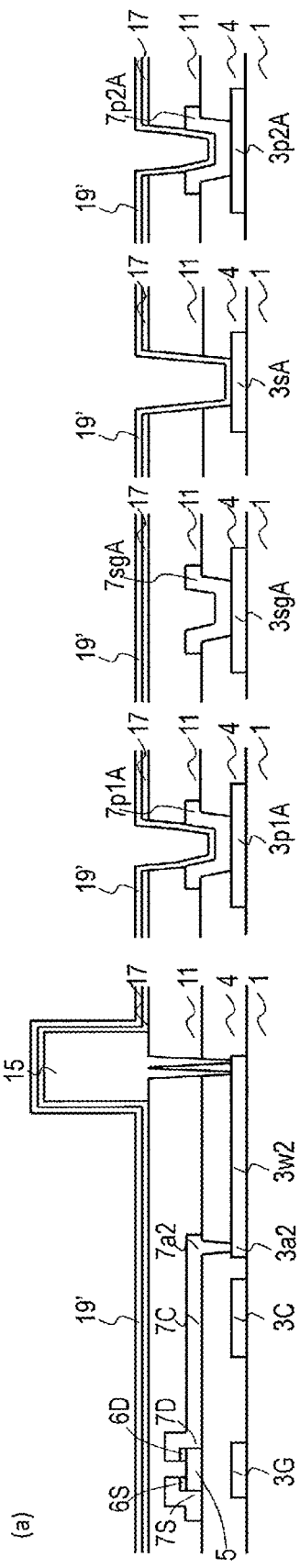
FIGS. 26(a) and 26(b) are process cross-sectional views illustrating an example of the manufacturing method of the TFT substrate 101Ab.
Figure 26:
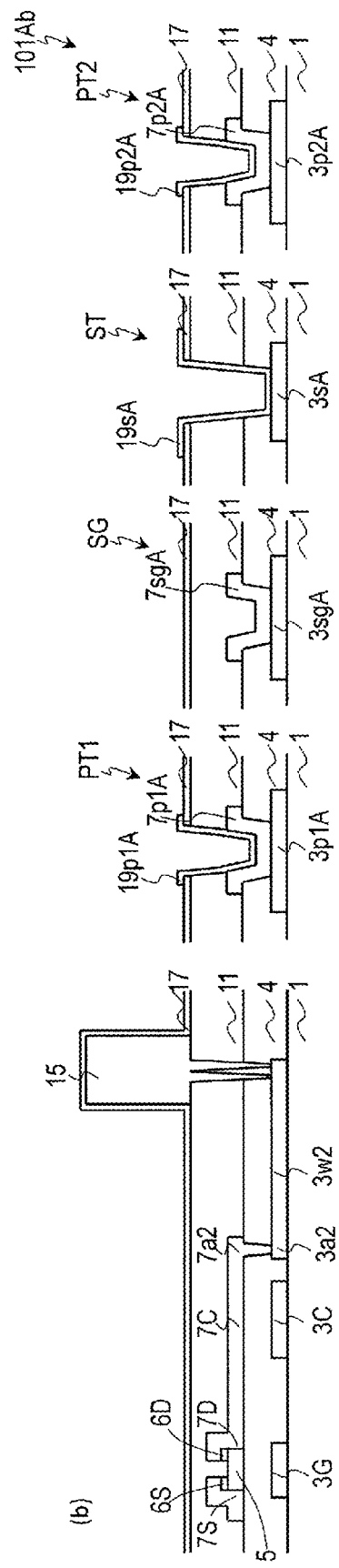

As illustrated in FIG. 21 and FIG. 22, the scanning antenna 1000Ab differs from the scanning antenna 1000Aa also in the structure of the non-transmission and/or reception region R2. In this example, the TFT substrate 101Ab does not include the lower conductive layer 13. Since the TFT substrate 101Ab having the illustrated structure can omit the lower conductive layer 13, the number of manufacturing processes and the manufacturing cost can be reduced as compared with the TFT substrate 101Aa. However, the structure of the non-transmission and/or reception region R2 of the scanning antenna 1000Ab is not limited to the illustrated example.

FIG. 21(a) and FIG. 21(b) are schematic plan views of the non-transmission and/or reception region R2 of the TFT substrate 101Ab, and FIGS. 22(a) to 22(d) are schematic cross-sectional views of the non-transmission and/or reception region R2 of the TFT substrate 101Ab. FIG. 21(a) illustrates the source-gate connection section SG and the source terminal section ST provided in the non-transmission and/or reception region R2, and FIG. 21(b) illustrates the transfer terminal section PT, the gate terminal section GT, and the CS terminal section CT provided in the non-transmission and/or reception region R2. FIG. 22(a) illustrates a cross-section of the first transfer terminal section PT1 along a line B-B' in FIG. 21(b), FIG. 22(b) illustrates a cross-section of the source-gate connection section SG along a line C-C' in FIG. 21(a), FIG. 22(c) illustrates a cross-section of the source terminal section ST along a line D-D' in FIG. 21(a), and FIG. 22(d) illustrates a cross-section of the second transfer terminal section PT2 along a line E-E' in FIG. 21(b).

Source-Gate Connection Section SG

As illustrated in FIG. 21(a) and FIG. 22(b), the source-gate connection section SG of the TFT substrate 101Ab includes a source lower connection wiring line 3sgA, an opening 4sgA formed in the gate insulating layer 4, and a source bus line connection section 7sgA.

The source lower connection wiring line 3sgA is included in the gate metal layer 3. The source lower connection wiring line 3sgA is electrically separate from the gate bus line GL.

The opening 4sgA formed in the gate insulating layer 4 at least reaches the source lower connection wiring line 3sgA. The opening 4sgA may be referred to as a contact hole CH_sgA.

The source bus line connection section 7sgA is included in the source metal layer 7 and electrically connected to the source bus line SL. In this example, the source bus line connection section 7sgA extends from the source bus line SL and is formed integrally with the source bus line SL. Furthermore, the source bus line connection section 7sgA is formed on the gate insulating layer 4 and within the contact hole CH_sgA, and is connected to the source lower connection wiring line 3sgA within the contact hole CH_sgA. In this example, the source bus line connection section 7sgA is in contact with the source lower connection wiring line 3sgA within the contact hole CH_sgA.

In this example, the source-gate connection section SG does not include the conductive portion included in the patch metal layer 151 and the conductive portion included in the upper conductive layer 19. The source-gate connection section SG does not include the opening formed in the first insulating layer 11.

By including the source-gate connection section SG having such a structure also, the same effect as in the scanning antenna 1000A can be obtained. Specifically, in the scanning antenna 1000Ab also, damages to the gate metal layer 3 and/or source metal layer 7 in the process of etching the patch conductive film for forming the patch metal layer 151 are reduced. This is because the source-gate connection section SG of the scanning antenna 1000Ab does not include the opening formed in the first insulating layer 11, and therefore, in the process of patterning the patch conductive film, the gate metal layer 3 and the source metal layer 7 are covered with the first insulating layer 11 and are not exposed. Therefore, the scanning antenna 1000Ab has excellent actional stability. The manufacturing method of the TFT substrate 101Ab is described later in detail.

Source Terminal Section ST

As illustrated in FIG. 21(a) and FIG. 22(c), the source terminal section ST of the TFT substrate 101Ab includes a source terminal lower connection section 3sA (also simply referred to as a "lower connection section 3sA") connected to the source lower connection wiring line 3sgA formed in the source-gate connection section SG, an opening 4sA formed in the gate insulating layer 4, an opening 11sA formed in the first insulating layer 11, an opening 17sA formed in the second insulating layer 17, and a source terminal upper connection section 19sA (also simply referred to as an "upper connection section 19sA").

The lower connection section 3sA is included in the gate metal layer 3. The lower connection section 3sA is electrically connected to the source lower connection wiring line 3sgA formed in the source-gate connection section SG. In this example, the lower connection section 3sA extends from the source lower connection wiring line 3sgA and is formed integrally with the source lower connection wiring line 3sgA.

The opening 4sA formed in the gate insulating layer 4 at least reaches the lower connection section 3sA.

The opening 11sA formed in the first insulating layer 11 overlaps the opening 4sA formed in the gate insulating layer 4 when viewed from the normal direction of the dielectric substrate 1.

The opening 17sA formed in the second insulating layer 17 overlaps the opening 11sA formed in the first insulating layer 11 when viewed from the normal direction of the dielectric substrate 1.

The upper connection section 19sA is included in the upper conductive layer 19. The upper connection section 19sA is formed on the second insulating layer 17 and within the opening 4sA formed in the gate insulating layer 4, and is connected to the lower connection section 3sA within the opening 4sA formed in the gate insulating layer 4. Here, the upper connection section 19sA is in contact with the lower connection section 3sA within the opening 4sA formed in the gate insulating layer 4.

An entire of the upper connection section 19sA may overlap the lower connection section 3sA when viewed from the normal direction of the dielectric substrate 1.

In this example, the source terminal section ST does not include the conductive portion included in the source metal layer 7 and the conductive portion included in the patch metal layer 151.

The source terminal section ST of the TFT substrate 101Ab, which includes the lower connection section 3sA included in the gate metal layer 3, has excellent reliability similarly to the TFT substrate 101A.

Gate Terminal Section GT

As illustrated in FIG. 21(b), the gate terminal section GT of the TFT substrate 101Ab includes a gate terminal lower connection section 3gA (also simply referred to as a "lower connection section 3gA"), an opening 4gA formed in the gate insulating layer 4, an opening 11gA formed in the first insulating layer 11, an opening 17gA formed in the second insulating layer 17, and a gate terminal upper connection section 19gA (also simply referred to as an "upper connection section 19gA").

The lower connection section 3gA is included in the gate metal layer 3 and electrically connected to the gate bus line GL. In this example, the lower connection section 3gA extends from the gate bus line GL and is formed integrally with the gate bus line GL.

The opening 4gA formed in the gate insulating layer 4 at least reaches the lower connection section 3gA.

The opening 11gA formed in the first insulating layer 11 overlaps the opening 4gA formed in the gate insulating layer 4 when viewed from the normal direction of the dielectric substrate 1.

The opening 17gA formed in the second insulating layer 17 overlaps the opening 11gA formed in the first insulating layer 11 when viewed from the normal direction of the dielectric substrate 1.

The upper connection section 19gA is included in the upper conductive layer 19. The upper connection section 19gA is formed on the second insulating layer 17 and within the opening 4gA formed in the gate insulating layer 4, and is connected to the lower connection section 3gA within the opening 4gA. For example, the upper connection section 19gA is in contact with the lower connection section 3gA within the opening 4gA.

An entire of the upper connection section 19gA may overlap the lower connection section 3gA when viewed from the normal direction of the dielectric substrate 1.

In this example, the gate terminal section GT does not include the conductive portion included in the source metal layer 7 and the conductive portion included in the patch metal layer 151.

The gate terminal section GT, which includes the lower connection section 3gA included in the gate metal layer 3, has excellent reliability similarly to the source terminal section ST.

CS Terminal Section CT

As illustrated in FIG. 21(b), the CS terminal section CT of the TFT substrate 101Ab includes a CS terminal lower connection section 3cA (also simply referred to as a "lower connection section 3cA"), an opening 4cA formed in the gate insulating layer 4, an opening 11cA formed in the first insulating layer 11, an opening 17cA formed in the second insulating layer 17, and a CS terminal upper connection section 19cA (also simply referred to as an "upper connection section 19cA").

The lower connection section 3cA is included in the gate metal layer 3. The lower connection section 3cA is electrically connected to the CS bus line CL. In this example, the lower connection section 3cA extends from the CS bus line CL and is formed integrally with the CS bus line CL.

The opening 4cA formed in the gate insulating layer 4 at least reaches the lower connection section 3cA.

The opening 11cA formed in the first insulating layer 11 overlaps the opening 4cA formed in the gate insulating layer 4 when viewed from the normal direction of the dielectric substrate 1.

The opening 17cA formed in the second insulating layer 17 overlaps the opening 11cA formed in the first insulating layer 11 when viewed from the normal direction of the dielectric substrate 1.

The upper connection section 19cA is included in the upper conductive layer 19. The upper connection section 19cA is formed on the second insulating layer 17 and within the opening 4cA formed in the gate insulating layer 4, and is connected to the lower connection section 3cA within the opening 4cA. For example, the upper connection section 19cA is in contact with the lower connection section 3cA within the opening 4cA.

An entire of the upper connection section 19cA may overlap the lower connection section 3cA when viewed from the normal direction of the dielectric substrate 1.

In this example, the CS terminal section CT does not include the conductive portion included in the source metal layer 7 and the conductive portion included in the patch metal layer 151.

The CS terminal section CT, which includes the lower connection section 3cA included in the gate metal layer 3, has excellent reliability similarly to the source terminal section ST.

Transfer Terminal Section PT

As illustrated in FIG. 21(b) and FIG. 22(a), the first transfer terminal section PT1 includes a first transfer terminal lower connection section 3p1A (also simply referred to as a "lower connection section 3p1A"), an opening 4p1A formed in the gate insulating layer 4, a first transfer terminal conductive portion 7p1A (also simply referred to as a "conductive portion 7p1A"), an opening 11p1A formed in the first insulating layer 11, an opening 17p1A formed in the second insulating layer 17, and a first transfer terminal upper connection section 19p1A (also simply referred to as an "upper connection section 19p1A").

The lower connection section 3p1A is included in the gate metal layer 3. The lower connection section 3p1A is electrically separate from the gate bus line GL. For example, in a case where the CS bus line CL is supplied with the same voltage as the slot voltage, the lower connection section 3p1A is electrically connected to, for example, the CS bus line CL. As is illustrated, the lower connection section 3p1A may extend from the CS bus line. However, the lower connection section 3p1A is not limited to the illustrated example and may be electrically separate from the CS bus line.

The opening 4p1A formed in the gate insulating layer 4 at least reaches the lower connection section 3p1A.

The conductive portion 7p1A is included in the source metal layer 7. The conductive portion 7p1A is formed on the gate insulating layer 4 and within the opening 4p1A formed in the gate insulating layer 4, and is connected to the lower connection section 3p1A within the opening 4p1A. Here, the conductive portion 7p1A is in contact with the lower connection section 3p1A within the opening 4p1A.

The opening 11p1A formed in the first insulating layer 11 at least reaches the conductive portion 7p1A.

The opening 17p1A formed in the second insulating layer 17 overlaps the opening 11p1A formed in the first insulating layer 11 when viewed from the normal direction of the dielectric substrate 1.

The upper connection section 19p1A is included in the upper conductive layer 19. The upper connection section 19p1A is formed on the second insulating layer 17 and within the opening 11p1A formed in the first insulating layer 11, and is connected to the conductive portion 7p1A within the opening 11p1A. Here, the upper connection section 19p1A is in contact with the conductive portion 7p1A within the opening 11p1A.

In this example, the first transfer terminal section PT1 does not include the conductive portion included in the patch metal layer 151.

The first transfer terminal section PT1 includes the conductive portion 7p1A between the lower connection section 3p1A and the upper connection section 19p1A. This allows the first transfer terminal section PT1 to have an advantage that an electric resistance between the lower connection section 3p1A and the upper connection section 19p1A is low.

An entire of the upper connection section 19p1A may overlap the conductive portion 7p1A when viewed from the normal direction of the dielectric substrate 1. An entire of the upper connection section 19p1A may overlap the lower connection section 3p1A when viewed from the normal direction of the dielectric substrate 1.

As illustrated in FIG. 21(b) and FIG. 22(d), the second transfer terminal section PT2 of the TFT substrate 101Ab has a cross-section structure similar to the first transfer terminal section PT1, for example.

The second transfer terminal section PT2 includes a second transfer terminal lower connection section 3p2A (also simply referred to as a "lower connection section 3p2A"), an opening 4p2A formed in the gate insulating layer 4, a second transfer terminal conductive portion 7p2A (also simply referred to as "conductive portion 7p2A"), an opening 11p2A formed in the first insulating layer 11, an opening 17p2A formed in the second insulating layer 17, and a second transfer terminal upper connection section 19p2A (also simply referred to as an "upper connection section 19p2A").

The lower connection section 3p2A is included in the gate metal layer 3. The lower connection section 3p2A is electrically separate from the gate bus line GL. The lower connection section 3p2A is electrically connected to the CS bus line CL, for example. Here, the lower connection section 3p2A is formed integrally with the first transfer terminal lower connection section 3p1A.

The opening 4p2A formed in the gate insulating layer 4 at least reaches the lower connection section 3p2A.

The conductive portion 7p2A is included in the source metal layer 7. The conductive portion 7p2A is formed on the gate insulating layer 4 and within the opening 4p2A formed in the gate insulating layer 4, and is connected to the lower connection section 3p2A within the opening 4p2A. Here, the conductive portion 7p2A is in contact with the lower connection section 3p2A within the opening 4p2A.

The opening 11p2A formed in the first insulating layer 11 at least reaches the conductive portion 7p2A.

The opening 17p2A formed in the second insulating layer 17 overlaps the opening 11p2A formed in the first insulating layer 11 when viewed from the normal direction of the dielectric substrate 1.

The upper connection section 19p2A is included in the upper conductive layer 19. The upper connection section 19p2 is formed on the second insulating layer 17 and within the opening 11p2A formed in the first insulating layer 11, and is connected to the conductive portion 7p2A within the opening 11p2A. Here, the upper connection section 19p2A is in contact with the conductive portion 7p2A within the opening 11p2A.

In this example, the second transfer terminal section PT2 does not include the conductive portion included in the patch metal layer 151.

Manufacturing Method of TFT Substrate 101Ab

A description is given of a manufacturing method of the TFT substrate 101Ab with reference to FIG. 23 to FIG. 26.

FIGS. 23(a) to 23(e), FIGS. 24(a) to 24(d), FIGS. 25(a) to 25(c), and FIGS. 26(a) and 26(b) are process cross-sectional views illustrating an example of the manufacturing method of the TFT substrate 101Ab. Each of these drawings illustrates a cross section corresponding to FIG. 20(b) and FIGS. 22(a) to 22(d), (the cross sections along lines A-A' to E-E' of the TFT substrate 101Ab). The following description mainly describes differences from the manufacturing method of the TFT substrate 101Aa described referring to FIG. 18 and FIG. 19.

First, a gate conductive film 3' is formed on the dielectric substrate 1 as illustrated in FIG. 11(a).

Next, the gate conductive film 3' is patterned to obtain the gate metal layer 3 as illustrated in FIG. 23(a). Here, a difference from the manufacturing method of the TFT substrate 101Aa is in that the wiring line 3w2 is formed in the antenna unit formation region. Additionally, the source lower connection wiring line 3sgA is formed in the source-gate connection section formation region, and the lower connection sections 3sA, 3gA, 3cA, 3p1, and 3p2A are formed in the respective terminal section formation regions.

After that, as illustrated in FIG. 23(b), a gate insulating film 4, an intrinsic amorphous silicon film 5', and an n$^+$ type amorphous silicon film 6' are formed in this order to cover the gate metal layer 3.

Next, the intrinsic amorphous silicon film 5' and the n$^+$ type amorphous silicon film 6' are patterned to obtain the island-shaped semiconductor layer 5 and the contact layer 6 as illustrated in FIG. 23(c).

Subsequently, the gate insulating film 4 are etched through a known photolithography process as illustrated in FIG. 23(d). Here, a difference from the manufacturing method of the TFT substrate 101Aa is in that the opening 4sgA that at least reaches the source lower connection wiring line 3sgA is formed in the source-gate connection section formation region, the opening 4p1A that at least reaches the lower connection section 3p1A is formed in the first transfer terminal section formation region, the opening 4p2A that at least reaches the lower connection section 3p2A is formed in the second transfer terminal section formation region.

Next, as illustrated in FIG. 23(e), a source conductive film 7' is formed on the gate insulating film 4, within the opening 4a2, within the opening 4sgA, within the opening 4p1A, within the opening 4p2A, and on the contact layer 6. Here, as the source conductive film 7', a layered film (MoN/Al/Ti) is formed by layering Ti (having a thickness of 20 nm, for example), Al (having a thickness of 380 nm, for example), and MoN (having a thickness of 100 nm, for example) in this order.

Next, the source conductive film 7' is patterned to form the source metal layer 7 as illustrated in FIG. 24(a). Here, a difference from the manufacturing method of the TFT substrate 101Aa is in that the source bus line connection section 7sgA connected to the source lower connection wiring line 3sgA within the opening 4sgA is formed in the source-gate connection section formation region, the conductive portion 7p1A connected to the lower connection section 3p1A within the opening 4p1A is formed in the first transfer terminal section formation region, and the conductive portion 7p2A connected to the lower connection section 3p2A within the opening 4p2A is formed in the second transfer terminal section formation region.

Here, patterning of the source conductive film 7' is performed by wet etching using an aqueous solution containing, for example, phosphoric acid, nitric acid, and acetic acid to simultaneously pattern the MoN film and the Al film, and thereafter, by dry etching to simultaneously pattern the Ti film and the contact layer ($n^+$ type amorphous silicon layer) 6.

Next, as illustrated in FIG. 24(b), the first insulating film 11 is formed to cover the TFT 10 and the source metal layer 7. Here, as the first insulating film 11, a silicon nitride (SixNy) film having a thickness of 100 nm, for example, is formed.

Subsequently, as illustrated in FIG. 24(c), the first insulating film 11 and the gate insulating film 4 are etched through a known photolithography process to form the first insulating layer 11 and gate insulating layer 4. Here, in the antenna unit formation region, the contact hole CH_a3 that at least reaches the wiring line 3w2 is formed in the gate insulating film 4 and the first insulating film 11. In addition, in the first transfer terminal section formation region, the opening 11p1A that at least reaches the conductive portion 7p1A is formed in the first insulating film 11; and in the second transfer terminal section formation region, the opening 11p2A that at least reaches the conductive portion 7p2A is formed in the first insulating film 11. In the source terminal section formation region, the opening 4sA that at least reaches the lower connection section 3sA is formed in the gate insulating film 4 and the opening 11sA overlapping the opening 4sA is formed in the first insulating film 11; in the gate terminal section formation region, the opening 4gA that at least reaches the lower connection section 3gA is formed in the gate insulating film 4 and the opening 11gA overlapping the opening 4gA is formed in the first insulating film 11; and in the CS terminal section formation region, the opening 4cA that at least reaches the lower connection section 3cA is formed in the gate insulating film 4 and the opening 11cA overlapping the opening 4cA is formed in the first insulating film 11.

Here, in the source-gate connection section formation region, the opening is not formed in the first insulating film 11.

Next, as illustrated in FIG. 24(d), a patch conductive film 15' is formed on the first insulating layer 11, within the contact hole CH_a3, within the opening 11p1A, within the opening 11p2A, within the opening 4sA, within the opening 4gA, and within the opening 4cA. Here, as the patch conductive film 15', a layered film (MoN/Al/Ti) is formed by layering Ti (having a thickness of 20 nm, for example), Al (having a thickness of 380 nm, for example), and MoN (having a thickness of 100 nm, for example) in this order.

Next, the patch conductive film 15' is patterned to form the patch metal layer 151 as illustrated in FIG. 25(a). Specifically, the patch electrode 15 is formed in the antenna unit formation region. The patch electrode 15 is formed to be connected to the wiring line 3w2 within the contact hole CH_a3. Patterning of the patch conductive film 15' is performed in the same manner as the patterning of the source conductive film 7', for example.

In the process of patterning the patch conductive film 15', the source bus line connection section 7sgA and the source lower connection wiring line 3sgA formed in the source-gate connection section formation region are covered with the first insulating layer 11. Therefore, the source bus line connection section 7sgA and the source lower connection wiring line 3sgA scarcely suffer the etching damage in the process of patterning the patch conductive film 15'.

Next, as illustrated in FIG. 25(b), the second insulating film 17 is formed on the patch metal layer 151 and on the first insulating layer 11.

After that, the second insulating film 17 is etched through a known photolithography process to from the second insulating layer 17 as illustrated in FIG. 25(c). Specifically, the opening 17p1A overlapping the opening 11p1A is formed in the first transfer terminal section formation region, the opening 17p2A overlapping the opening 11p2A is formed in the second transfer terminal section formation region, the opening 17sA overlapping the opening 11sA is formed in the source terminal section formation region, the opening 17gA overlapping the opening 11gA is formed in the gate terminal section formation region, and the opening 17cA overlapping the opening 11cA is formed in the CS terminal section formation region.

Next, as illustrated in FIG. 26(a), an upper conductive film 19' is formed on the second insulating layer 17, within the opening 11p1A, within the opening 11p2A, within the opening 4sA, within the opening 4gA, and within the opening 4cA.

Next, the upper conductive film 19' is patterned to form the upper conductive layer 19 as illustrated in FIG. 26(b). Specifically, the upper connection section 19p1A connected to the conductive portion 7p1A within the opening 11p1A is formed in the first transfer terminal section formation region, the upper connection section 19p2A connected to the conductive portion 7p2A within the opening 11p2A is formed in the second transfer terminal section formation region, the upper connection section 19sA connected to the lower connection section 3sA within the opening 4sA is formed in the source terminal section formation region, the upper connection section 19gA connected to the lower connection section 3gA within the opening 4gA is formed in the gate terminal section formation region, and the upper connection section 19cA connected to the lower connection section 3cA within the opening 4cA in the CS terminal section formation region.

In this manner, the TFT substrate 101Ab is manufactured.

Second Embodiment

In the embodiment described above, the patch electrode is included in a conductive layer different from any of the conductive layers including the gate electrode of the TFT and the source electrode of the TFT. A TFT substrate used for a scanning antenna according to the present embodiment differs from the embodiment described above in that the patch electrode is included in the source metal layer.

Figure 27:
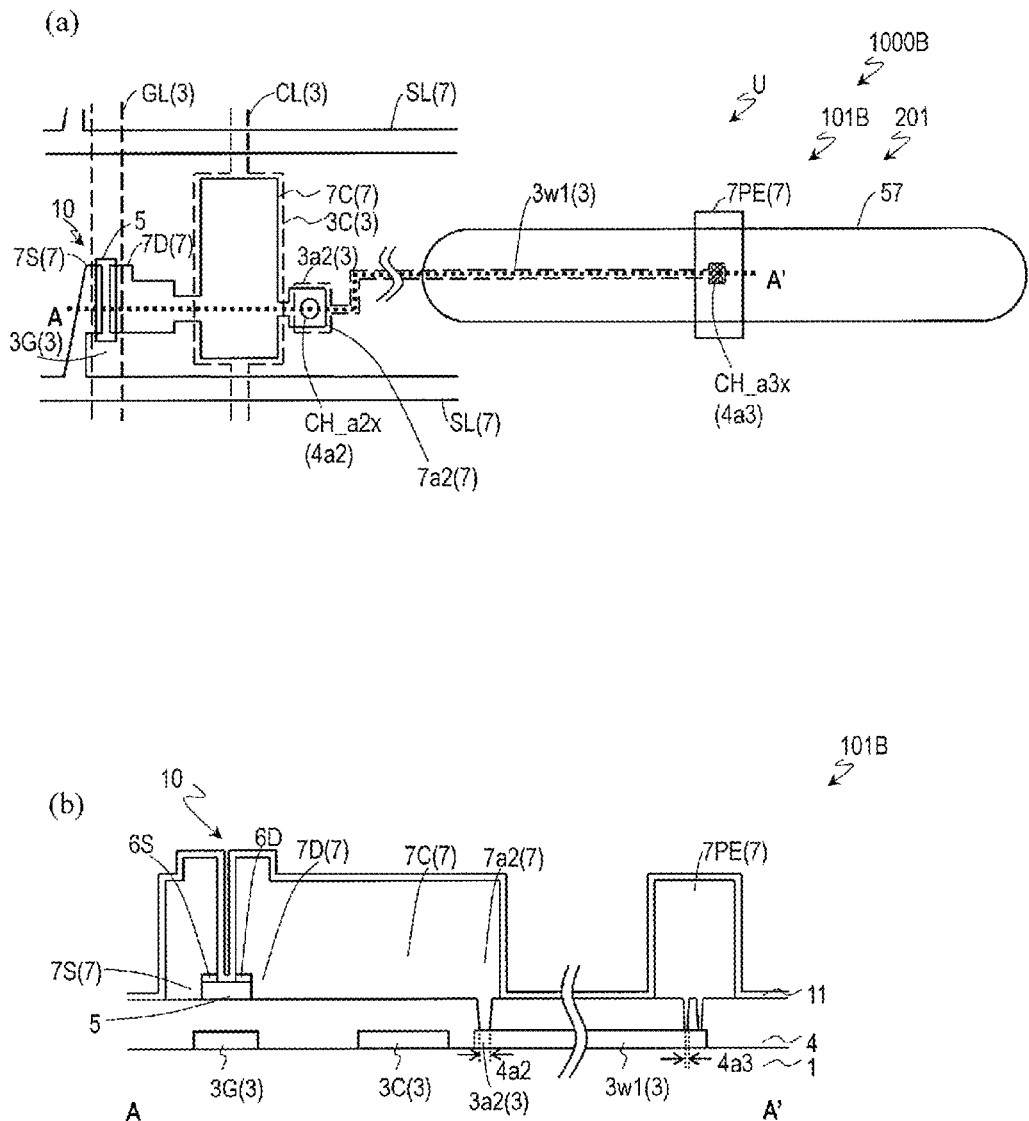
FIG. 27(a) is a schematic plan view of an antenna unit region U in a transmission and/or reception region R1 of a scanning antenna 1000B according to a second embodiment.
FIG. 27(b) is a schematic cross-sectional view of a TFT substrate 101B along a line A-A' in FIG. 27(a).
Figure 28:
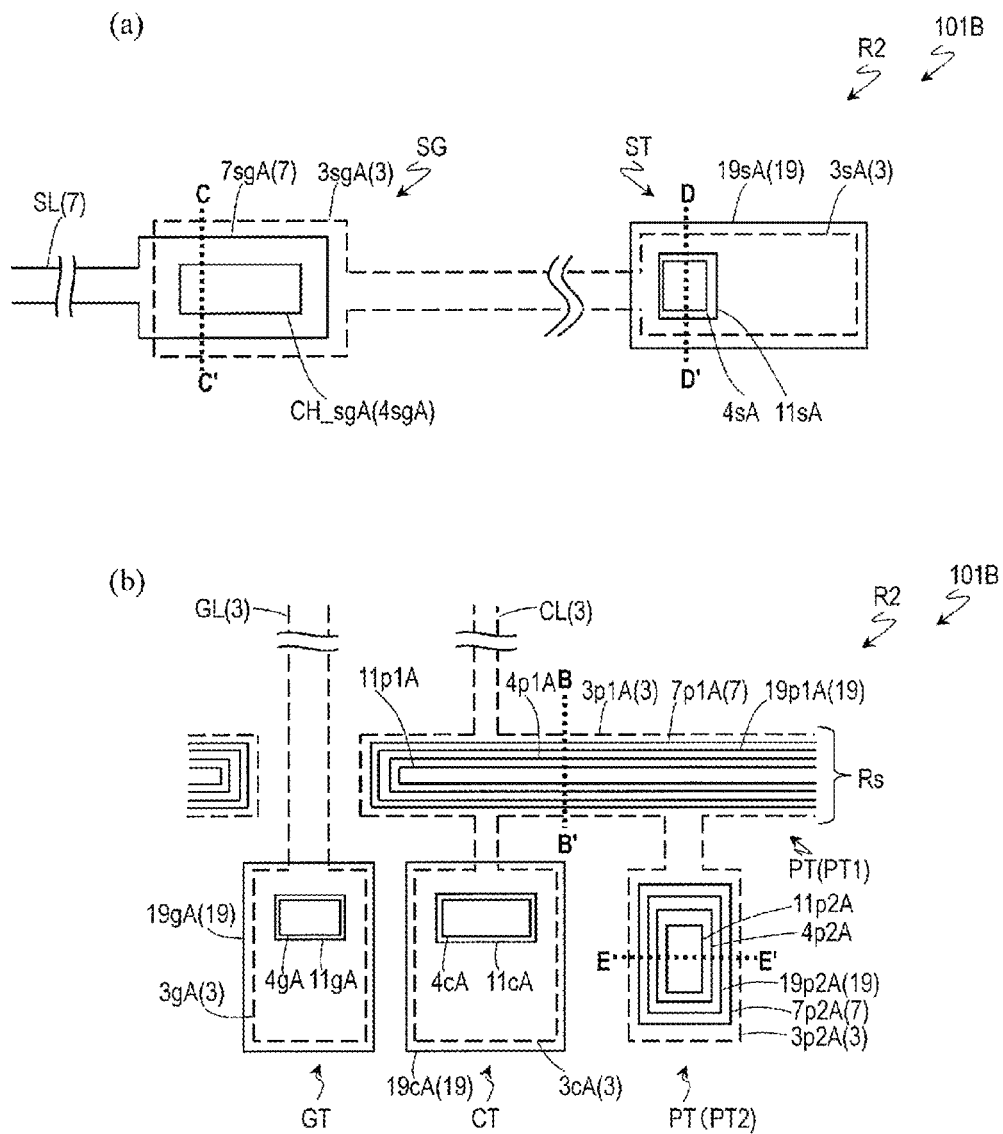
FIGS. 28(a) and 28(b) are schematic plan views of a non-transmission and/or reception region R2 of the TFT substrate 101B.
Figure 29:
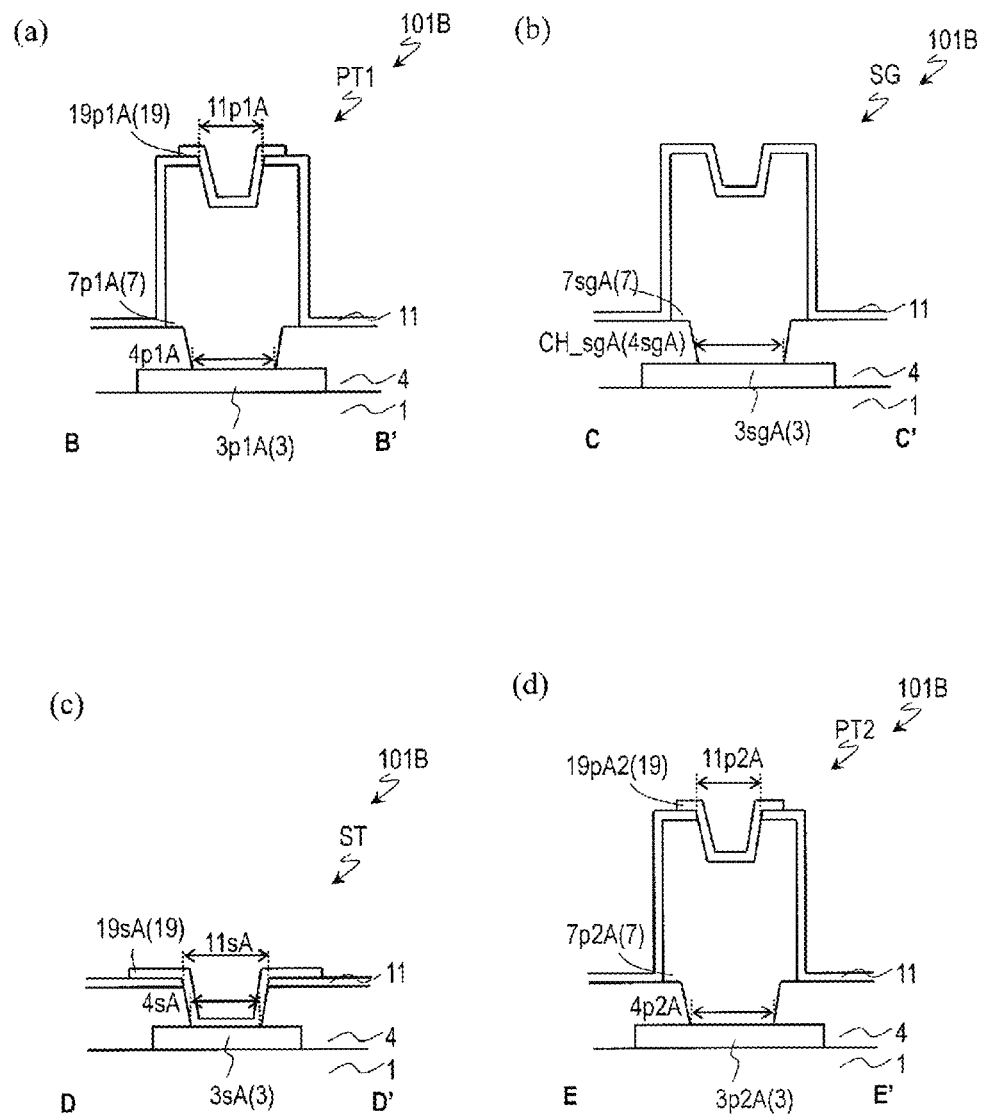
FIGS. 29(a) to 29(d) are schematic cross-sectional views of the non-transmission and/or reception region R2 of the TFT substrate 101B.

A scanning antenna 1000B and a TFT substrate 101B included in the scanning antenna 1000B in the present embodiment will be described with reference to FIG. 27 to FIG. 29. The constitutions common to the embodiment described above are denoted by the same reference signs and the descriptions thereof may be omitted.

Structure of TFT Substrate 101B

FIG. 27(a) is a schematic plan view of an antenna unit region U in a transmission and/or reception region R1 of the scanning antenna 1000B, and FIG. 27(b) is a schematic cross-sectional view of the TFT substrate 101B along a line A-A' in FIG. 27(a).

As illustrated in FIG. 27(a) and FIG. 27(b), the TFT substrate 101B differs from the TFT substrate 101Aa in including a patch electrode 7PE included in the source metal layer 7. In this example, the TFT substrate 101B does not include the patch metal layer 151, the second insulating layer 17, and the lower conductive layer 13.

The patch drain connection section of the TFT substrate 101B includes a conductive portion included in a conductive layer that is closer to the dielectric substrate 1 than the patch electrode 7PE, and that includes either one of the gate electrode 3G of the TFT 10 or the source electrode 7S of TFT 10 closer to the dielectric substrate 1 than the other. In the TFT substrate 101B, the gate metal layer 3 including the gate electrode 3G of the TFT 10 is closer to the dielectric substrate 1 than the source metal layer 7 including the source electrode 7S of the TFT 10. The patch drain connection section of the TFT substrate 101B includes the wiring line 3w1 included in the gate metal layer 3.

When viewed from the normal direction of the TFT substrate 101B and the slot substrate 201, the conductive layer including the patch electrode (here, the source metal layer 7) does not include a conductive portion other than the patch electrode 7PE inside and near the slot 57. With this configuration, the scanning antenna 1000B has excellent antenna performance.

The gate insulating layer 4 includes an opening 4a3 that at least reaches the wiring line 3w1 and overlaps the patch electrode 7PE when viewed from the normal direction of the dielectric substrate 1. The opening 4a3 may be referred to as a contact hole CH_a3x. The patch electrode 7PE is formed on the gate insulating layer 4 and within the contact hole CH_a3x, and is connected to the wiring line 3w1 within the contact hole CH_a3x. For example, here, the patch electrode 7PE is in contact with the wiring line 3w1 within the opening 4a3 formed in the gate insulating layer 4.

In the TFT substrate 101 B, since the patch electrode 7PE is included in the source metal layer 7, a thickness of the patch electrode 7PE is substantially the same as thicknesses of the source electrode 7S and the drain electrode 7D. Accordingly, the TFT substrate 101B is disadvantageous compared to the TFT substrate 101Aa in that the thickness of the patch electrode 7PE cannot be greater than the thicknesses of the source electrode 7S and the drain electrode 7D. On the other hand, the TFT substrate 101B can reduce the number of manufacturing processes (for example, the number of photomasks) and the manufacturing costs as compared with the TFT substrate 101Aa.

Furthermore, since the TFT substrate 101B does not include the patch metal layer 151, the problem of the damages to the gate metal layer 3 and/or the source metal layer 7 do not occur in the process of etching the patch conductive film 151'.

Note that the present embodiment is not limited to the illustrated example. For example, the structure of the TFT is not limited to the illustrated example, and the arrangement relationship between the gate metal layer 3 and the source metal layer 7 may be reversed. The patch electrode may be included in a conductive layer that is either one of the conductive layer including the gate electrode of the TFT or the conductive layer including the source electrode of TFT and is farther from the dielectric substrate than the other.

The structure of a non-transmission and/or reception region R2 of the TFT substrate 101B will be described with reference to FIG. 28 and FIG. 29. The structure of the non-transmission and/or reception region R2 of the TFT substrate 101B illustrated in FIG. 28 and FIG. 29 corresponds to the structure of the non-transmission and/or reception region R2 of the TFT substrate 101Ab illustrated in FIG. 21 and FIG. 22 with the second insulating layer 17 being omitted. However, the structure of the non-transmission and/or reception region R2 of the TFT substrate 101B is not limited to the illustrated example.

FIG. 28(a) and FIG. 28(b) are schematic plan views of the non-transmission and/or reception region R2 of the TFT substrate 101B, and FIGS. 29(a) to 29(d) are schematic cross-sectional views of the non-transmission and/or reception region R2 of the TFT substrate 101B. FIG. 28(a) illustrates the source-gate connection section SG and the source terminal section ST provided in the non-transmission and/or reception region R2, and FIG. 28(b) illustrates the transfer terminal section PT, the gate terminal section GT, and a CS terminal section CT provided in the non-transmission and/or reception region R2. FIG. 29(a) illustrates a cross-section of the first transfer terminal section PT1 along a line B-B' in FIG. 28(b), FIG. 29(b) illustrates a cross-section of the source-gate connection section SG along a line C-C' in FIG. 28(a), FIG. 29(c) illustrates a cross-section of the source terminal section ST along a line D-D' in FIG. 28(a), and FIG. 29(d) illustrates a cross-section of the second transfer terminal section PT2 along a line E-E' in FIG. 28(b).

Source-Gate Connection Section SG

The source-gate connection section SG of the TFT substrate 101B illustrated in FIG. 28(a) and FIG. 29(b) corresponds to the source-gate connection section SG of the TFT substrate 101Ab illustrated in FIG. 21(a) and FIG. 22(b) with the second insulating layer 17 being omitted.

As illustrated in FIG. 28(a) and FIG. 29(b), the source-gate connection section SG of the TFT substrate 101B includes the source lower connection wiring line 3sgA, the opening 4sgA formed in the gate insulating layer 4, and the source bus line connection section 7sgA.

Source Terminal Section ST

The source terminal section ST of the TFT substrate 101B illustrated in FIG. 28(a) and FIG. 29(c) corresponds to the source terminal section ST of the TFT substrate 101Ab illustrated in FIG. 21(a) and FIG. 22(c) with the second insulating layer 17 being omitted.

As illustrated in FIG. 28(a) and FIG. 29(c), the source terminal section ST of the TFT substrate 101B includes the source terminal lower connection section 3sA connected to the source lower connection wiring line 3sgA formed in the source-gate connection section SG, the opening 4sA formed in the gate insulating layer 4, the opening 11sA formed in the first insulating layer 11, and the source terminal upper connection section 19sA.

The upper connection section 19sA included in the upper conductive layer 19 is formed on the first insulating layer 11 and within the opening 4sA formed in the gate insulating layer 4, and is connected to the lower connection section 3sA within the opening 4sA. Here, the upper connection section 19sA is in contact with the lower connection section 3sA within the opening 4sA formed in the gate insulating layer 4.

The source terminal section ST of the TFT substrate 101B, which includes the lower connection section 3sA included in the gate metal layer 3, has excellent reliability similarly to the TFT substrate 101Aa.

Gate Terminal Section GT

The source terminal section ST of the TFT substrate 101B illustrated in FIG. 28(b) corresponds to the source terminal section ST of the TFT substrate 101Ab illustrated in FIG. 21(b) with the second insulating layer 17 being omitted.

As illustrated in FIG. 28(b), the gate terminal section GT of the TFT substrate 101B includes the gate terminal lower connection section 3gA, the opening 4gA formed in the gate insulating layer 4, the opening 11gA formed in the first insulating layer 11, and the gate terminal upper connection section 19gA.

The upper connection section 19gA included in the upper conductive layer 19 is formed on the first insulating layer 11 and within the opening 4gA formed in the gate insulating layer 4, and is connected to the lower connection section 3gA within the opening 4gA. For example, the upper connection section 19gA is in contact with the lower connection section 3gA within the opening 4gA.

The gate terminal section GT of the TFT substrate 101B, which includes the lower connection section 3gA included in the gate metal layer 3, has excellent reliability similarly to the TFT substrate 101Aa.

CS Terminal Section CT

The CS terminal section CT of the TFT substrate 101B illustrated in FIG. 28(b) corresponds to the CS terminal section CT of the TFT substrate 101Ab illustrated in FIG. 21(b) with the second insulating layer 17 being omitted.

As illustrated in FIG. 28(b), the CS terminal section CT of the TFT substrate 101B includes the CS terminal lower connection section 3cA, the opening 4cA formed in the gate insulating layer 4, the opening 11cA formed in the first insulating layer 11, the opening 17cA formed in the second insulating layer 17, and the CS terminal upper connection section 19cA.

The upper connection section 19cA included in the upper conductive layer 19 is formed on the first insulating layer 11 and within the opening 4cA formed in the gate insulating layer 4, and is connected to the lower connection section 3cA within the opening 4cA. For example, the upper connection section 19cA is in contact with the lower connection section 3cA within the opening 4cA.

The CS terminal section CT of the TFT substrate 101B includes the lower connection section 3cA included in the gate metal layer 3, and hence has excellent reliability similarly to the TFT substrate 101Aa.

Transfer Terminal Section PT

The first transfer terminal section PT1 of the TFT substrate 101B illustrated in FIG. 28(b) and FIG. 29(a) corresponds to the first transfer terminal section PT1 of the TFT substrate 101Ab illustrated in FIG. 21(b) and FIG. 22(a) with the second insulating layer 17 being omitted.

As illustrated in FIG. 28(b) and FIG. 29(a), the first transfer terminal section PT1 of the TFT substrate 101B includes the first transfer terminal lower connection section 3p1A, the opening 4p1A formed in the gate insulating layer 4, the first transfer terminal conductive portion 7p1A, the opening 11p1A formed in the first insulating layer 11, and the first transfer terminal upper connection section 19p1A.

The upper connection section 19p1A included in the upper conductive layer 19 is formed on the first insulating layer 11 and within the opening 11p1A formed in the first insulating layer 11, and connected to the conductive portion 7p1A within the opening 11p1A. Here, the upper connection section 19p1A is in contact with the conductive portion 7p1A within the opening 11p1A.

As illustrated in FIG. 28(b) and FIG. 29(d), the second transfer terminal section PT2 of the TFT substrate 101B has a cross-section structure similar to the first transfer terminal section PT1 for example. The second transfer terminal section PT2 of the TFT substrate 101B illustrated in FIG. 28(b) and FIG. 29(d) corresponds to the second transfer terminal section PT2 of the TFT substrate 101Ab illustrated in FIG. 21(b) and FIG. 22(d) with the second insulating layer 17 being omitted.

As illustrated in FIG. 28(b) and FIG. 29(d), the second transfer terminal section PT2 of the TFT substrate 101B includes the second transfer terminal lower connection section 3p2A, the opening 4p2A formed in the gate insulating layer 4, the second transfer terminal conductive portion 7p2A, the opening 11p2A formed in the first insulating layer 11, and the second transfer terminal upper connection section 19p2A.

The upper connection section 19p2A included in the upper conductive layer 19 is formed on the first insulating layer 11 and within the opening 11p2A formed in the first insulating layer 11, and connected to the conductive portion 7p2A within the opening 11p2A. Here, the upper connection section 19p2A is in contact with the conductive portion 7p2A within the opening 11p2A.

Manufacturing Method of TFT Substrate 101B

Figure 30:
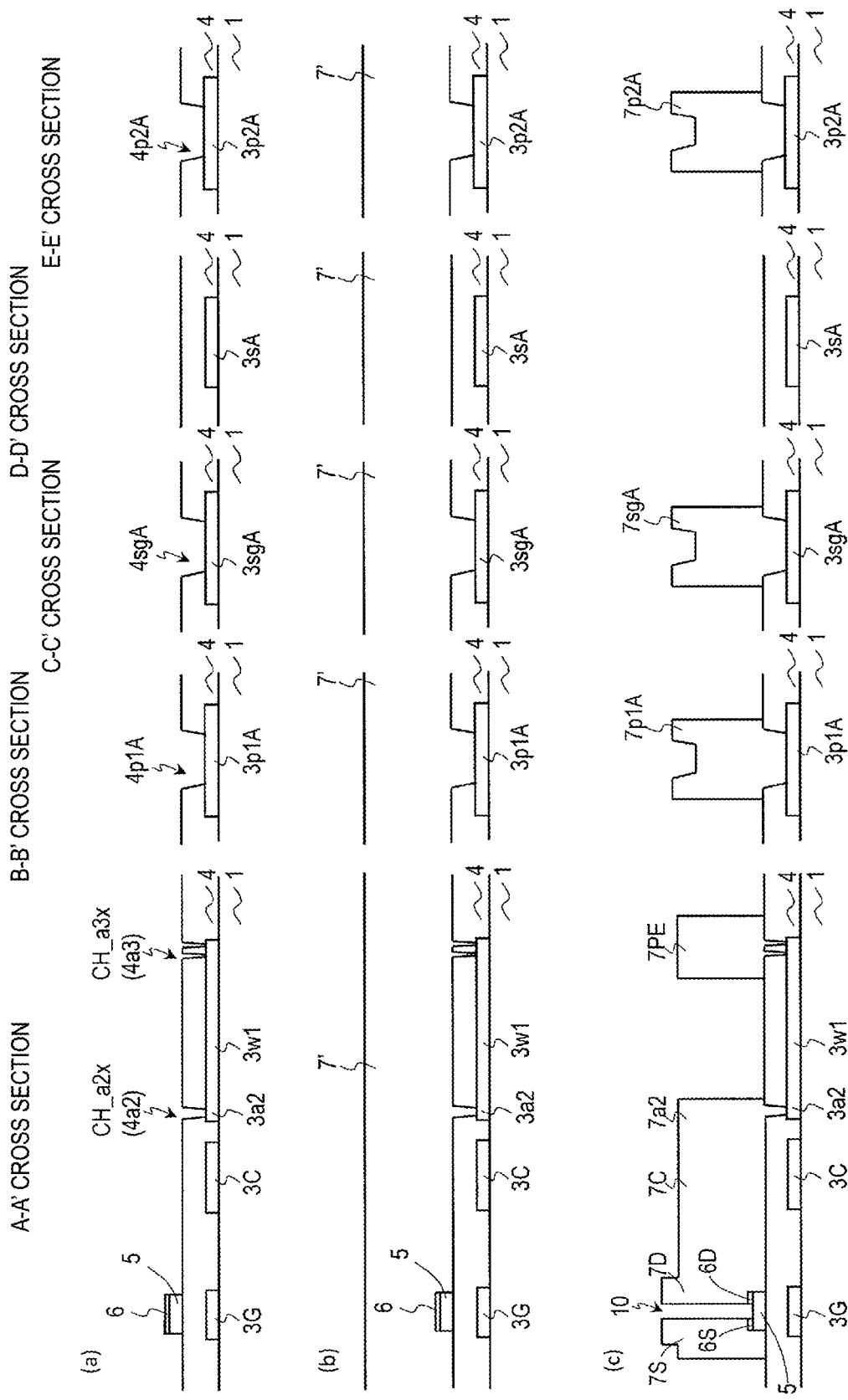
FIGS. 30(a) to 30(c) are process cross-sectional views illustrating an example of a manufacturing method of the TFT substrate 101B.
Figure 31:
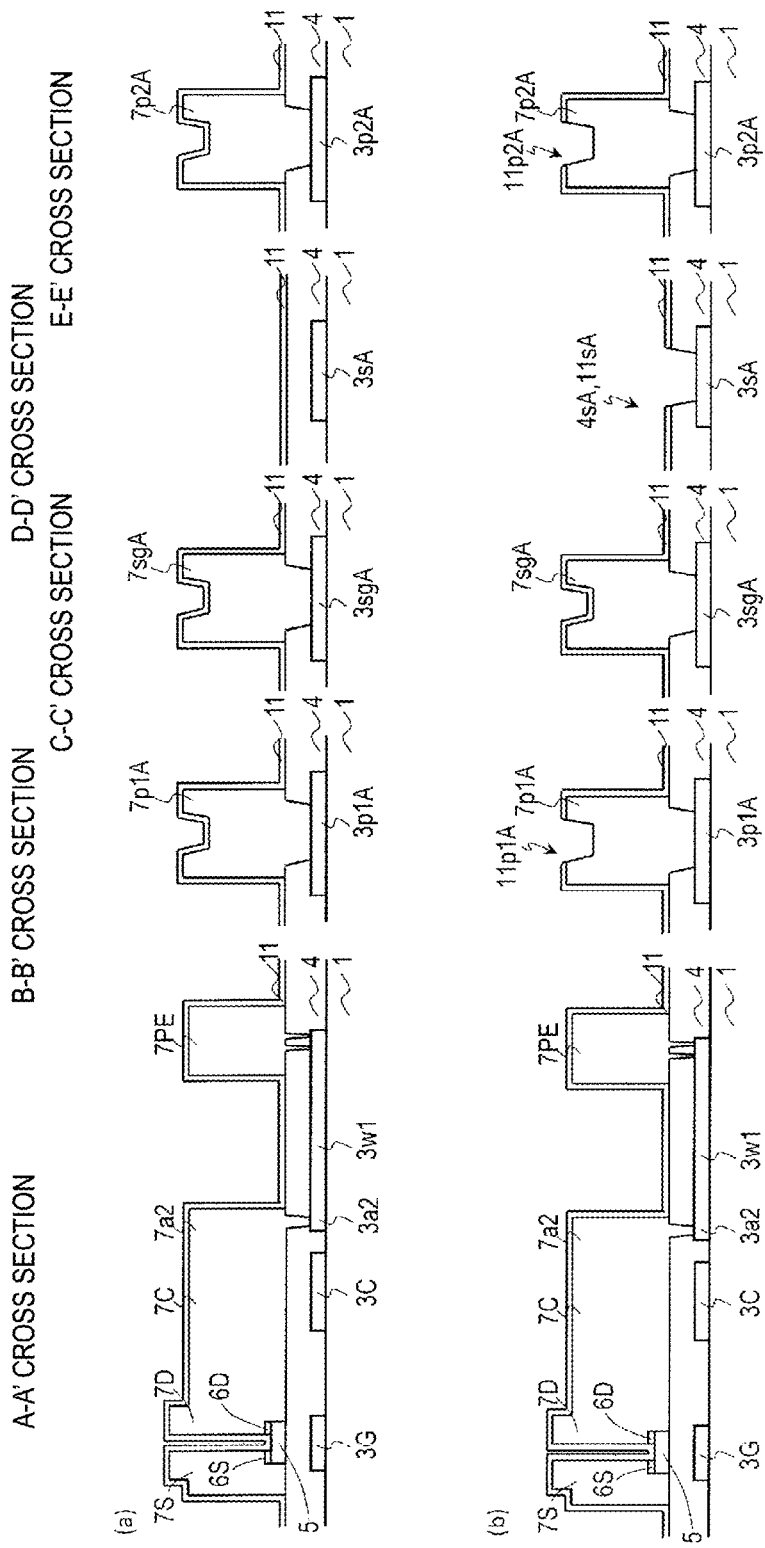
FIGS. 31(a) and 31(b) are process cross-sectional views illustrating an example of the manufacturing method of the TFT substrate 101B.
Figure 32:
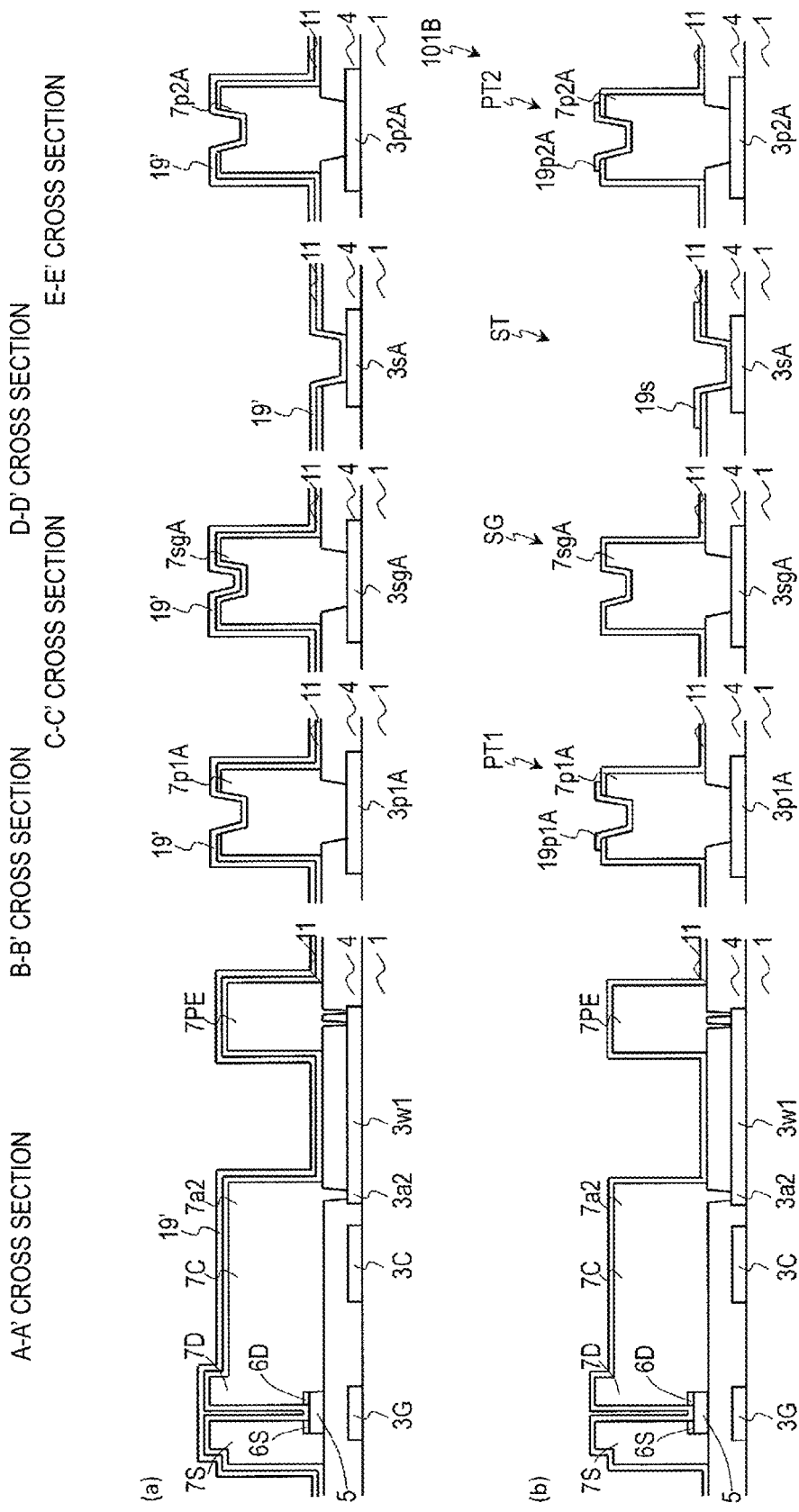
FIGS. 32(a) and 32(b) are process cross-sectional views illustrating an example of the manufacturing method of the TFT substrate 101B.

A description is given of a manufacturing method of the TFT substrate 101B with reference to FIG. 30 to FIG. 32.

FIGS. 30(a) to 30(c), FIGS. 31(a) and 31(b), and FIGS. 32(a) and 32(b) are process cross-sectional views illustrating an example of the manufacturing method of the TFT substrate 101B. Each of these drawings illustrates a cross section corresponding to FIG. 27(b) and FIGS. 29(a) to 29(d) (the cross sections along lines A-A' to E-E' of the TFT substrate 101B). The following description mainly describes differences from the manufacturing method of the TFT substrate 101Ab described referring to FIG. 23 to FIG. 26.

First, as illustrated in FIGS. 23(a) to 23(c), the gate metal layer 3, the gate insulating film 4, the island-shaped semiconductor layer 5, and the contact layer 6 are formed on the dielectric substrate 1. Here, the wiring line 3w1 is formed in the antenna unit formation region.

Subsequently, the gate insulating film 4 are etched through a known photolithography process as illustrated in FIG. 30(a). Here, a difference from the manufacturing method of the TFT substrate 101Ab is in that the opening 4a3 that at least reaches the wiring line 3w1 is further formed in the antenna unit formation region.

Next, as illustrated in FIG. 30(b), a source conductive film 7' is formed on the gate insulating film 4, within the opening 4a2, within the opening 4a3, within the opening 4sgA, within the opening 4p1A, within the opening 4p2A, and on the contact layer 6.

Next, the source conductive film 7' is patterned to form the source metal layer 7 as illustrated in FIG. 30(c).

Next, as illustrated in FIG. 31(a), the first insulating film 11 is formed to cover the TFT 10 and the source metal layer 7.

Next, as illustrated in FIG. 31(b), the first insulating film 11 and the gate insulating film 4 are etched through a known photolithography process to form the first insulating layer 11 and gate insulating layer 4. Here, in the antenna unit formation region, the opening is not formed in the first insulating film 11.

Next, as illustrated in FIG. 32(a), an upper conductive film 19' is formed on the first insulating layer 11, within the opening 11p1A, within the opening 11p2A, within the opening 4sA, within the opening 4gA, and within the opening 4cA.

Next, the upper conductive film 19' is patterned to form the upper conductive layer 19 as illustrated in FIG. 32(b). Specifically, the upper connection section 19p1A connected to the conductive portion 7p1A within the opening 11p1A is formed in the first transfer terminal section formation region, the upper connection section 19p2A connected to the conductive portion 7p2A within the opening 11p2A is formed in the second transfer terminal section formation region, the upper connection section 19sA connected to the lower connection section 3sA within the opening 4sA is formed in the source terminal section formation region, the upper connection section 19gA connected to the lower connection section 3gA within the opening 4gA is formed in the gate terminal section formation region, and the upper connection section 19cA connected to the lower connection section 3cA within the opening 4cA in the CS terminal section formation region.

In this manner, the TFT substrate 101B is manufactured.

Third Embodiment

A TFT substrate used for a scanning antenna according to the present embodiment differs from the second embodiment in that the patch electrode is included a conductive layer different from the source metal layer.

Figure 33:
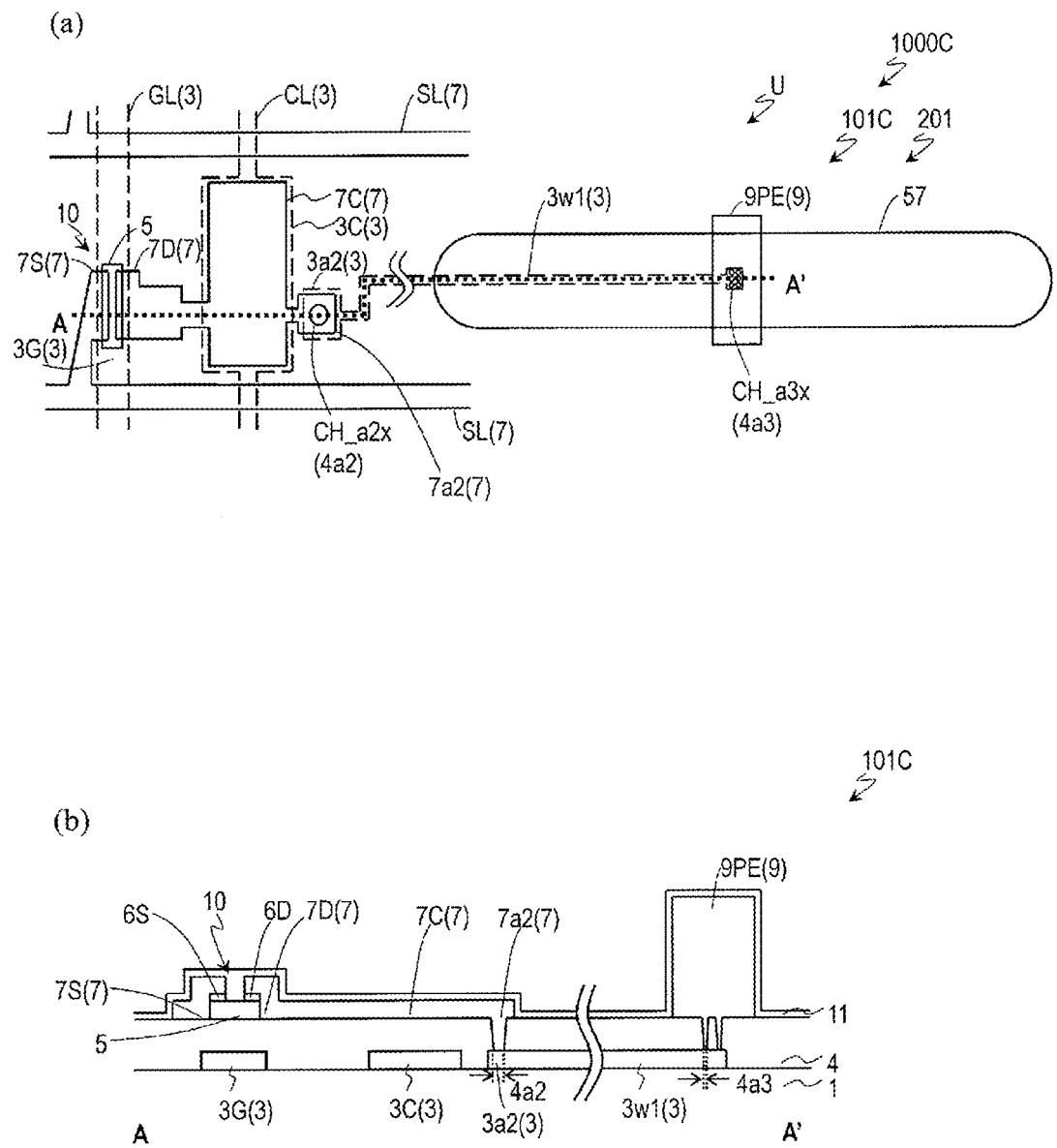
FIG. 33(a) is a schematic plan view of an antenna unit region U in a transmission and/or reception region R1 of a scanning antenna 1000C according to a third embodiment.
FIG. 33(b) is a schematic cross-sectional view of a TFT substrate 101C along a line A-A' in FIG. 33(a).

A scanning antenna 1000C and a TFT substrate 101C included in the scanning antenna 1000C of the present embodiment will be described with reference to FIG. 33. The constitutions common to the embodiment described above are denoted by the same reference signs and the descriptions thereof may be omitted.

Structure of TFT Substrate 101C

FIG. 33(a) is a schematic plan view of an antenna unit region U in a transmission and/or reception region R1 of the scanning antenna 1000C, and FIG. 33(b) is a schematic cross-sectional view of the TFT substrate 101C along a line A-A' in FIG. 33(a).

As illustrated in FIG. 33(a) and FIG. 33(b), the TFT substrate 101C differs from the TFT substrate 101B in including a patch electrode 9PE included in a conductive layer 9 that is different from the source metal layer 7 and is formed between the gate insulating layer 4 and the first insulating layer.

The patch drain connection section of the TFT substrate 101C includes a conductive portion included in a conductive layer that is closer to the dielectric substrate 1 than the patch electrode 9PE, and that includes either one of the gate electrode 3G of the TFT 10 or the source electrode 7S of TFT 10 closer to the dielectric substrate 1 than the other. In the TFT substrate 101C, the gate metal layer 3 including the gate electrode 3G of the TFT 10 is closer to the dielectric substrate 1 than the source metal layer 7 including the source electrode 7S of the TFT 10. The patch drain connection section of the TFT substrate 101C includes the wiring line 3w1 included in the gate metal layer 3.

When viewed from the normal direction of the TFT substrate 101C and the slot substrate 201, the conductive layer 9 including the patch electrode does not include a conductive portion other than the patch electrode 9PE inside and near the slot 57. With this configuration, the scanning antenna 1000C has excellent antenna performance.

The patch electrode 9PE is formed on the gate insulating layer 4 and within the contact hole CH_a3x, and is connected to the wiring line 3w1 within the contact hole CH_a3x. For example, here, the patch electrode 9PE is in contact with the wiring line 3w1 within the opening 4a3 formed in the gate insulating layer 4.

Since the TFT substrate 101C includes the patch electrode 9PE included in the conductive layer 9 different from the source metal layer 7, the number of manufacturing processes (for example, the number of photomasks) and the manufacturing costs are increased as compared with the TFT substrate 101B. However, in the present embodiment, by forming the patch electrode 9PE in the layer different from the source metal layer 7, the following advantages are obtained compared to the TFT substrate 101B.

It is preferable that the patch electrode have a low resistance to the extent that the vibration of electrons is not hindered. The patch electrode is formed of a comparatively thick Al layer having a thickness of greater than or equal to 0.3 μm, for example. From the viewpoint of antenna performance, it is preferable that the patch electrode be thick. Depending on the configuration of the TFT, however, when a patch electrode having a thickness exceeding, for example, 1 μm is formed in the source metal layer, a problem arises in that the desired patterning accuracy cannot be obtained. For example, there may be a problem that the gap between the source electrode and the drain electrode (corresponding to the channel length of the TFT) cannot be controlled with high accuracy. In contrast, in the present embodiment, since the patch electrode 9PE is formed separately from the source metal layer 7, the thickness of the source metal layer 7 and the thickness of the patch electrode 9PE can be controlled independently. This allows the controllability for forming the source metal layer 7 to be secured and the patch electrode 9PE having a desired thickness to be formed.

In the present embodiment, the thickness of the patch electrode 9PE can be set with a high degree of freedom separately from the thickness of the source metal layer 7. Note that since the size of the patch electrode 9PE needs not be controlled as strictly as the source bus line SL or the like, it does not matter that a line width shift (deviation from the design value) is increased by thickening the patch electrode 9PE.

Note that that the above advantages are of course also obtained in the first embodiment having the patch electrode 15 included in the patch metal layer 151 different from the source metal layer 7.

The structure of the non-transmission and/or reception region R2 of the scanning antenna 1000C is the same as the scanning antenna 1000B, for example.

Manufacturing Method of TFT Substrate 101C

Figure 34:
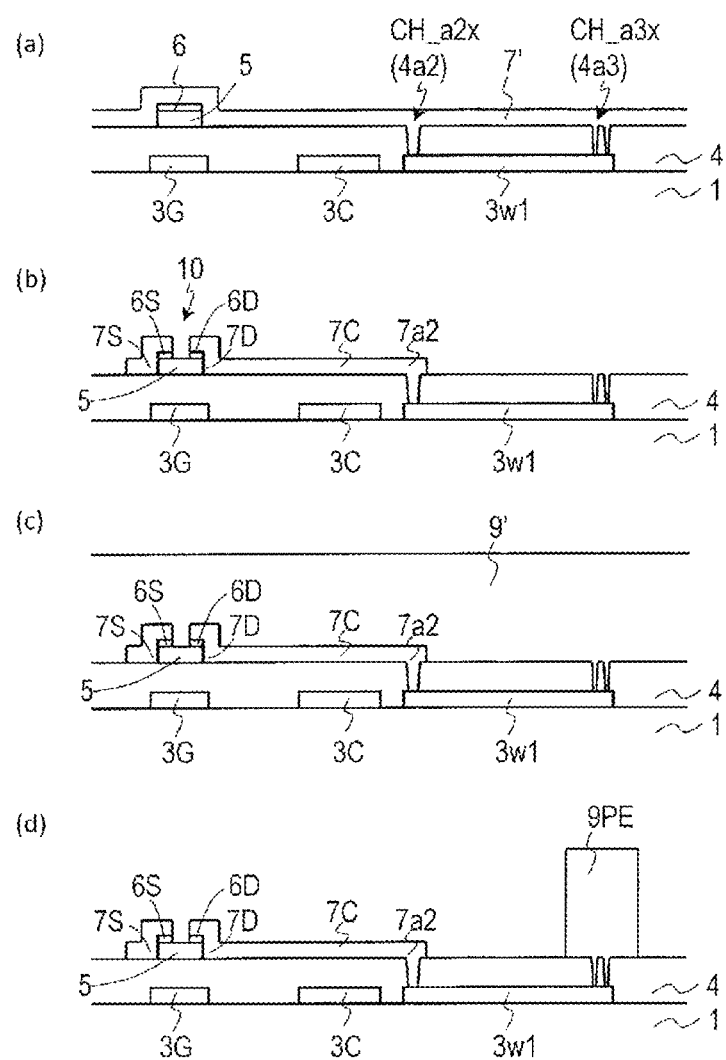
FIGS. 34(a) to 34(d) are process cross-sectional views illustrating an example of a manufacturing method of the TFT substrate 101C.
Figure 35:
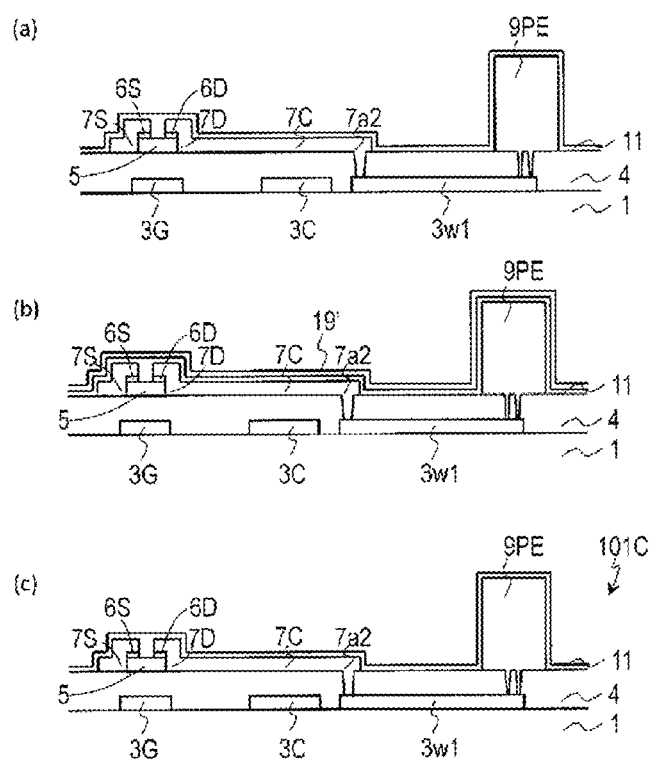
FIGS. 35(a) to 35(c) are process cross-sectional views illustrating an example of the manufacturing method of the TFT substrate 101C.

A description is given of a manufacturing method of the TFT substrate 101C with reference to FIG. 34 to FIG. 35.

FIGS. 34(a) to 34(d) and FIGS. 35(a) to 35(d) are process cross-sectional views illustrating an example of the manufacturing method of the TFT substrate 101C. These drawings illustrate cross sections corresponding to FIG. 33(b) (the cross section along a line A-A' of the TFT substrate 101C). Illustration and description of the cross section of the non-transmission and/or reception region R2 of the TFT substrate 101C are omitted. The following description mainly describes differences from the manufacturing method of the TFT substrate 101B described referring to FIG. 30(a) to FIG. 32(b).

First, as illustrated in FIGS. 23(a) to 23(c), the gate metal layer 3, the gate insulating film 4, the island-shaped semiconductor layer 5, and the contact layer 6 are formed on the dielectric substrate 1. Subsequently, the gate insulating film 4 are etched through a known photolithography process as illustrated in FIG. 30(a).

Next, as illustrated in FIG. 34(a), a source conductive film 7' is formed on the gate insulating film 4, within the opening 4a2, within the opening 4a3, within the opening 4sgA, within the opening 4p1A, within the opening 4p2A, and on the contact layer 6. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example) in this order.

Next, the source conductive film 7' is patterned to form the source metal layer 7 as illustrated in FIG. 34(b). Here, the source metal layer 7 does not include the patch electrode. A difference from the manufacturing method of the TFT substrate 101B is in that the source metal layer 7 is formed not to overlap the opening 4a3.

Next, as illustrated in FIG. 34(c), a patch conductive film 9' is formed on the TFT 10, on the source metal layer 7, and on the gate insulating layer 4. Here, as the patch conductive film 9', a layered film (MoN/Al/Ti) is formed by layering Ti (having a thickness of 20 nm, for example), Al (having a thickness of 380 nm, for example), and MoN (having a thickness of 100 nm, for example) in this order.

Next, the patch conductive film 9' is patterned to form the patch metal layer 9, and then, the patch electrode 9PE is formed, as illustrated in FIG. 34(d). The patch electrode 9PE is formed to be connected to the wiring line 3w1 within the contact hole CH_a3x.

In the patterning of the patch conductive film 9', the etching conditions are adjusted so that an etching rate for the source metal layer 7 is less than an etching rate for the patch conductive film 9'. For example, the material and etchant of the patch conductive film 9' and the source conductive film 7' are selected as appropriate.

Next, as illustrated in FIG. 35(a), the first insulating film 11 is formed to cover the TFT 10, the source metal layer 7, and the patch metal layer 9. Subsequently, the first insulating film 11 and the gate insulating film 4 are etched through a known photolithography process to form the first insulating layer 11 and gate insulating layer 4. Here, as illustrated in FIG. 35(a), in the antenna unit formation region, the opening is not formed in the first insulating film 11.

Next, as illustrated in FIG. 35(b), an upper conductive film 19' is formed on the first insulating layer 11.

Next, the upper conductive film 19' is patterned to form the upper conductive layer 19. As illustrated in FIG. 35(c), the conductive portion included in the upper conductive layer 19 is not formed in the antenna unit formation region.

In this manner, the TFT substrate 101C is manufactured.

Fourth Embodiment

A TFT substrate used for a scanning antenna according to the present embodiment differs from the embodiment described above in that the patch drain connection section includes a conductive portion included in the source metal layer.

Figure 36:
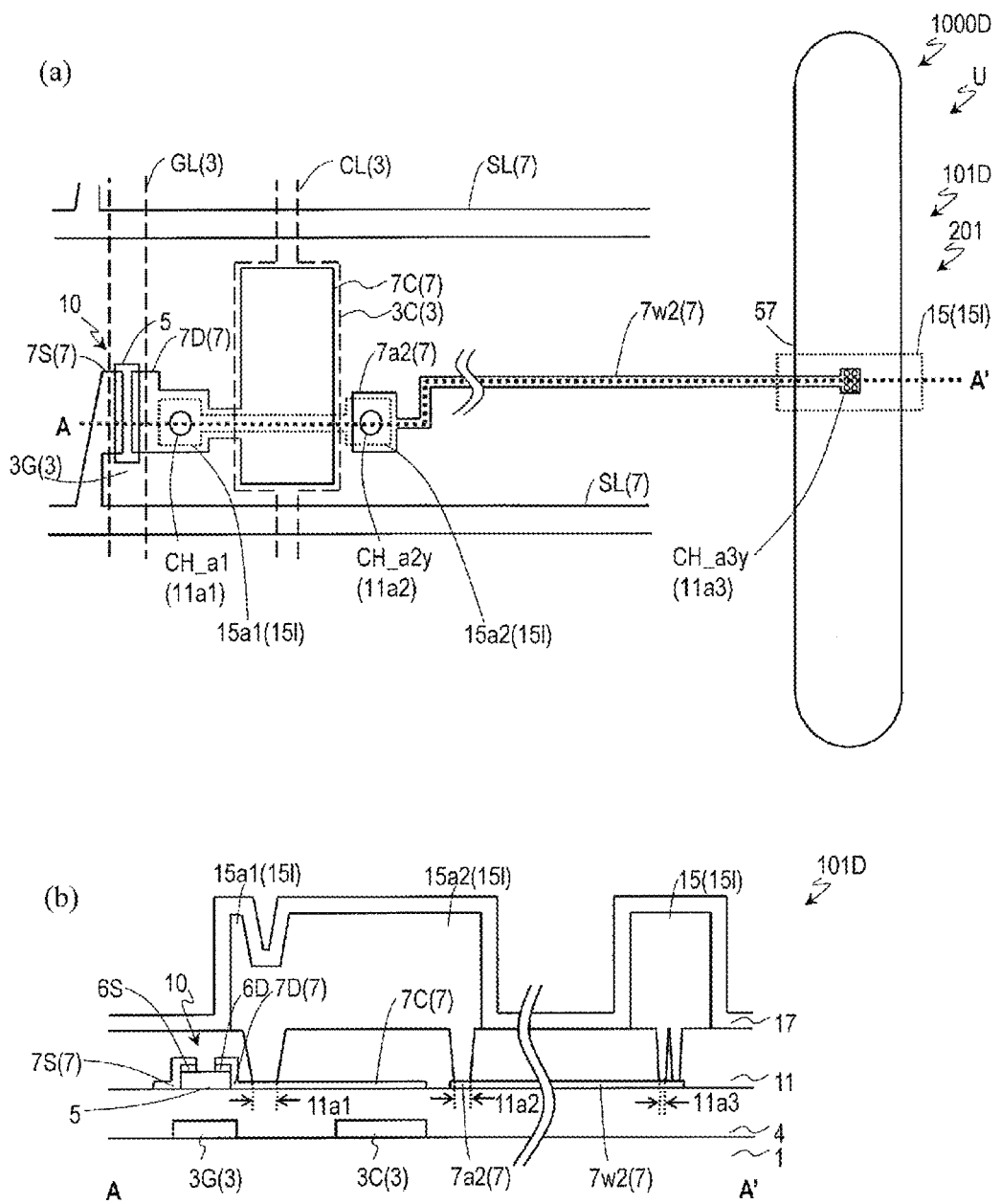
FIG. 36(a) is a schematic plan view of an antenna unit region U in a transmission and/or reception region R1 of a scanning antenna 1000D according to a fourth embodiment.
FIG. 36(b) is a schematic cross-sectional view of a TFT substrate 101D along a line A-A' in FIG. 36(a).

A scanning antenna 1000D and a TFT substrate 101D included in the scanning antenna 1000D of the present embodiment will be described with reference to FIG. 36. The constitutions common to the embodiment described above are denoted by the same reference signs and the descriptions thereof may be omitted.

Structure of TFT Substrate 101D

FIG. 36(a) is a schematic plan view of an antenna unit region U in a transmission and/or reception region R1 of the scanning antenna 1000D, and FIG. 36(b) is a schematic cross-sectional view of the TFT substrate 101D along a line A-A' in FIG. 36(a).

As illustrated in FIG. 36(a) and FIG. 36(b), the patch drain connection section of the TFT substrate 101D includes a conductive portion that is included in the conductive layer closer to the dielectric substrate 1 than the conductive layer 151 including the patch electrode 15, and an additional conductive portion that is included in the conductive layer 151 including the patch electrode 15 and is formed physically separate from the patch electrode 15. The patch drain connection section of the TFT substrate 101D includes a wiring line 7w2 that is included in the source metal layer 7 closer to the dielectric substrate 1 than the patch metal layer 151 including the patch electrode 15, and the connection sections 15a1 and 15a2 that are included in the patch metal layer 151 including the patch electrode 15 and are formed physically separate from the patch electrode 15.

In the TFT substrate 101D, the drain electrode 7D is electrically connected to the patch electrode 15 through connection sections 15a1, 15a2, and 7a2, and the wiring line 7w2. The patch drain connection section included in the TFT substrate 101D includes the connection sections 15a1, 15a2, and 7a2, and the wiring line 7w2.

The wiring line 7w2 extends in the short axis direction of the slot 57 when viewed from the normal direction of the TFT substrate 101D and the slot substrate 201. The wiring line 7w2 is included in a conductive layer that is either one of the conductive layer 3 including the gate electrode 3G of the TFT 10 or the conductive layer 7 including the source electrode 7S of TFT 10 and is farther from the dielectric substrate 1 than the other. In the TFT substrate 101D, the source metal layer 7 including the source electrode 7S of the TFT 10 is farther from the dielectric substrate 1 than the gate metal layer 3 including the gate electrode 3G of the TFT 10.

When viewed from the normal direction of the TFT substrate 101D and the slot substrate 201, the patch metal layer 151 does not include a conductive portion other than the patch electrode 15 inside and near the slot 57. With this configuration, the scanning antenna 1000D has excellent antenna performance.

Additionally, the TFT substrate 101D can obtain effects described below, by including the additional conductive portions 15a1 and 15a2 that are included in the conductive layer 151 including the patch electrode 15 and are formed physically separate from the patch electrode 15. Since an amount of etching in the etching process of the patch conductive film 15' is reduced, a lifespan of an etchant of the patch conductive film 15' can be extended. Additionally, a volume of the liquid crystal layer of the scanning antenna 1000D including the TFT substrate 101D (i.e., a volume of liquid crystal materials) can be reduced to reduce the cost of the scanning antenna 1000D.

The structure of the non-transmission and/or reception region R2 of the scanning antenna 1000D is the same as the scanning antenna 1000A, for example.

Manufacturing Method of TFT Substrate 101D

Figure 37:
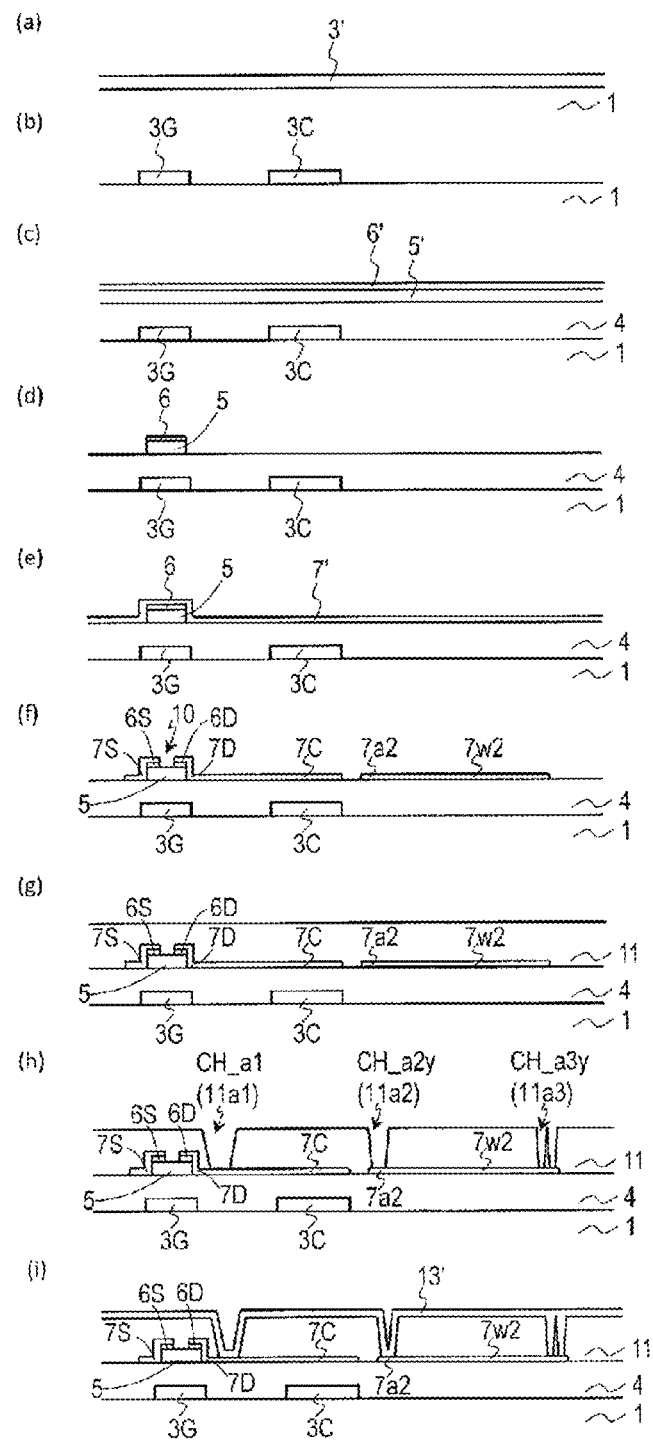
FIGS. 37(a) to 37(i) are process cross-sectional views illustrating an example of a manufacturing method of the TFT substrate 101D.
Figure 38:
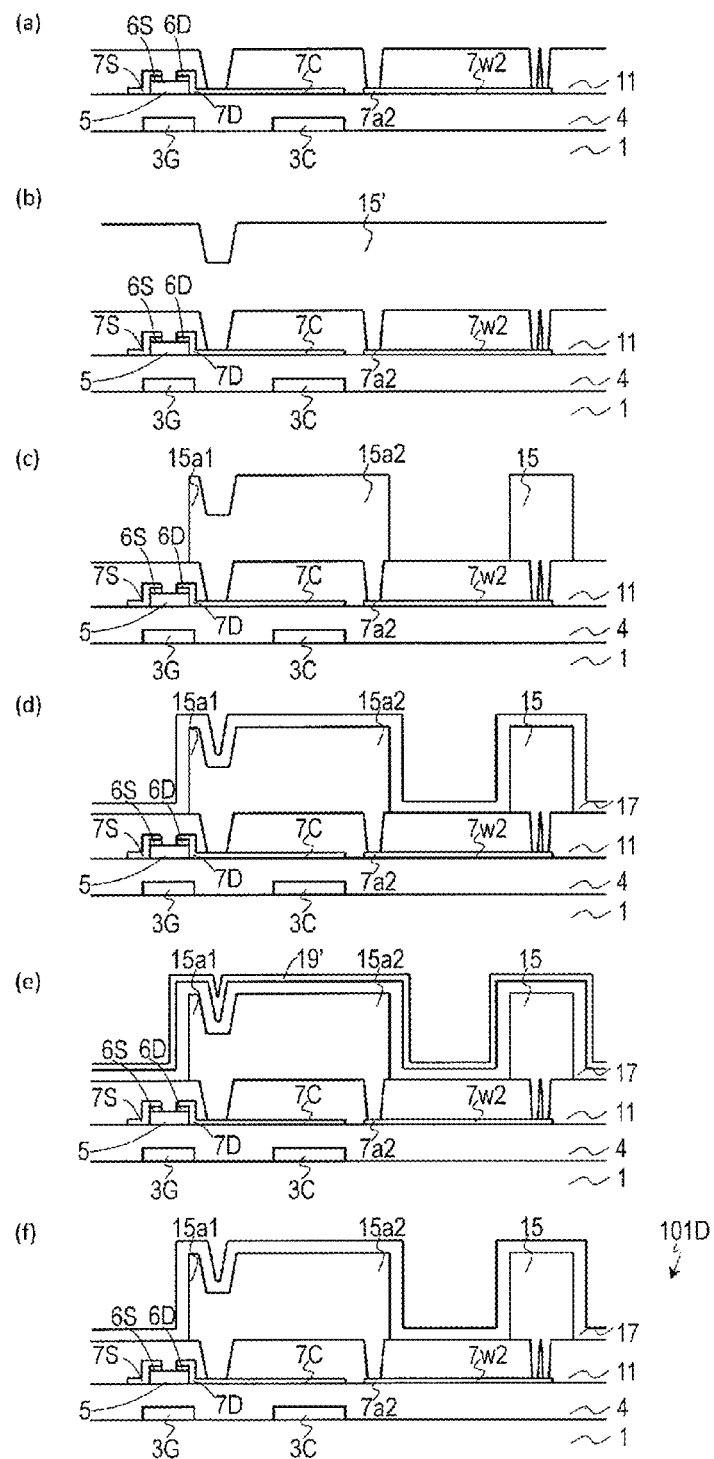
FIGS. 38(a) to 38(f) are process cross-sectional views illustrating an example of the manufacturing method of the TFT substrate 101D.

A description is given of a manufacturing method of the TFT substrate 101D with reference to FIG. 37 to FIG. 38.

FIGS. 37(a) to 37(i) and FIGS. 38(a) to 38(f) are process cross-sectional views illustrating an example of the manufacturing method of the TFT substrate 101D. These drawings illustrate cross sections corresponding to FIG. 36(b) (the cross section along a line A-A' of the TFT substrate 101D). Illustration and description of the cross section of the non-transmission and/or reception region R2 of the TFT substrate 101D are omitted. The following description mainly describes differences from the manufacturing method of the TFT substrate 101A described referring to FIG. 11 to FIG. 15.

First, a gate conductive film 3' is formed on the dielectric substrate 1 as illustrated in FIG. 37(*a*).

Next, the gate conductive film 3' is patterned to obtain the gate metal layer 3 as illustrated in FIG. 37(*b*). Here, a difference from the manufacturing method of the TFT substrate 101A is in that the gate metal layer 3 does not include the connection section 3*a*2 and the wiring line 3*w*1.

After that, as illustrated in FIG. 37(*c*), a gate insulating film 4, an intrinsic amorphous silicon film 5', and an n$^+$ type amorphous silicon film 6' are formed in this order to cover the gate metal layer 3.

Next, the intrinsic amorphous silicon film 5' and the n$^+$ type amorphous silicon film 6' are patterned to obtain the island-shaped semiconductor layer 5 and the contact layer 6 as illustrated in FIG. 37(*d*).

Next, a source conductive film 7' is formed on the gate insulating film 4 and on the contact layer 6 as illustrated in FIG. 37(*e*).

Next, the source conductive film 7' is patterned to form the source metal layer 7 as illustrated in FIG. 37(*f*). Here, a difference from the manufacturing method of the TFT substrate 101A is in that the connection section 7*a*2 and the wiring line 7*w*2 that are electrically separate from the drain electrode 7D are further formed.

Next, as illustrated in FIG. 37(*g*), the first insulating film 11 is formed to cover the TFT 10 and the source metal layer 7.

Next, as illustrated in FIG. 37(*h*), the first insulating film 11 and the gate insulating film 4 are etched through a known photolithography process to form the first insulating layer 11 and gate insulating layer 4. Here, the opening 11*a*2 (contact hole CH_a2*y*) that at least reaches the connection section 7*a*2 is formed in the first insulating film 11, and the opening 11*a*3 (contact hole CH_a3*y*) that at least reaches the wiring line 7*w*2 is formed in the first insulating film 11.

Next, as illustrated in FIG. 37(*i*), a lower conductive film 13' is formed on the first insulating layer 11, within the contact hole CH_a1, within the contact hole CH_a2*y*, and within the contact hole CH_a3*y*.

Next, the lower conductive film 13' is patterned to form the lower conductive layer 13. As illustrated in FIG. 38(*a*), the lower conductive layer 13 is not formed in the antenna unit formation region.

Next, as illustrated in FIG. 38(*b*), a patch conductive film 15' is formed on the lower conductive layer 13 and on the first insulating film 11.

Next, the patch conductive film 15' is patterned to form the patch metal layer 151 as illustrated in FIG. 38(*c*). This allows the patch electrode 15, and the connection sections 15*a*1 and 15*a*2 to be formed. The connection section 15*a*1 is formed to be connected to the portion extending from the drain electrode 7D within the contact hole CH_a1. The connection section 15*a*2 is formed to be connected to the connection section 7*a*2 within the contact hole CH_a2*y*. The patch electrode 15 is formed to be connected to the wiring line 7*w*2 within the contact hole CH_a3*y*.

Next, as illustrated in FIG. 38(*d*), the second insulating film 17 is formed on the patch metal layer 151, on the lower conductive layer 13, and on the first insulating layer 11. Next, the second insulating film 17 is etched through a known photolithography process to from the second insulating layer 17. As illustrated in FIG. 38(*d*), in the antenna unit formation region, the opening is not formed in the second insulating layer 17.

Next, as illustrated in FIG. 38(*e*), an upper conductive film 19' is formed on the second insulating layer 17.

Next, the upper conductive film 19' is patterned to form the upper conductive layer 19. As illustrated in FIG. 38(*f*), the conductive portion included in the upper conductive layer 19 is not formed in the antenna unit formation region.

In this manner, the TFT substrate 101D is manufactured.

Modification Example

A scanning antenna 1000Da and a TFT substrate 101Da included in the scanning antenna 1000Da in Modification Example of the present embodiment will be described with reference to FIG. 39. The constitutions common to the scanning antenna 1000D and the TFT substrate 101D are denoted by the same reference signs and the descriptions thereof are omitted.

Structure of TFT Substrate 101Da

Figure 39:
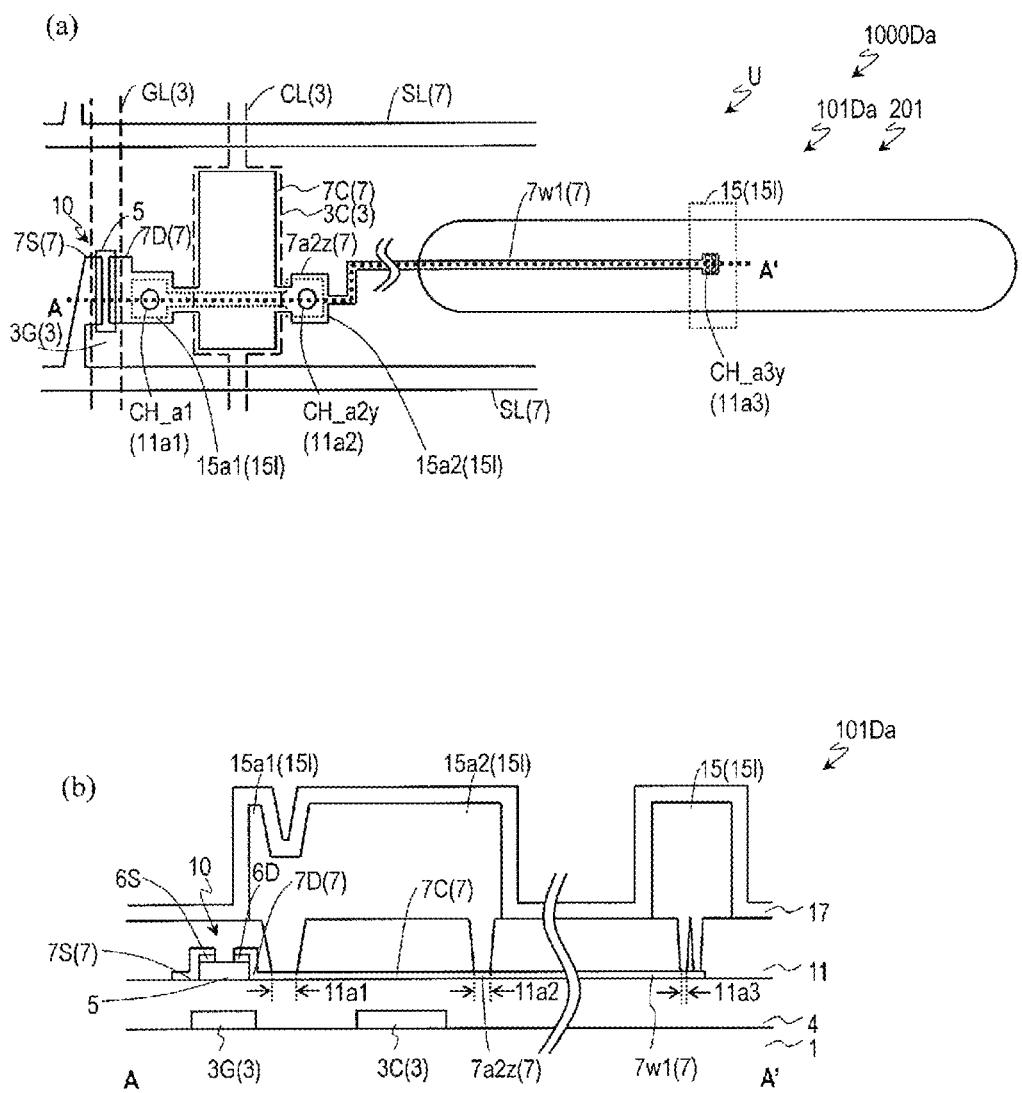
FIG. 39(a) is a schematic plan view of an antenna unit region U in a transmission and/or reception region R1 of a scanning antenna 1000Da according to Modification Example of the fourth embodiment.
FIG. 39(b) is a schematic cross-sectional view of a TFT substrate 101Da along a line A-A' in FIG. 39(a).

FIG. 39(*a*) is a schematic plan view of an antenna unit region U in a transmission and/or reception region R1 of the scanning antenna 1000Da, and FIG. 39(*b*) is a schematic cross-sectional view of the TFT substrate 101Da along a line A-A' in FIG. 39(*a*).

As illustrated in FIG. 39(*a*) and FIG. 39(*b*), a wiring line 7*w*1 included in the TFT substrate 101Da differs from the wiring line 7*w*2 included in the TFT substrate 101D in that the wiring line 7*w*1 extends in the long axis direction of the slot 57 when viewed from the normal direction of the TFT substrate 101Da and the slot substrate 201.

In addition, in the TFT substrate 101Da, a connection section 7*a*2*z* is different from the connection section 7*a*2 of the TFT substrate 101D in that the connection section 7*a*2*z* is electrically connected to the drain electrode 7D.

In the TFT substrate 101Da, the drain electrode 7D is electrically connected to the patch electrode 15 through the connection sections 15*a*1, 15*a*2, and 7*a*2*z*, and the wiring line 7*w*1. Concurrently, the drain electrode 7D is electrically connected to the patch electrode 15 also through the upper auxiliary capacitance electrode 7C, the connection section 7*a*2*z*, and the wiring line 7*w*1. The patch drain connection section of the TFT substrate 101Da has redundancy.

In the scanning antenna 1000Da having such a structure also, the same effect as in the scanning antenna 1000D can be obtained.

The TFT substrate 101Da can be manufactured by changing the patterning shape of the source metal layer 7 in the manufacturing method of the TFT substrate 101D.

Example of Antenna Unit Array and Connection of Gate Bus Line and Source Bus Line In the scanning antenna according to the embodiments of the disclosure, the antenna units are arrayed concentrically, for example.

For example, in a case where the antenna units are arrayed in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the m-th gate bus line.

In such an array, the number of antenna units connected to each gate bus line is different. In addition, although m antenna units are connected to n source bus lines that are also connected to the antenna units constituting the innermost circle, among nx source bus lines connected to nx antenna units that constitute the outermost circle, the number of antenna units connected to other source bus lines is less than m.

In this way, the array of antenna units in the scanning antenna is different from the array of pixels (dots) in the LCD panel, and the number of connected antenna units differs depending on the gate bus line and/or source bus line. Accordingly, in a case where the capacitances (liquid crystal capacitances+auxiliary capacitances) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacitance is preferably adjusted, or the number of antenna units connected to the gate bus line and/or the source bus line is preferably adjusted, for example, to make the electrical loads of the antenna units connected to the gate bus lines and the source bus lines substantially the same.

The scanning antenna according to the embodiments of the disclosure is housed in a plastic housing as necessary, for example. It is preferable to use a material having a small dielectric constant $\varepsilon_M$ that does not affect microwave transmission and/or reception in the housing. In addition, the housing may include a through-hole provided in a portion thereof corresponding to the transmission and/or reception region R1. Furthermore, the housing may include a light blocking structure such that the liquid crystal material is not exposed to light. The light blocking structure is, for example, provided so as to block light that propagates through the dielectric substrate 1 and/or 51 from the side surface of the dielectric substrate 1 of the TFT substrate 101A and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in necessary locations.

INDUSTRIAL APPLICABILITY

Embodiments according to the disclosure are used in scanning antennas for satellite communication or satellite broadcasting that are mounted on mobile bodies (ships, aircraft, and automobiles, for example) or the manufacture thereof.

REFERENCE SIGNS LIST

1 Dielectric substrate
3 Gate metal layer
3C Lower auxiliary capacitance electrode
3G Gate electrode
3a2 Connection section
3c, 3cA, 3g, 3gA, 3s, 3sA Lower connection section
3p1, 3p1A, 3p2A Lower connection section
3sg, 3sgA Source lower connection wiring line
3w1, 3w2 Wiring line
4 Gate insulating layer
4a2, 4a3, 4sg1, 4sgA Opening
4c, 4cA, 4g, 4gA, 4s, 4sA Opening
4p1, 4p1A, 4p2A Opening
5 Semiconductor layer
6D Drain contact layer
6S Source contact layer
7 Source metal layer
7C Upper auxiliary capacitance electrode
7D Drain electrode
7S Source electrode
7PE Patch electrode
7a2, 7a2z Connection section
7p1A, 7p2A Conductive portion
7sg, 7sgA Source bus line connection section
7w1, 7w2 Wiring line
11 First insulating layer
11a1, 11a2, 11a3, 11c, 11cA Opening
11s, 11gA, 11p1, 11p1A, 11p2A Opening
11s, 11sA, 11sg1, 11sg2 Opening
13 Lower conductive layer
13c, 13g, 13s Upper connection section
13sg Source bus line upper connection section
15 Patch electrode
15a1, 15a2 Connection section
151 Patch metal layer
15p1 Conductive portion
15p2 Lower connection section
15w1, 15w2 Wiring line
17 Second insulating layer
17c, 17cA, 17g, 17gA, 17s, 17sA Opening
17p1, 17p1A, 17p2, 17p2A Opening
19 Upper conductive layer
19cA, 19gA, 19sA Upper connection section
19p1, 19p1A, 19p2, 19p2A Upper connection section
51 Dielectric substrate
52 Third insulating layer
54 Dielectric layer (air layer)
55 Slot electrode
55L Lower layer
55M Main layer
55U Upper layer
57 Slot
58 Fourth insulating layer
60 Upper connection section
65 Reflective conductive plate
67 Adhesive layer
68 Heater resistive film
70 Power feed device
71 Conductive beads
72 Power feed pin
73 Sealing portion
101A, 101Aa, 101Ab TFT substrate
101B, 101C, 101D, 101Da TFT substrate
201 Slot substrate
1000A, 1000Aa, 1000Ab Scanning antenna
1000B, 1000C, 1000D, 1000Da Scanning antenna
CH_a1, CH_a2, CH_a2x, CH_a2y Contact hole
CH_a3, CH_a3x, CH_a3y Contact hole
CH_c, CH_g Contact hole
CH_p1, CH_s Contact hole
CH_sg1, CH_sg2, CH_sg1A, CH_sg2A Contact hole
CL: CS bus line
GD Gate driver
GL Gate bus line
GT Gate terminal section
SD Source driver
SL Source bus line
ST Source terminal section
PT Transfer terminal section
IT Terminal section LC Liquid crystal layer
R1 Transmission and/or reception region
R2 Non-transmission and/or reception region
Rs Seal region
U Antenna unit, Antenna unit region

The invention claimed is:

1. A TFT substrate comprising:
a dielectric substrate;
a plurality of antenna unit regions arranged on the dielectric substrate, each of the plurality of antenna unit regions including:
   a TFT,
   a patch electrode electrically connected to a drain electrode of the TFT, and
   a patch drain connection section electrically connecting the drain electrode to the patch electrode, wherein
   the patch drain connection section includes a conductive portion included in a conductive layer, the conductive layer being closer to the dielectric substrate than a conductive layer including the patch electrode and being either one of a conductive layer including a gate electrode of the TFT or a conductive layer including a source electrode of TFT, the either one being closer to the dielectric substrate than the other;
a gate metal layer supported by the dielectric substrate and including the gate electrode;
a source metal layer supported by the dielectric substrate and including the source electrode;
a semiconductor layer supported by the dielectric substrate;
a gate insulating layer formed between the gate metal layer and the semiconductor layer;
a first insulating layer formed on the gate metal layer and the source metal layer; and
a patch metal layer formed between the gate insulating layer and the first insulating layer, and including the patch electrode; wherein
the patch electrode is included in the conductive layer different from any of the conductive layer including the gate electrode of the TFT and the conductive layer including the source electrode of the TFT.

2. The TFT substrate according to claim 1,
wherein the patch drain connection section further includes an additional conductive portion, the additional conductive portion being included in the conductive layer including the patch electrode and being formed physically separate from the patch electrode.

3. A scanning antenna comprising:
the TFT substrate according to claim 1;
a slot substrate disposed to face the TFT substrate;
a liquid crystal layer provided between the TFT substrate and the slot substrate; and
a reflective conductive plate disposed to face a surface of the slot substrate on a side opposite to the liquid crystal layer with a dielectric layer interposed between the reflective conductive plate and the surface,
wherein the slot substrate includes another dielectric substrate and a slot electrode formed on a surface of the another dielectric substrate on a side of the liquid crystal layer, and
the slot electrode includes a plurality of slots, each of the plurality of slots being arranged corresponding to the patch electrode of each of the plurality of antenna unit regions of the TFT substrate.

4. The scanning antenna according to claim 3,
wherein, when viewed from a normal direction of the dielectric substrate and the another dielectric substrate, the conductive layer including the patch electrode does not include a conductive portion other than the patch electrode inside each of the plurality of slots.

5. The scanning antenna according to claim 3,
wherein, when viewed from the normal direction of the dielectric substrate and the another dielectric substrate, the plurality of antenna unit regions include an antenna unit region including the patch drain connection section including a conductive portion extending in a long axis direction of a corresponding slot.

6. The scanning antenna according to claim 3,
wherein, when viewed from the normal direction of the dielectric substrate and the another dielectric substrate, the plurality of antenna unit regions include an antenna unit region including the patch drain connection section including a conductive portion extending in a short axis direction of a corresponding slot.

7. The scanning antenna according to claim 3,
wherein, when viewed from the normal direction of the dielectric substrate and the another dielectric substrate, two regions in which the patch electrode and the slot electrode overlap each other are arranged to be axisymmetric with respect to the long axis of the corresponding slot.

8. The scanning antenna according to claim 3,
wherein, when viewed from the normal direction of the dielectric substrate and the another dielectric substrate, each of two regions in which the patch electrode and the slot electrode overlap each other has a planar shape that is axisymmetric with respect to the short axis of the corresponding slot.

9. A TFT substrate comprising:
a dielectric substrate;
a plurality of antenna unit regions arranged on the dielectric substrate, each of the plurality of antenna unit regions including:
   a TFT,
   a patch electrode electrically connected to a drain electrode of the TFT, and
   a patch drain connection section electrically connecting the drain electrode to the patch electrode, and the patch drain connection section includes a conductive portion included in a conductive layer closer to the dielectric substrate than a conductive layer including the patch electrode, and an additional conductive portion included in the conductive layer including the patch electrode, and formed physically separate from the patch electrode;
a gate metal layer supported by the dielectric substrate and including a gate electrode;
a source metal layer supported by the dielectric substrate and including a source electrode;
a semiconductor layer supported by the dielectric substrate;
a gate insulating layer formed between the gate metal layer and the semiconductor layer;
a first insulating layer formed on the gate metal layer and the source metal layer; and
a patch metal layer formed between the gate insulating layer and the first insulating layer, and including the patch electrode; wherein
the patch electrode is included in the conductive layer different from the conductive layer closer to the dielectric substrate.

10. The TFT substrate according to claim 9,
wherein the conductive portion is included in a conductive layer, the conductive layer being either one of a conductive layer including the gate electrode of the TFT or a conductive layer including the source electrode of the TFT, the either one being closer to the dielectric substrate than the other.

11. The TFT substrate according to claim 9,
wherein the conductive portion is included in a conductive layer, the conductive layer being either one of a conductive layer including the gate electrode of the TFT or a conductive layer including the source electrode of TFT, the either one being farther from the dielectric substrate than the other.

12. A TFT substrate comprising:
a dielectric substrate; and
a plurality of antenna unit regions arranged on the dielectric substrate, each of the plurality of antenna unit regions including:
  a TFT,
  a patch electrode electrically connected to a drain electrode of the TFT, and
  a patch drain connection section electrically connecting the drain electrode to the patch electrode, wherein
the patch drain connection section includes a conductive portion included in a conductive layer, the conductive layer being closer to the dielectric substrate than a conductive layer including the patch electrode and being either one of a conductive layer including a gate electrode of the TFT or a conductive layer including a source electrode of TFT, the either one being closer to the dielectric substrate than the other; and
the patch electrode is included in the conductive layer, the conductive layer being either one of the conductive layer including the gate electrode of the TFT or the conductive layer including the source electrode of TFT, the either one being farther from the dielectric substrate than the other.

13. The TFT substrate according to claim 12,
wherein the patch drain connection section further includes an additional conductive portion, the additional conductive portion being included in the conductive layer including the patch electrode and being formed physically separate from the patch electrode.

14. A scanning antenna comprising:
the TFT substrate according to claim 12;
a slot substrate disposed to face the TFT substrate;
a liquid crystal layer provided between the TFT substrate and the slot substrate; and
a reflective conductive plate disposed to face a surface of the slot substrate on a side opposite to the liquid crystal layer with a dielectric layer interposed between the reflective conductive plate and the surface,
wherein the slot substrate includes another dielectric substrate and a slot electrode formed on a surface of the another dielectric substrate on a side of the liquid crystal layer, and
the slot electrode includes a plurality of slots, each of the plurality of slots being arranged corresponding to the patch electrode of each of the plurality of antenna unit regions of the TFT substrate.

15. The scanning antenna according to claim 14,
wherein, when viewed from a normal direction of the dielectric substrate and the another dielectric substrate, the conductive layer including the patch electrode does not include a conductive portion other than the patch electrode inside each of the plurality of slots.

16. The scanning antenna according to claim 14,
wherein, when viewed from the normal direction of the dielectric substrate and the another dielectric substrate, the plurality of antenna unit regions include an antenna unit region including the patch drain connection section including a conductive portion extending in a long axis direction of a corresponding slot.

17. The scanning antenna according to claim 14,
wherein, when viewed from the normal direction of the dielectric substrate and the another dielectric substrate, the plurality of antenna unit regions include an antenna unit region including the patch drain connection section including a conductive portion extending in a short axis direction of a corresponding slot.

18. The scanning antenna according to claim 14,
wherein, when viewed from the normal direction of the dielectric substrate and the another dielectric substrate, two regions in which the patch electrode and the slot electrode overlap each other are arranged to be axisymmetric with respect to the long axis of the corresponding slot.

19. The scanning antenna according to claim 14,
wherein, when viewed from the normal direction of the dielectric substrate and the another dielectric substrate, each of two regions in which the patch electrode and the slot electrode overlap each other has a planar shape that is axisymmetric with respect to the short axis of the corresponding slot.

* * * * *